(12) United States Patent
Hatano et al.

(10) Patent No.: US 6,606,124 B1
(45) Date of Patent: Aug. 12, 2003

(54) SOLID-STATE IMAGING DEVICE WITH PHOTOELECTRIC CONVERSION PORTIONS IN AN ARRAY AND MANUFACTURING METHOD THEREOF

(75) Inventors: Keisuke Hatano, Tokyo (JP); Toru Yamada, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/314,158

(22) Filed: May 19, 1999

(30) Foreign Application Priority Data

May 20, 1998 (JP) ............................................ 10-138719

(51) Int. Cl.$^7$ .............................................. H04N 5/335
(52) U.S. Cl. ...................................... 348/311; 348/315
(58) Field of Search ................................ 348/294, 297, 348/302, 303, 311, 315; 257/245, 246, 247, 232, 233; 250/208.1

(56) References Cited

U.S. PATENT DOCUMENTS 5,243,180 A * 9/1993 Nam ....................... 250/208.1
6,248,133 B1 * 6/2001 Komobuchi et al. ......... 348/315
6,356,305 B1 * 3/2002 Akagawa ..................... 348/311

FOREIGN PATENT DOCUMENTS

| JP | 218964 | 2/1990 |
|---|---|---|
| JP | 5-6992 | 1/1993 |
| JP | 6120476 | 4/1994 |
| JP | 8335690 | 12/1996 |
| JP | 964333 | 3/1997 |

* cited by examiner

Primary Examiner—Tuan Ho
(74) Attorney, Agent, or Firm—Young & Thompson

(57) ABSTRACT

A solid-state imaging device includes photoelectric conversion portions set in a two-dimensional array; charge readout portions each provided adjacent to each of the photoelectric conversion portions; charge transfer portions each provided adjacent to each of the photoelectric conversion portions; and, charge transfer electrodes spaced apart from each other through a separation portion separated from the opening portion, each of which is also a charge readout electrode, provided with an opening portion over the corresponding one of the photoelectric conversion portions, and formed so as to cover, through an insulation film, the corresponding one of the photoelectric conversion portions, charge readout portions, charge transfer portions, and their peripheral portions.

60 Claims, 36 Drawing Sheets

68a; opening portion  68; gate electrode film

61; photoelectric conversion portion

Fig.33 (a) (PRIOR ART)
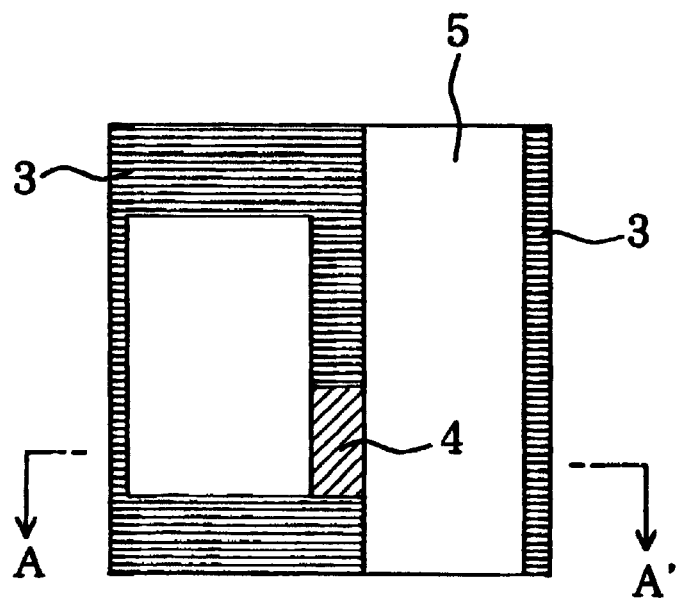
Fig.33 (b) (PRIOR ART)
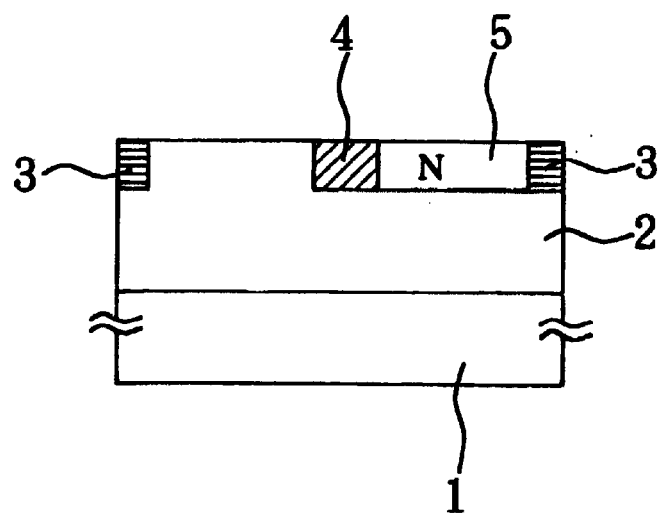

Fig.34 (a) (PRIOR ART)
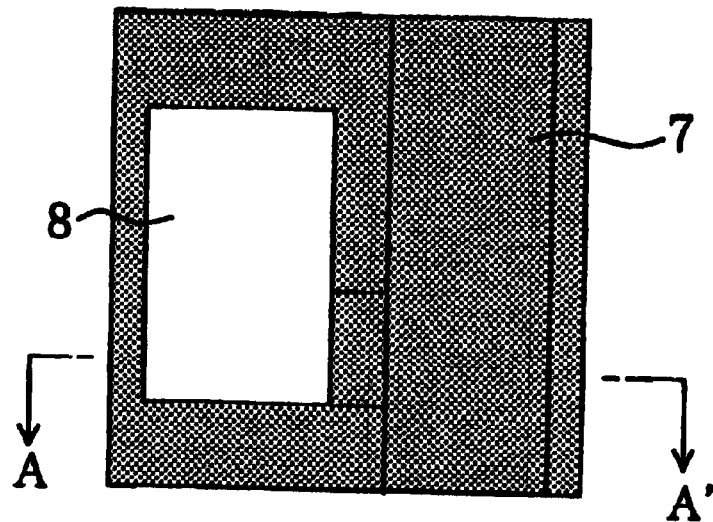
Fig.34(b) (PRIOR ART)
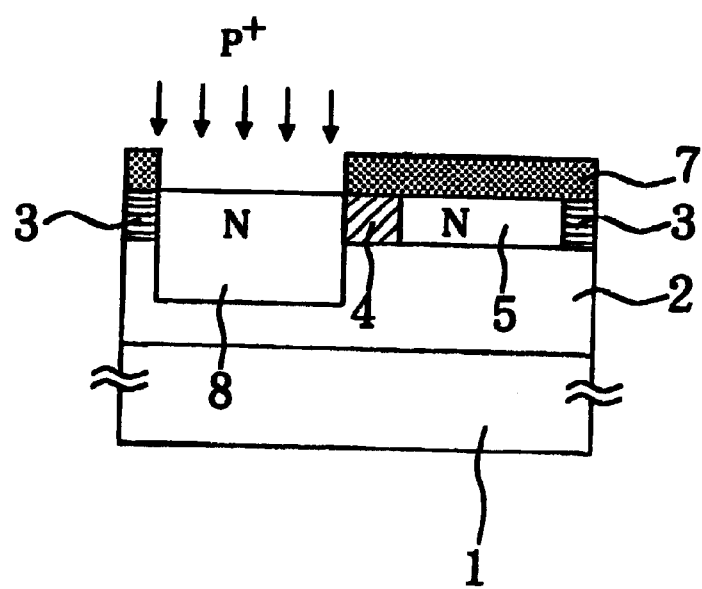

Fig.35 (a) (PRIOR ART)
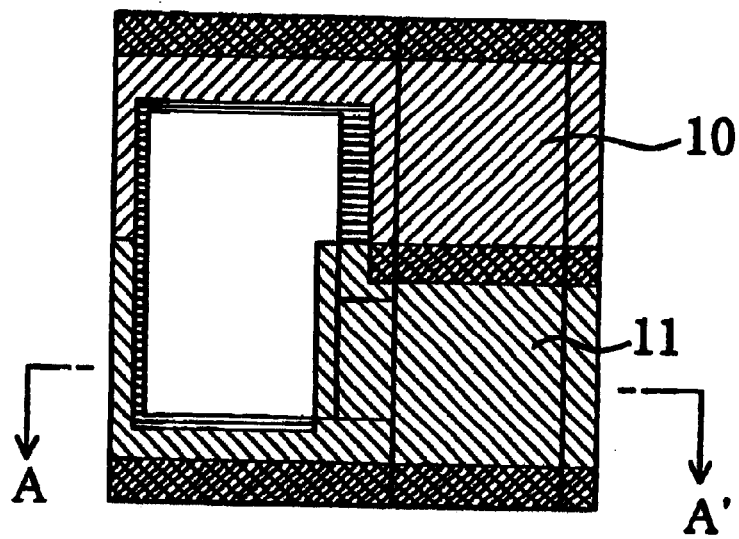
Fig.35 (b) (PRIOR ART)
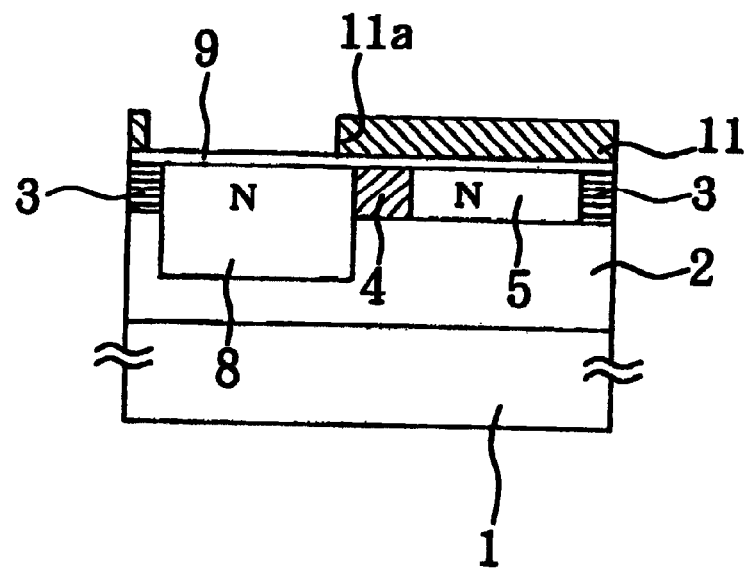

Fig.36 (a) (PRIOR ART)
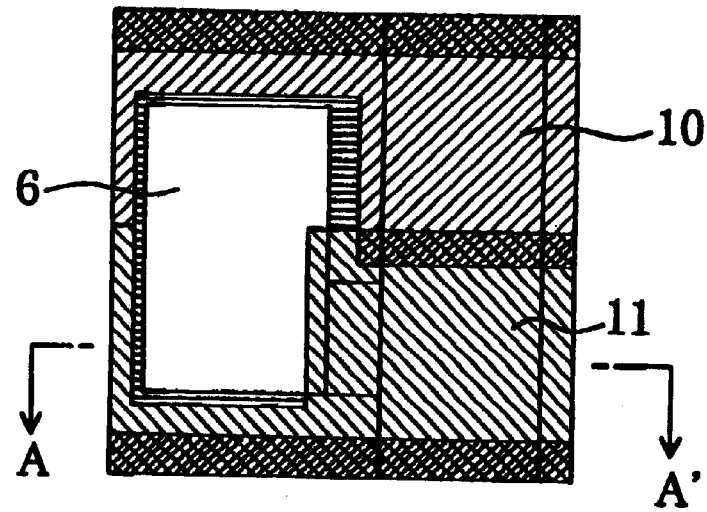
Fig.36 (b) (PRIOR ART)
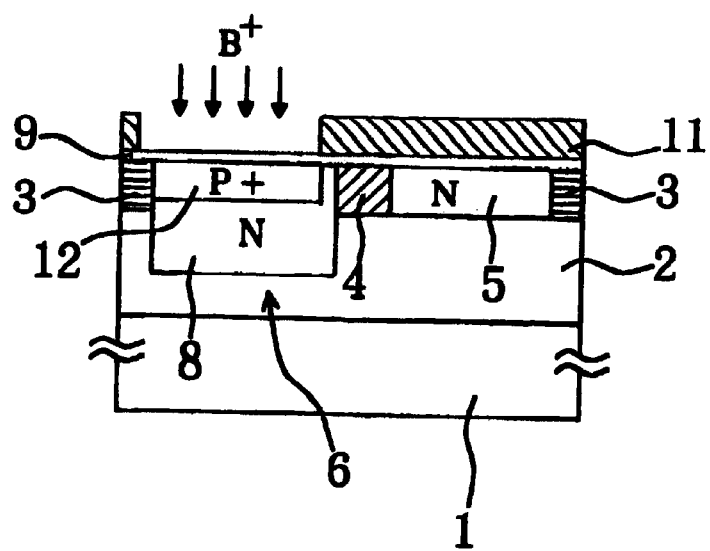

Fig.37 (a) (PRIOR ART)
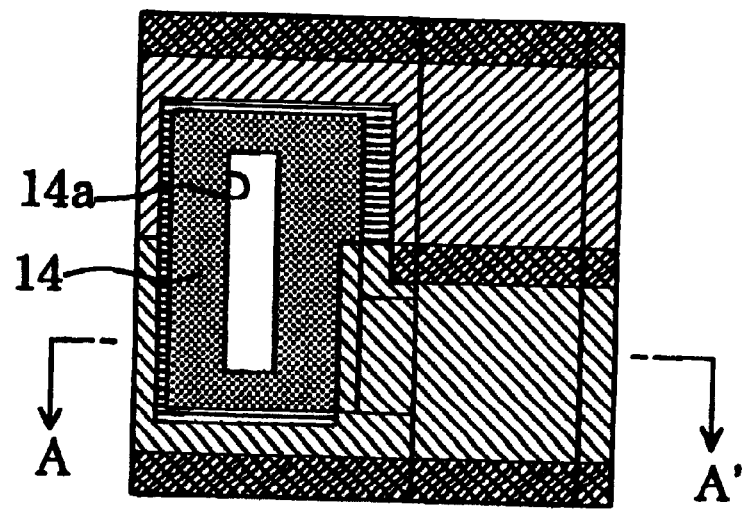
Fig.37 (b) (PRIOR ART)
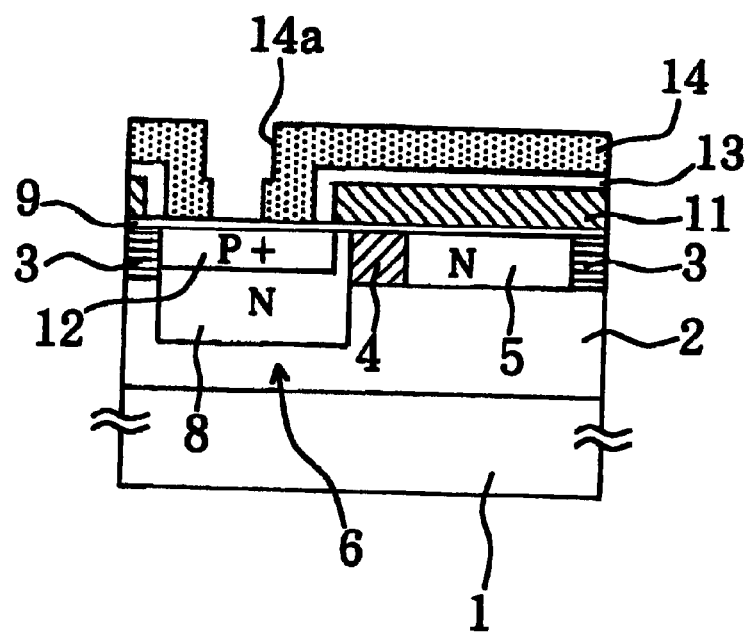

Fig.38 (a) (PRIOR ART)
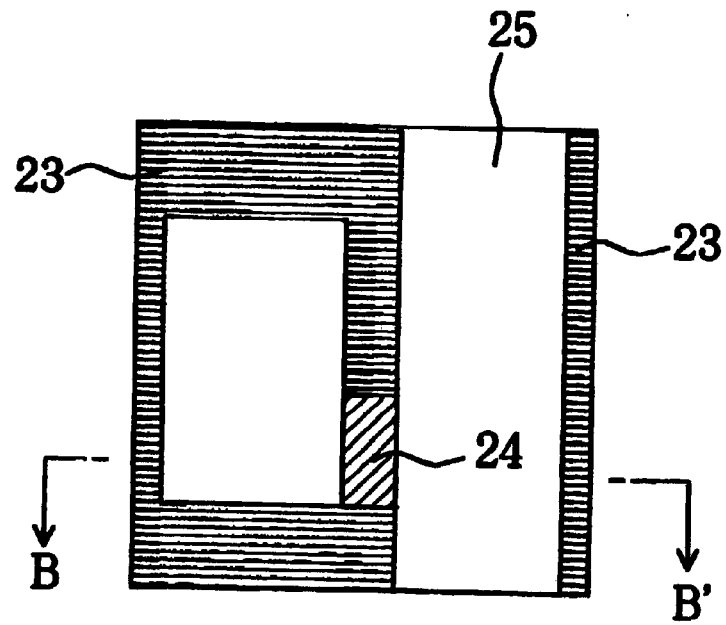
Fig.38 (b) (PRIOR ART)
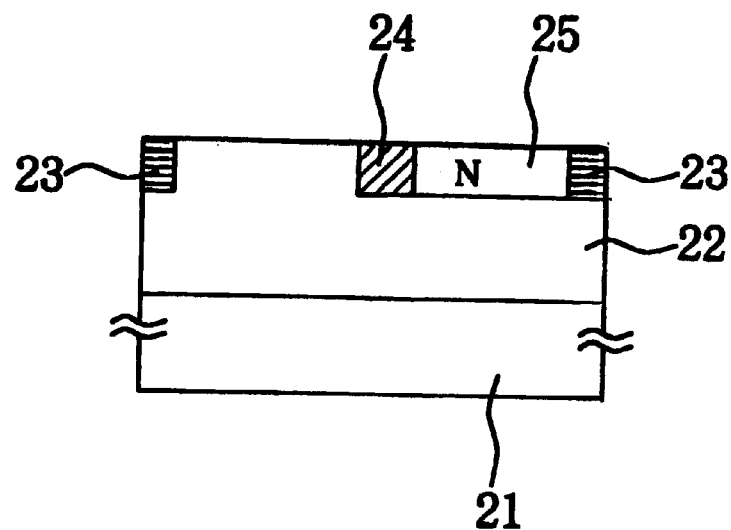

Fig.39 (a) (PRIOR ART)
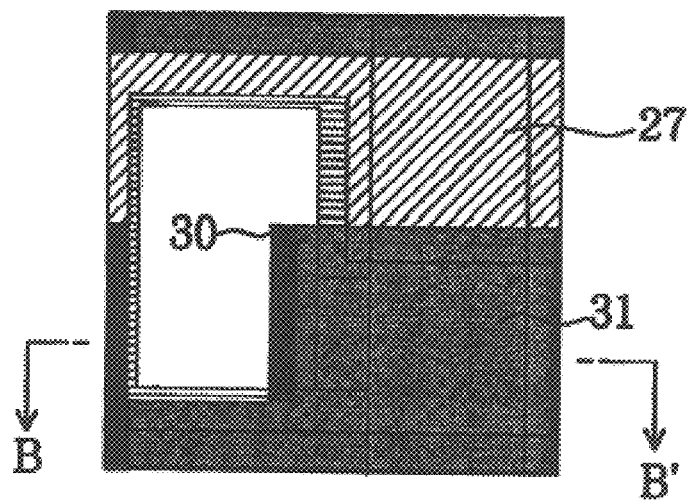
Fig.39 (b) (PRIOR ART)
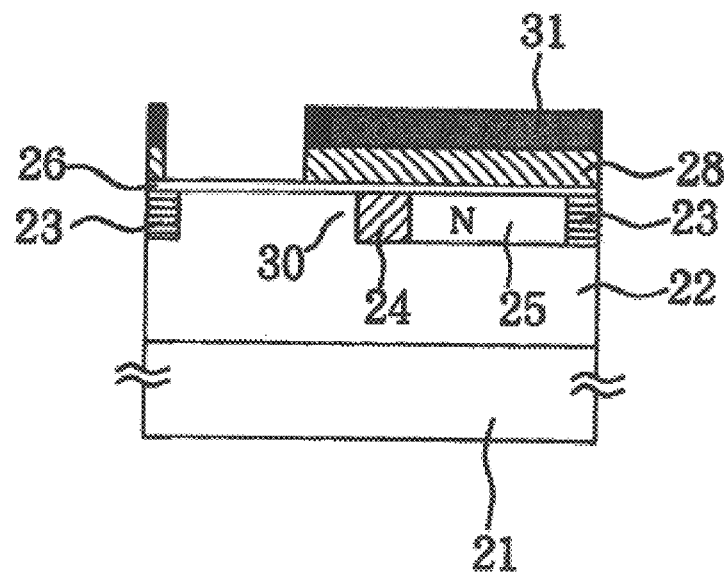

*Fig.40 (a) (PRIOR ART)*
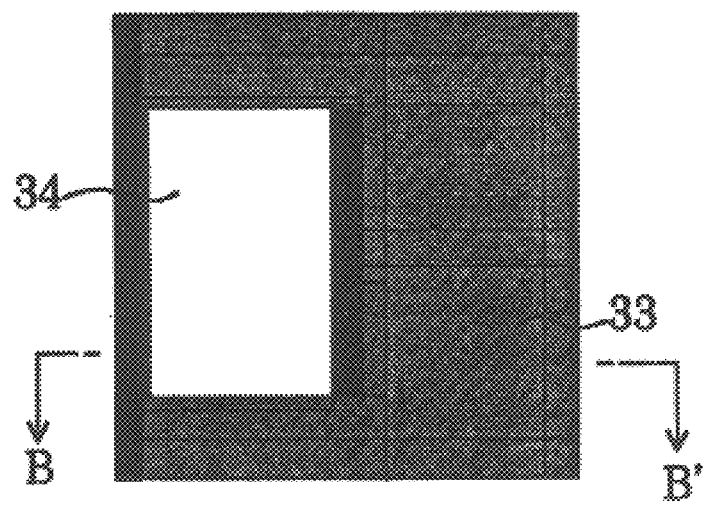
*Fig.40 (b) (PRIOR ART)*
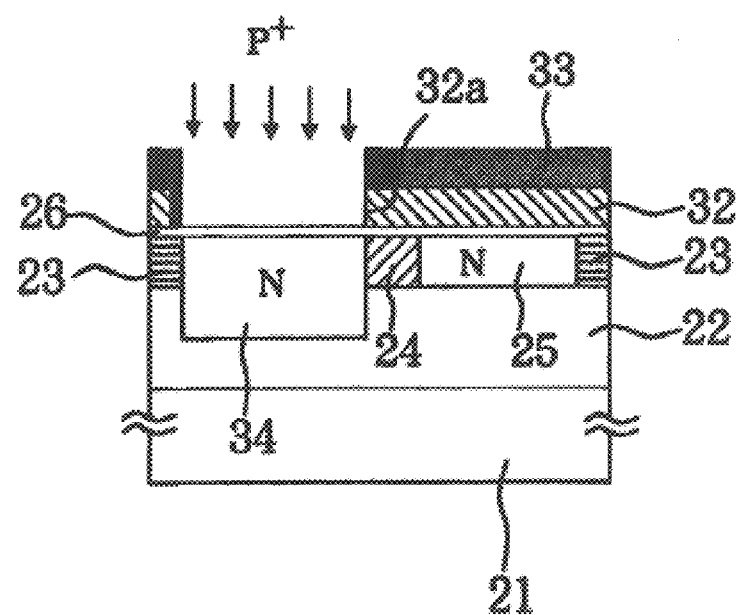

Fig.41 (a) (PRIOR ART)
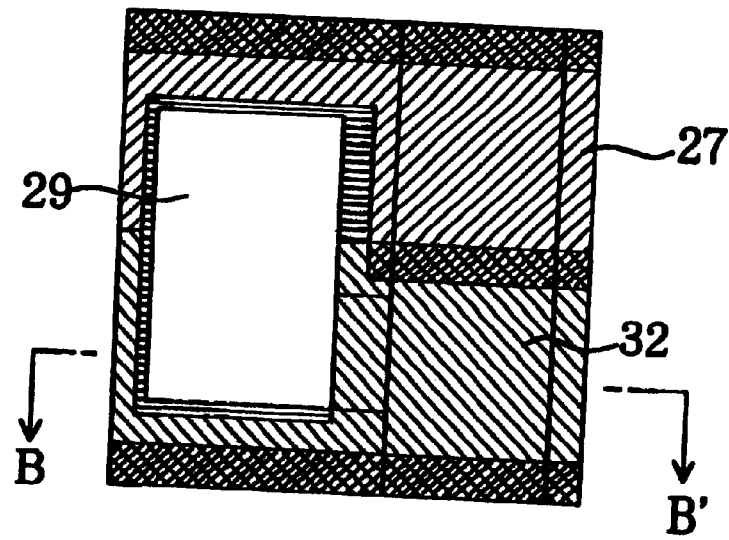
Fig.41 (b) (PRIOR ART)
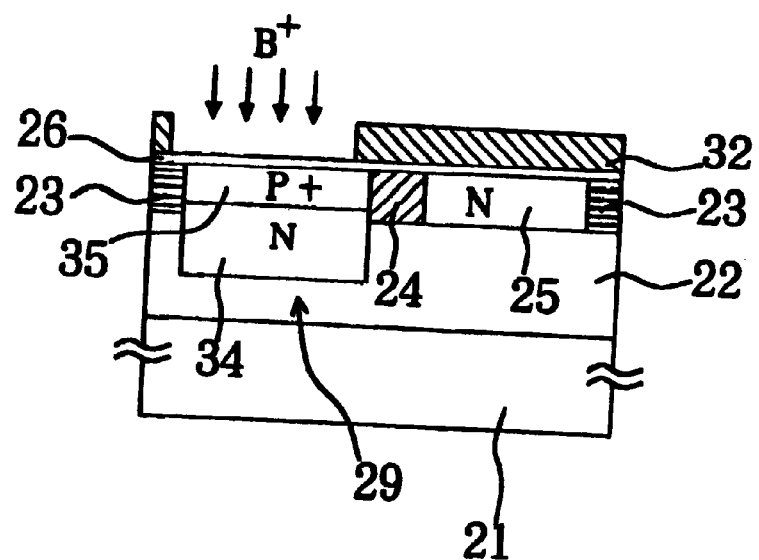

Fig.42 (a) (PRIOR ART)
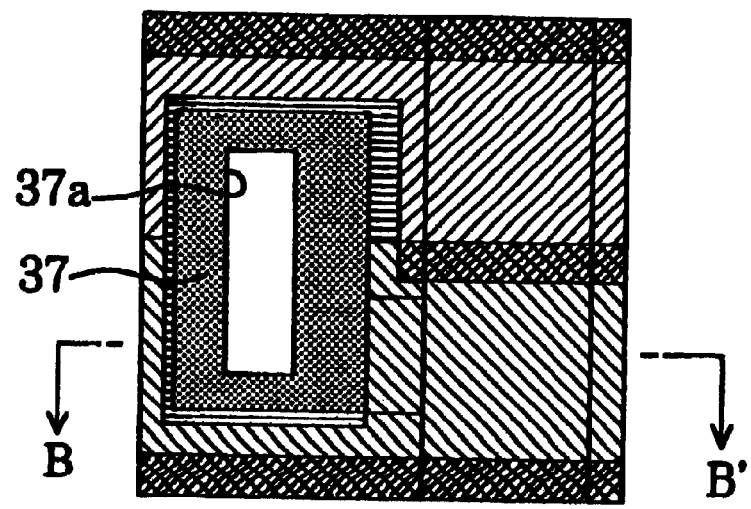
Fig.42 (b) (PRIOR ART)
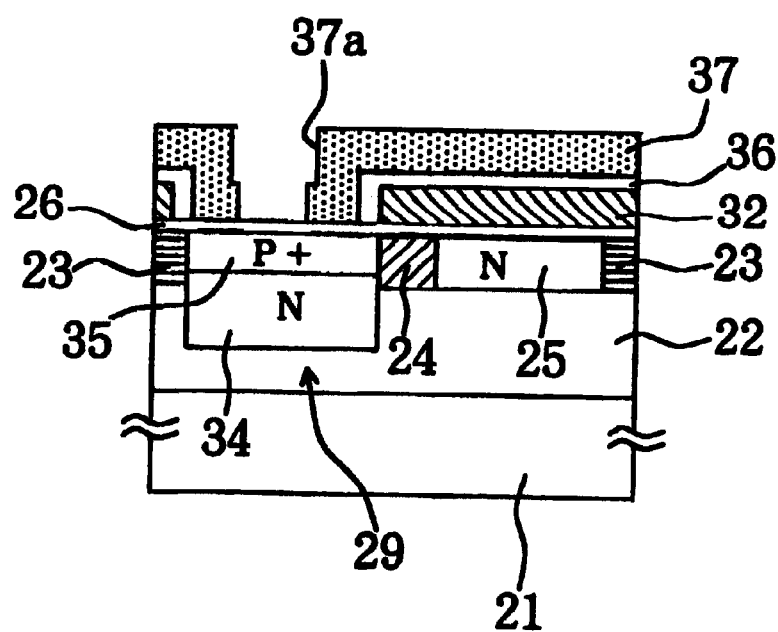

Fig.43 (a) (PRIOR ART)
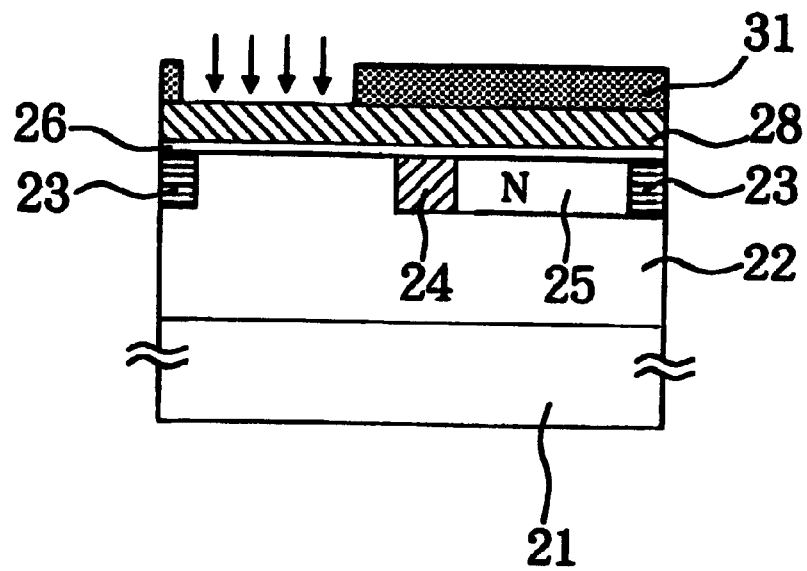
Fig.43 (b) (PRIOR ART)
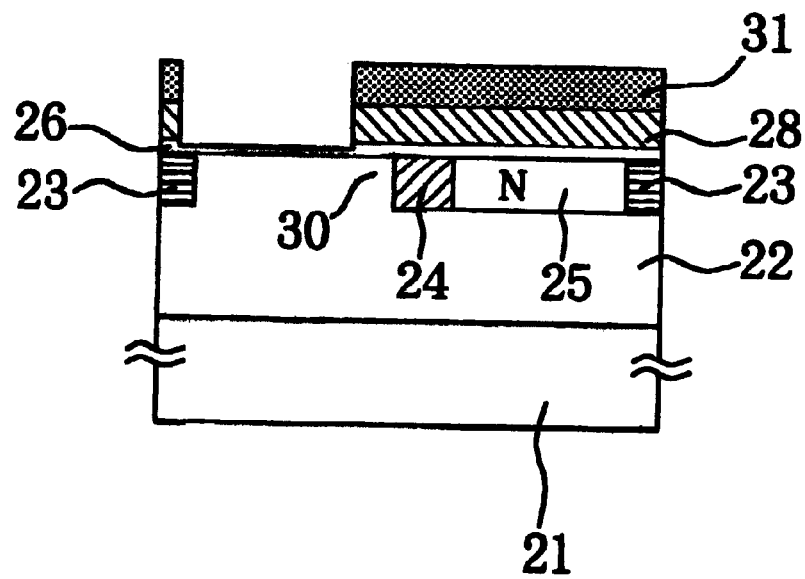

Fig.44 (a) (PRIOR ART)
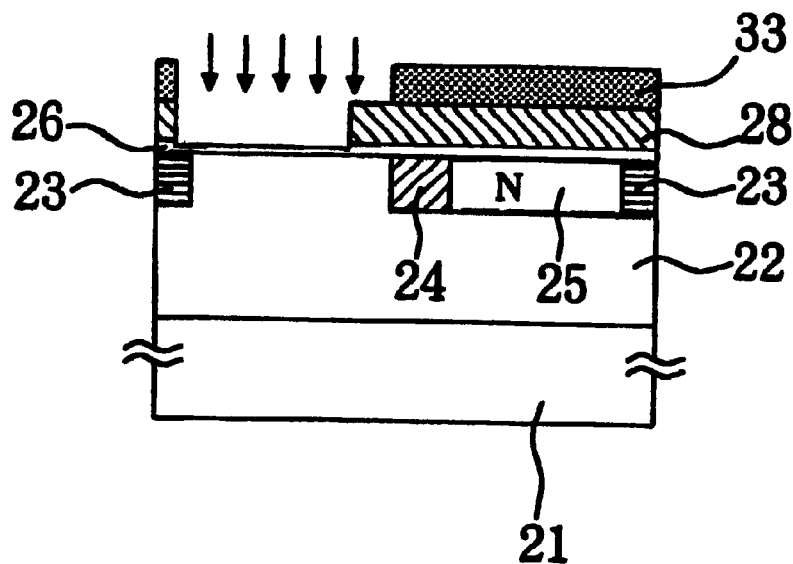
Fig.44 (b) (PRIOR ART)
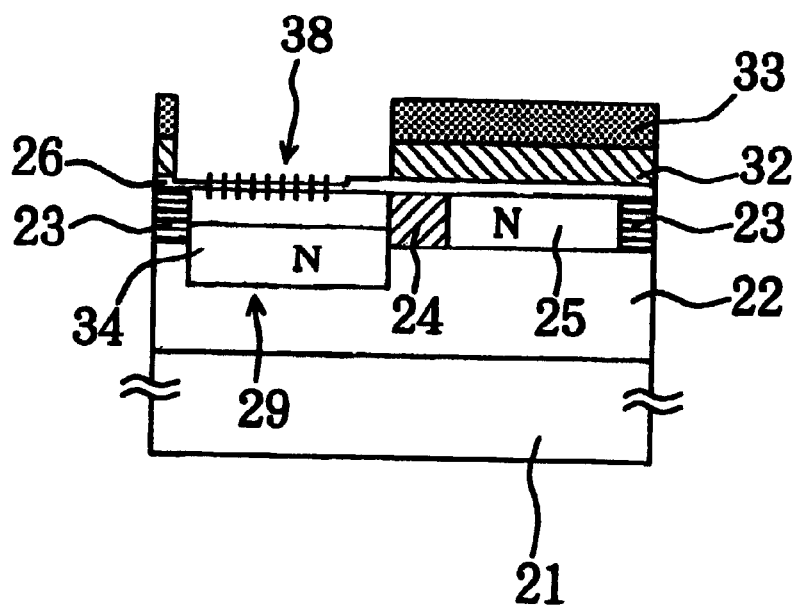

SOLID-STATE IMAGING DEVICE WITH PHOTOELECTRIC CONVERSION PORTIONS IN AN ARRAY AND MANUFACTURING METHOD THEREOF

BACKGROUND OF THE INVENTION

1. Field of the Invention

The present invention relates to a solid-state imaging device and manufacturing method thereof, wherein the solid-state imaging device is provided with a plurality of photoelectric conversion portions so arranged that they form a matrix, i.e., two-dimensional pattern or array constructed of their rows and their columns, and more particularly to a solid-state imaging device and manufacturing method thereof, wherein the solid-state imaging device is adapted for use in image sensors of various types of image input instruments, for example such as facsimiles, video cameras, digital still cameras and like instruments.

2. Description of the Related Art

Solid-state imaging devices have long been constructed of charge coupled devices (i.e., CCDs), and provided with a plurality of photoelectric conversion portions, wherein each of the photoelectric conversion portions converts incident light into signal charge the amount of which charge corresponds to the amount of the incident light, and the photoelectric conversion portions are so arranged that they form a matrix, i.e., two-dimensional pattern or array constructed of their rows and their columns. Of these solid-state imaging devices, particularly, one having a construction in which the photoelectric conversion portion and the charge transfer portion for transferring the signal charge are separately formed is capable of performing separately each of the process of photoelectric conversion, process of charge readout and the process of charge transfer, and, therefore capable of being driven in various drive modes. Due to this, the solid-state imaging device is characterized by its very wide range of applications.

This type of the solid-state imaging device is known, for example, in a Japanese magazine: "Eizo Jyoho", August issue for 1995, vol. 27, pp. 80–86. This solid-state imaging device is characterized in that: it doubles as a charge readout electrode for controlling the writing and the reading of the signal charge from the photoelectric conversion portion to the corresponding one of the charge transfer portions; and, the photoelectric conversion portion is formed by mask-alignment of the charge transfer electrode for controlling in transfer the signal charge of the corresponding one of the charge transfer portions.

Hereinbelow, a manufacturing method of the conventional solid-state imaging device disclosed in the above Japanese magazine (hereinafter referred to as the first conventional example) will be described in due order of manufacturing, i.e., process steps thereof with reference to FIGS. 33(a) to 37(b) First, as shown in FIG. 33(b), a p-type well layer 2 is formed by ion-implanting a p-type impurity such as boron ions $B^+$ and like ions in an n-type semiconductor substrate 1. Then, formed in a surface region of the p-type well layer 2 by ion-implanting a p-type impurity such as boron ions $B^+$ and like ions and an n-type impurity such as phosphorus ions $P^+$ and like ions are: a $P^+$ type channel stop 3 for isolating the devices from each other; a p-type charge readout portion 4 for retrieving the signal charge from the photoelectric conversion portion 6 (shown in FIG. 36(b)) to an n-type charge transfer portion 5; and, the n-type charge transfer portion 5 for transferring the signal charge thus retrieved. After that, as shown in FIG. 34(b), a photoresist film 7-is formed on the surface of the p-type well layer 2 other than an area in which the photoelectric conversion portion 6 will be formed later. Then, as shown in FIGS. 34(a) and 34(b), an n-type well 8 which will form the photoelectric conversion portion 6 later is formed by ion-implanting an n-type impurity such as phosphorus ions $P^+$ and like ions at an acceleration energy of more than or equal to 200 KeV using the photoresist film 7 as a mask. Subsequent to this, the photoresist film 7 is removed. Then, a gate insulation film 9 constructed of a thermal oxidation film, oxidation film, nitride film, oxide (ONO) film, or like film is formed over the entire surface of the substrate. Then, a gate electrode film (not shown) such as a polysilicon film and the like is formed over the gate insulation film 9. Then, by removing an unnecessary region of the gate electrode film through a plasma etching process, a charge transfer electrode 10 is formed. Further formed on this charge transfer electrode 10 by using the thermal oxidation film and by a (CVD) chemical vapor deposition process is a CVD oxidation film which forms an interlayer insulation film (not shown). After forming the interlayer insulation film, as shown in FIGS. 35(a) and 35(b), a charge transfer electrode 11 which doubles as a charge readout electrode is formed over both the gate insulation film 9 and the interlayer insulation film.

As shown in FIGS. 36(a) and 36(b), the photoelectric conversion portion 6 is formed by self-alignment using the charge transfer electrodes 10 and 11 as masks in an ion implantation process of the p-type impurity such as boron ions $B^+$ and like ions in a shallow surface region of the n-type well layer 8, and thereby forming a $P^+$ type region 12 for preventing dark current from occurring, which dark current occurs in the surface of the photoelectric conversion portion 6 to impair the SN (Signal-to-Noise) ratio at a time when the intensity of illumination is low. At this time, in order to prevent the above p-type impurity from being ion-implanted in the other region where charge detection portions and on-chip amplifiers and the like are formed, it is necessary to form a photoresist film over the other region described above. Then, an interlayer insulation film 13 is formed over the entire surface of the substrate. After that, as shown in FIGS. 37(a) and 37(b), a light shield film 14 made of tungsten, aluminum and like materials is formed over the interlayer insulation film 13 to prevent the same 13 from being exposed to light. Then, the light shield film 14 thus formed over the photoelectric conversion portion 6 is removed to form an opening portion 14a. Each of the n-type well layer 8 of the photoelectric conversion portion 6 and the p-type well layer 2 formed thereunder functions as a buried-type photodiode.

In the conventional solid-state imaging device produced by the manufacturing method described above, as shown in FIG. 35(b), since the photoelectric conversion portion 6 is formed by mask-alignment using the edge portion 11a of the charge transfer electrode 11 as a mask, the conventional solid-state imaging device suffers from problems of large variations in readout voltage of the signal charge, which variations are caused by misalignment. Further, when a gap is produced between the photoelectric conversion portion 6 and the edge portion 11a of the charge transfer electrode 11, the readout voltage remarkably increases. Consequently, in order to prevent the readout voltage from remarkably increasing, it is necessary to protrude the edge portion 11a by a distance of at least the corresponding amount of misalignment occurring in mask alignment, so that the edge portion 11a overlies the photoelectric conversion portion over the above distance. This reduces the opening portion 14a in area size, as shown in FIG. 37(b). The opening portion 14a thus reduced in area size increases the tendency of the incident light to be reflected from the light shield film 14.

In order to solve the above problem, Japanese Patent Laid-Open No. Hei5-6992 discloses another conventional solid-state imaging device in which a photoelectric conversion portion is formed by self-alignment using the edge portion of a charge transfer electrode as a mask.

Hereinbelow, a manufacturing method of the another conventional solid-state imaging device disclosed in the above document (hereinafter referred to as the second conventional example) will be described in due order of manufacturing, i.e., process steps thereof with reference to FIGS. 38(a) and 42(b).

First, as shown in FIGS. 38(a) and 38(b), a p-type well layer 22 is formed by ion-implanting a p-type impurity such as boron ions B$^+$ and like ions in an n-type semiconductor substrate 21. Then, formed in a surface region of the p-type well layer 22 by ion-implanting a p-type impurity such as boron ions B$^+$ and like ions and an n-type impurity such as phosphorus ions P$^+$ and like ions are: a P$^+$ type channel stop 23; a p-type charge readout portion 24; and, an n-type charge transfer portion 25. Then, a gate insulation film 26 constructed of a thermal oxidation film, oxidation film, nitride film, oxide (ONO) film, or like film is formed over the entire surface of the substrate. Subsequent to the above, a gate electrode film (not shown) such as a polysilicon film and the like is formed over the gate insulation film 26. Then, by removing an unnecessary region of such gate electrode film by a plasma etching process, a charge transfer electrode 27 is formed. Further formed on this charge transfer electrode 27 is an interlayer insulation film which is constructed of the thermal oxidation film, CVD oxidation film and like films. After forming the interlayer insulation film, as shown in FIGS. 39(a) and 39(b), a gate electrode film 28 constructed of a polysilicon film and the like is formed over both the gate insulation film 26 and the interlayer insulation film. Then, formed on these films is a photoresist film 31 which is provided with an opening portion. This opening portion covers a region other than a part 30 thereof, in which region the photoelectric conversion portion 29 (described later) will be formed later. After that, by removing an unnecessary region of the gate electrode film 28 through a plasma etching process, a pattern which will form a charge transfer electrode 32 is formed, wherein the charge transfer electrode 32 doubles as a charge readout electrode. Then, the photoresist film 31 is removed. Subsequent to the above, formed again on both the gate insulation film 26 and the above interlayer insulation film is a photoresist film 33. This film 33 is provided with an opening portion which covers the above part 30 of the region in which the photoelectric conversion portion 29 will be formed later. After that, the above part 30 is removed by the plasma etching process using the photoresist film 33 as a mask, so that a charge transfer electrode 32 is formed. Subsequent to the above, as shown in FIGS. 40(a) and 40(b), an n-type well 34 forming the photoelectric conversion portion 29 is self-aligned with an edge portion 32a of the charge transfer electrode 32, and formed by ion-implanting an n-type impurity such as phosphorus ions P$^+$ and like ions at an acceleration energy of more than or equal to 200 KeV using both the charge transfer electrode 32 and the photoresist film 33 as masks.

Then, the photoresist film 33 is removed. After that, the photoelectric conversion portion 29 is formed by self alignment using both the charge transfer electrodes 27 and 32 as masks in an ion implantation process of the p-type impurity such as boron ions B$^+$ and like ions in a shallow surface region of the n-type well layer 34, and thereby forming a P$^+$ type region 35 for preventing dark current from occurring, which dark current occurs in the surface of the photoelectric conversion portion 29 to impair the SN (Signal-to-Noise) ratio at a time when the intensity of illumination is low. At this time, in order to prevent the above p-type impurity from being ion-implanted in the other region where charge detection portions and on-chip amplifiers and like components of the solid-state imaging device are formed, it is necessary to form a photoresist film over the other region described above. Then, as shown in FIG. 42(b), an interlayer insulation film 36 is formed over the entire surface of the substrate. After that, as shown in FIGS. 42(a) and 42(b), a light shield film 37 made of tungsten, aluminum and like materials is formed over the interlayer insulation film 36 to prevent the same 36 from being exposed to light. Then, the light shield film 37 thus formed over the photoelectric conversion portion 29 is removed to form an opening portion 37a. The n-type well layer 34 of the photoelectric conversion portion 29 and the p-type well layer 22 formed thereunder function as a buried-type photodiode.

In the conventional solid-state imaging device produced by the manufacturing method described above, as shown in FIG. 42(b), the photoelectric conversion portion 29 is formed by self alignment using the edge portion 32a of the charge transfer electrode 32 as a mask, wherein the charge transfer electrode 32 doubles as a charge readout electrode. Consequently, it is possible for this second conventional example of the solid-state imaging device to prevent the readout voltage from varying due to the misalignment problem inherent in the first conventional example of the solid-state imaging device. Further, in the second example of the conventional solid-state imaging device, since the photoelectric conversion portion 29 is aligned with the edge portion 32a without fail, there is no gap between the photoelectric conversion portion 29 and the edge portion 32a, which prevents the readout voltage from being remarkably increased. As a result, in contrast with the first example of the conventional solid-state imaging device, in this second example of the conventional solid-stage imaging device, the edge portion 32a is not required to protrude in a manner such that the edge portion 32a overlies the photoelectric conversion portion 29. This permits the opening portion 37a to be larger in area size than the corresponding opening portion of the first example of the conventional solid-state imaging device, and, therefore decreases the tendency of the incident light to be reflected from the light shield film 37.

However, the second example of the conventional solid-state imaging device suffers from the following problem.

Namely, in forming the charge transfer electrode 32, the pattern in which the charge transfer electrode 32 is formed and a part of the gate electrode film 28 corresponding to the part 30 of the photoelectric conversion portion 29 is included is formed as shown in FIGS. 43(a) and 43(b). After that, as shown in FIGS. 44(a) and 44(b), a second etching process of the plasma etching type is carried out over the entire region of the photoelectric conversion portion 29 including the part 30. In this second etching process, in addition to the part 30 on which the gate electrode film 28 still remains, another part or region of the photoelectric conversion portion 29 on which only the gate insulation film 26 remains is also simultaneously subjected to the second etching process. Due to such simultaneous etching, as indicated by the reference numeral 38 in FIG. 44(b), a boundary area between the photoelectric conversion portion 29 and the gate insulation film 26 has a tendency to be damaged.

The following is an example in which: an oxide film having a film thickness of 800 angstroms is formed to serve as the gate insulation film 26; and, a polysilicon film having a film thickness of 3000 angstroms is formed to serve as the charge transfer electrode 32. In the first etching process, in order to form the pattern which will form the charge transfer electrode 32 without producing any residues in a side wall portion of the charge transfer electrode 32 in the etching process, it is necessary to etch away both the charge transfer electrode 32 and the gate insulation film 26 up to a depth of 6000 angstroms corresponding to two times the thickness of the actual polysilicon film. In this case, an excessively etched-away depth of the polysilicon film reaches (6000−3000=3000) angstroms. Consequently, when the selective ratio of the polysilicon film to the oxide film is equal to a ratio of 10 to 1, the gate insulation film 26 is etched away up to a depth of 300 angstroms. Then, in the second etching process, when the gate electrode film 28 corresponding to the part 30 of the photoelectric conversion portion 29 is removed, in order to carry out a complete etching process as to all the chips of the wafer, it is necessary for an etched-away depth to reach a level of 4500 angstroms corresponding to 1.5 times the film thickness of the actual polysilicon film. Consequently, when the selective ratio of the polysilicon film to the oxide film is equal to a ratio of 10 to 1, the gate insulation film 26 is over-etched away by the amount corresponding to a film thickness of 450 angstroms. Due to this, the total amount in film thickness of the gate insulation film 26 to be removed by etching reaches (300+450=) 750 angstroms. Therefore, after completion of the etching process, the gate insulation film 26 has a film thickness of (800−750=) 50 angstroms. In general, the etched-away amount in the wafer area varies within a range of approximately 10%. For example, as for the gate insulation film 26, its etched-away amount varies in depth within a range of approximately 75 angstroms. Due to this, the gate insulation film 26 is often completely removed in some chips of the wafer. As a result, as is clear from FIG. 44(b), a surface of the photoelectric conversion portion 29 is often damaged by etching. The thus damaged portion is denoted by the reference numeral 38 in FIG. 44(b). Due to such damaged portion 38, dark current increases in the photoelectric conversion portion 29 and crystal defects occur, whereby a so-called "white damage" occurs. Such deficiencies not only impair in properties the solid-state imaging device, but also considerably decrease the yield of the solid-state imaging device, which increases the manufacturing cost of the device.

In order to prevent the damage caused by etching from occurring, the gate insulation film 26 is increased in film thickness (hereinafter referred to as the former case), or the charge transfer electrode 32 is decreased in film thickness (hereinafter referred to as the latter case). However, the former case presents a new problem of a decrease in maximum quantity limit of charge transferred in the charge transfer portion 25. On the other hand, the latter case presents another new problem of an increase in resistance of the charge transfer electrode 32, which deforms in pulse-wave shape the transferred pulse.

Further, in the manufacturing method of the solid-state imaging device described in the first and the second conventional examples, as shown in FIGS. 33(a) to 42(b), in order to form the charge transfer electrodes 10, 32 together with the photoelectric conversion portions 6, 29 and the p+ type regions 12, 35, it is necessary to carry out the photoresist process three times. However, such burdensome repetition of the photoresist processes increases both the manufacturing time and cost of the device.

SUMMARY OF THE INVENTION

It is an object of the present invention to provide a solid-state imaging device and manufacturing method thereof, wherein the solid-state imaging device is capable of: preventing its readout characteristics of the signal charge from varying; preventing the dark current from increasing; preventing the so-called "white damage" from occurring; and, decreasing the manufacturing time and cost of the device.

Means for solving the problems inherent in the related art are as follows:

According to a first aspect of the present invention, the above object of the present invention is accomplished by providing:

A solid-state imaging device comprising:

a plurality of photoelectric conversion portions each for converting incident light into signal charge the amount in charge of which corresponds to the amount of the incident light;

a plurality of charge readout portions provided adjacent to the photoelectric conversion portions, each of the charge readout portions being designed to read out the signal charge having been generated in the corresponding one of the photoelectric conversion portions;

a plurality of charge transfer portions provided adjacent to the photoelectric conversion portions, each of the charge transfer portions being designed to transfer the signal charge having been retrieved from the corresponding one of the photoelectric conversion portions through the corresponding one of the charge readout portions; and a charge transfer electrode, which is formed, through an insulation film, over the corresponding one of the photoelectric conversion portions, the corresponding one of the charge readout portions, the corresponding one of the charge transfer portions and also over peripheral portions of these corresponding ones, is provided with an opening portion over the corresponding one of the photoelectric conversion portions, and doubles a charge readout electrode for controlling the reading and writing of the signal charge from the corresponding one of the photoelectric conversion portions to the corresponding one of the charge transfer portions, the charge transfer electrode being designed to control in transfer the signal charge of the corresponding one of the charge transfer portions.

In this first aspect of the present invention, preferably, each of the photoelectric conversion portions is formed within a surface region of a first conductivity type semiconductor layer, and formed of a second conductivity type semiconductor layer.

According to a second aspect of the present invention, the above object of the present invention is accomplished by providing:

A solid-state imaging device comprising:

a plurality of photoelectric conversion portions each for converting incident light into signal charge the amount in charge of which corresponds to the amount of the incident light, the photoelectric conversion portions being formed within a surface region of a first conductivity type semiconductor layer and formed of a second conductivity type semiconductor layer;

a plurality of charge readout portions provided adjacent to the photoelectric conversion portions, each of the charge readout portions being designed to read out the signal charge having been generated in the corresponding one of the photoelectric conversion portions, the charge readout portions being formed of the first conductivity type semiconductor layer;

a plurality of charge transfer portions adjacent to the photoelectric conversion portions, each of the charge transfer portions being designed to transfer the signal charge having been retrieved from the corresponding one of the photoelectric conversion portions through the corresponding one of the charge readout portions, the charge transfer portions being formed of the second conductivity semiconductor layer;

a plurality of first charge transfer electrodes forming at least one layer through an insulation film over the corresponding one of the charge transfer portions, each of the first charge transfer electrodes being designed to control in transfer the signal charge of the corresponding one of the charge transfer portions; and a plurality of second charge transfer electrodes, each of which is formed, through an insulation film, over the corresponding one of the photoelectric conversion portions, the corresponding one of the charge readout portions, the corresponding one of the charge transfer portions and also over peripheral portions of these corresponding portions, is provided with an opening portion over the corresponding one of the photoelectric conversion portions, wherein adjacent ones of the second charge transfer electrodes are formed so as to be separated from each other through a separation portion separated from the opening portion, and each of the second charge transfer electrodes doubles as a charge readout electrode for controlling the reading and writing of the signal charge from the corresponding one of the photoelectric conversion portions to the corresponding one of the charge transfer portions, the second charge transfer electrode being designed to control in transfer the signal charge of the corresponding one of the charge transfer portions.

In the second aspect of the present invention, preferably, each of the second charge transfer electrodes is formed in a manner such that it is spaced a predetermined distance away from any one of the corresponding ones of the first charge transfer electrodes in one and the same layer, or has its edge portion overlie a corresponding edge portion of the any one of the corresponding ones of the first charge transfer electrodes in different layers spaced apart from each other through an insulation film.

In the first and the second aspect of the present invention, preferably, each of the photoelectric conversion portions is formed by self alignment using an edge portion of an opening portion of the corresponding one of the charge transfer electrodes as a mask.

Further, preferably, each of the photoelectric conversion portions is constructed of: a first one of the second conductivity type semiconductor layer, the first one being large in depth and narrow in its region; a second one of the second conductivity type semiconductor layer, the second one being small in depth and wide in its region; and, the first conductivity type semiconductor layer, the first conductivity type semiconductor layer being formed in surface regions of these first and second ones of the second conductivity type semiconductor layer.

Still further, preferably, the first conductivity type semiconductor region forming the each of the photoelectric conversion portions is formed in a manner such that the first conductivity type semiconductor region is spaced a predetermined distance away from an edge portion of the charge readout portion side of the opening portion of the corresponding one of the charge transfer electrodes.

According to a third aspect of the present invention, the above object of the present invention is accomplished by providing:

A manufacturing method of a solid-state imaging device, the solid-state imaging device comprising: a plurality of photoelectric conversion portions each for converting incident light into signal charge the amount in charge of which corresponds to the amount of the incident light; a plurality of charge readout portions provided adjacent to the photoelectric conversion portions, each of the charge readout portions being designed to read out the signal charge having been generated in the corresponding one of the photoelectric conversion portions; a plurality of charge transfer portions provided adjacent to the photoelectric conversion portions, each of the charge transfer portions being designed to transfer the signal charge having been retrieved from the corresponding one of the photoelectric conversion portions through the corresponding one of the charge readout portions; and, a charge transfer electrode, which is formed, through an insulation film, over the corresponding one of the photoelectric conversion portions, the corresponding one of the charge readout portions, the corresponding one of the charge transfer portions and also over peripheral portions of these corresponding ones, the charge transfer electrode being designed to control in transfer the signal charge of the corresponding one of the charge transfer portions; the method comprising:

a first step of forming a plurality of first charge transfer electrodes each constructed of at least one layer, the first charge transfer electrodes being formed over a first conductivity type semiconductor layer, in a surface region of which are formed: the plurality of charge readout portions constructed of the first conductivity type semiconductor layer; and, the plurality of charge transfer portions constructed of the second conductivity type semiconductor layer;

a second step of forming a photoresist film having an opening portion in a region corresponding to a region in which the plurality of photoelectric conversion portions are formed after a conductive film is formed through an insulation film;

a third step of removing the conductive film of the region corresponding to the opening portion by using the photoresist film as a mask;

a fourth step of forming the plurality of photoelectric conversion portions by using both the photoresist film and the conductive film as masks, or by using the conductive film only as a mask; and a fifth step of forming, by etching the conductive film, a plurality of second charge transfer electrodes each doubling as a charge readout electrode for controlling the reading and writing a signal charge from the corresponding one of the photoelectric conversion portions to the corresponding one of the charge transfer portions.

In this third aspect of the present invention, preferably, in the fifth step, adjacent ones of the second charge transfer electrodes are formed so as to be separated from each other through a separation portion separated from the opening portion.

Further, preferably, in the fifth step, each of the second charge transfer electrodes is formed in a manner such that it is spaced a predetermined distance away from any one of the corresponding ones of the first charge transfer electrodes in one and the same layer, or has its edge portion overlie a corresponding edge portion of the any one of the corresponding ones of the first charge transfer electrodes in different layers spaced apart from each other through an insulation film.

Still further, preferably, in the fourth step, after the plurality of second conductivity type semiconductor layers are formed by using both the photoresist film and the conductive film as masks, the first conductivity semiconductor region is formed in the surface region of each of the second conductivity type semiconductor layers by using both the photoresist film and the conductive film as masks, or, by using the conductive film only as a mask.

Further, preferably, in the fourth step, after the first ones of the second conductivity type semiconductor regions each of which is large in depth and narrow in region are formed by using as a mask a photoresist film provided with a second opening portion smaller in area size than the first opening portion, the second ones of the second conductivity type semiconductor regions each of which is small in depth and wide in region are formed by using as a mask the conductive film only, and, the first conductivity type semiconductor regions are formed in the surface regions of both the first and the second ones of the second conductivity type semiconductor regions.

Further, preferably, in the fourth step, the first conductivity type semiconductor regions are formed by ion-implanting a fist conductivity type impurity at a predetermined inclination implantation angle relative to a vertical direction in a manner such that each of the first conductivity type semiconductor regions is spaced a predetermined distance away from an edge portion of the charge readout portion side of the opening portion of the corresponding one of the charge transfer electrodes.

The effects of the present invention are as follows. Namely, as described above, in the present invention having the above construction, it is possible to suppress variations in the readout characteristics of the signal charge. Further, it is possible for the present invention to prevent the dark current from increasing, and also possible to prevent the so-called "white damage" from occurring. Furthermore, it is also possible to decrease the manufacturing time and cost of the solid-state imaging device.

In addition to the above, in the present invention having another construction, since the charge transfer electrode is composed of a single layer, it is possible to reduce the interlayer capacity, which may solve the problem of insulation between the electrodes.

In the present invention having further another construction, since the photoelectric conversion portion is composed of the first conductivity type semiconductor region and the second conductivity type semiconductor region, it is possible to align the edge portion of the charge transfer electrode with the edge portion of the photoelectric conversion portion without fail even when the edge portion of the charge transfer electrode doubling as a charge readout electrode is set back relative to the edge portion of the photoresist film due to over etching or due to variations in etching, which assures that a readout voltage of the signal charge further stabilized is obtained.

Further, in the present invention having still further another construction, since the first conductivity type region forming the photoelectric conversion portion is formed so as to be spaced apart from the edge portion of the charge transfer electrode (which doubles as a charge readout electrode) by a predetermined distance, there is no fear that the first conductivity type impurity in the first conductivity type region diffuses horizontally into a region located under the channel of the charge readout portion. Due to this, it is possible to reduce a readout-voltage of the signal charge.

BRIEF DESCRIPTION OF THE DRAWINGS

The above and other objects, advantages and features of the present invention will be more apparent from the following description taken in conjunction with the accompanying drawings in which.

Figure 1:
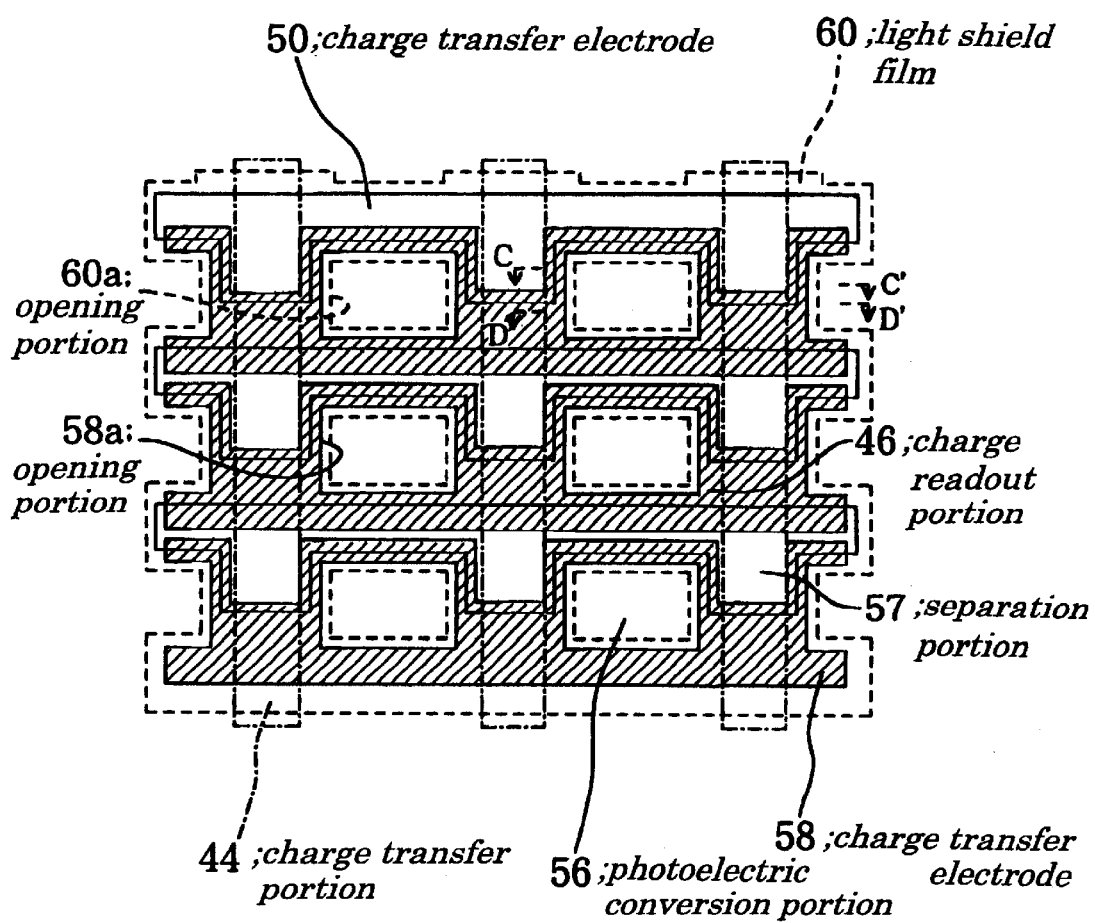
FIG. 1 is a plan view of a first embodiment of the solid-state imaging device, illustrating in dotted lines the device's portions hidden from the eye.
Figure 10:
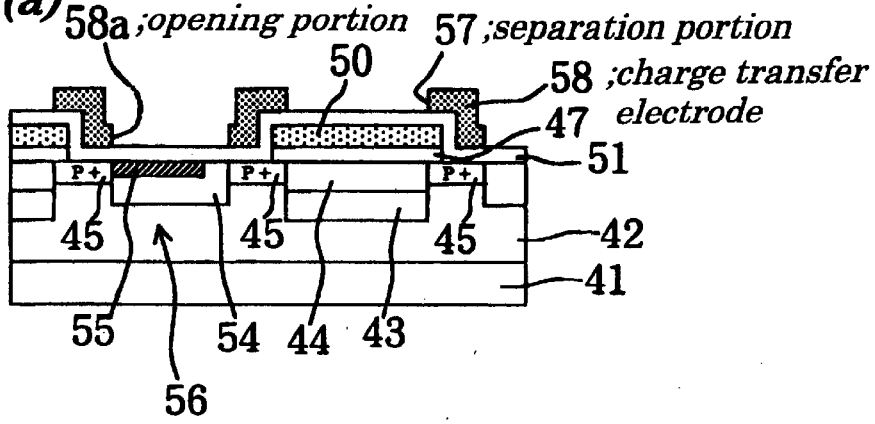
FIG. 10(a) is a cross-sectional view of the substrate of the solid-state imaging device, taken along the line C–C' of FIG. 1, illustrating a process step subsequent to the process step shown in FIG. 8(b)
FIG. 10(b) is a cross-sectional view of the substrate of the solid-state imaging device, taken along the line D–D' of FIG.
Figure 10:
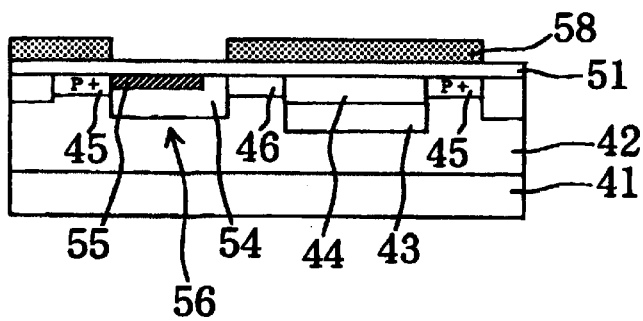
Figure 11:
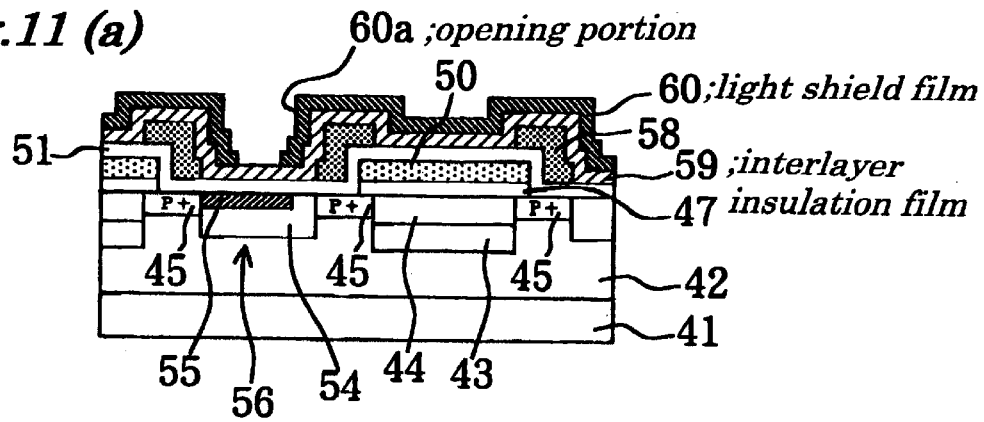
Figure 11:
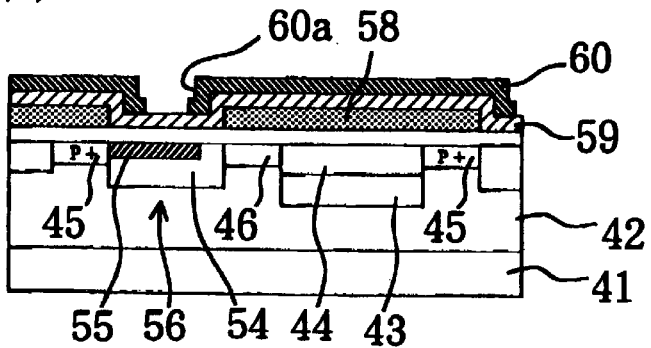
Figure 12:
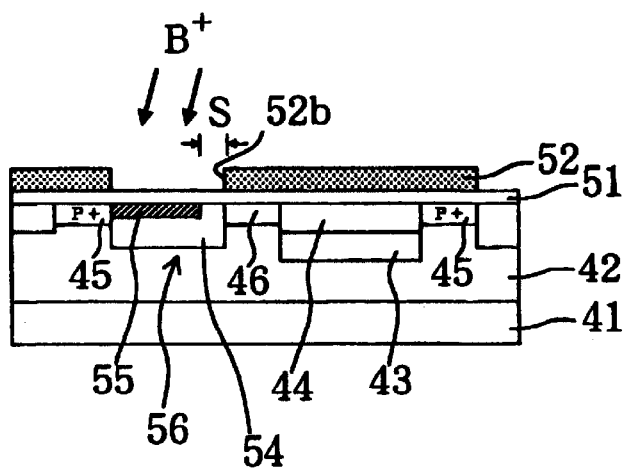
Figure 13:
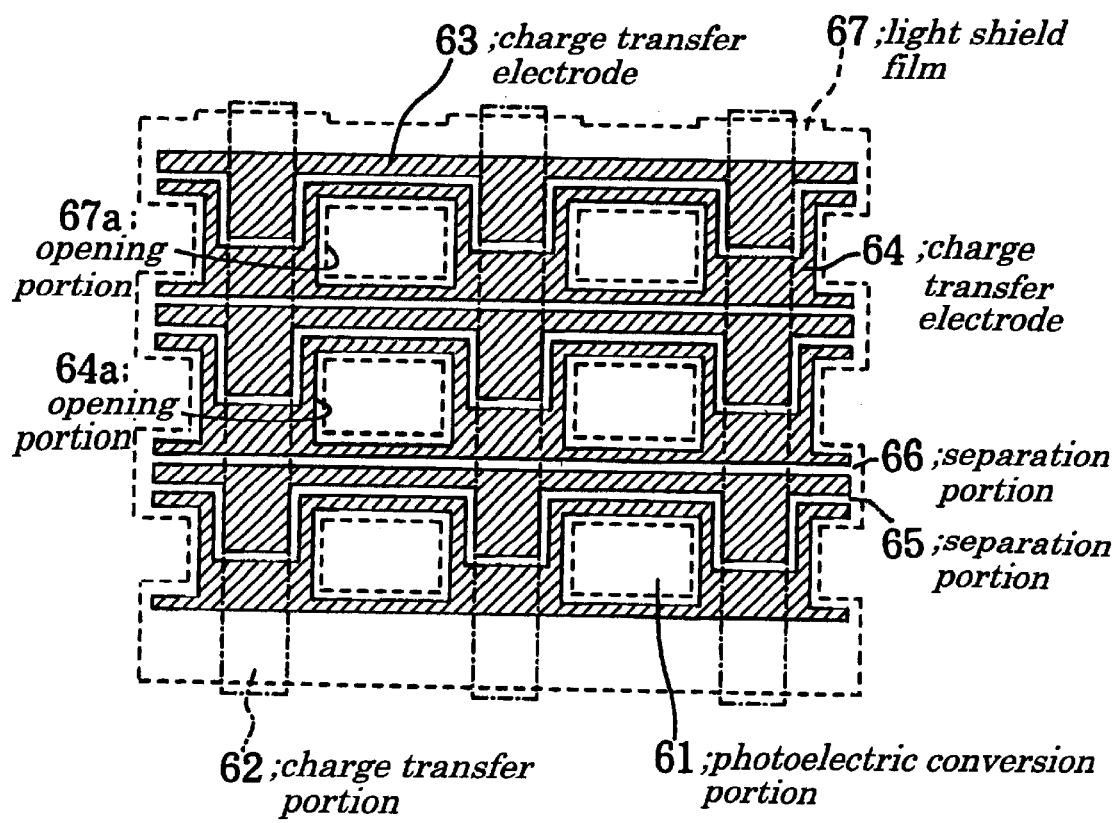
Figure 14:
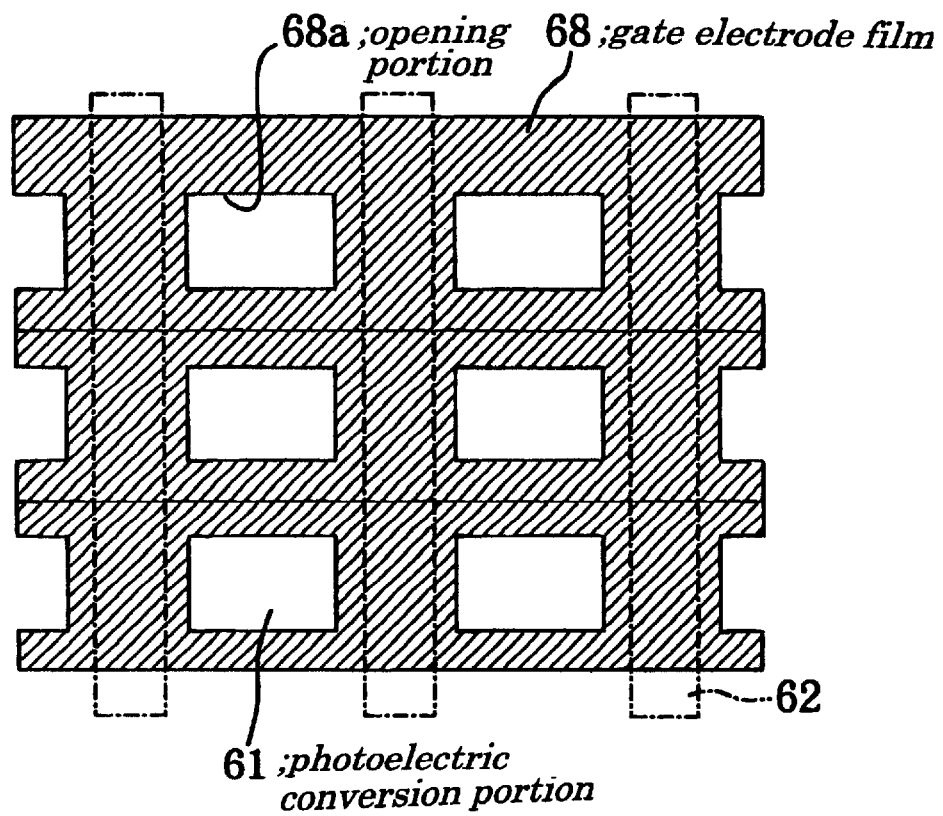
Figure 14:
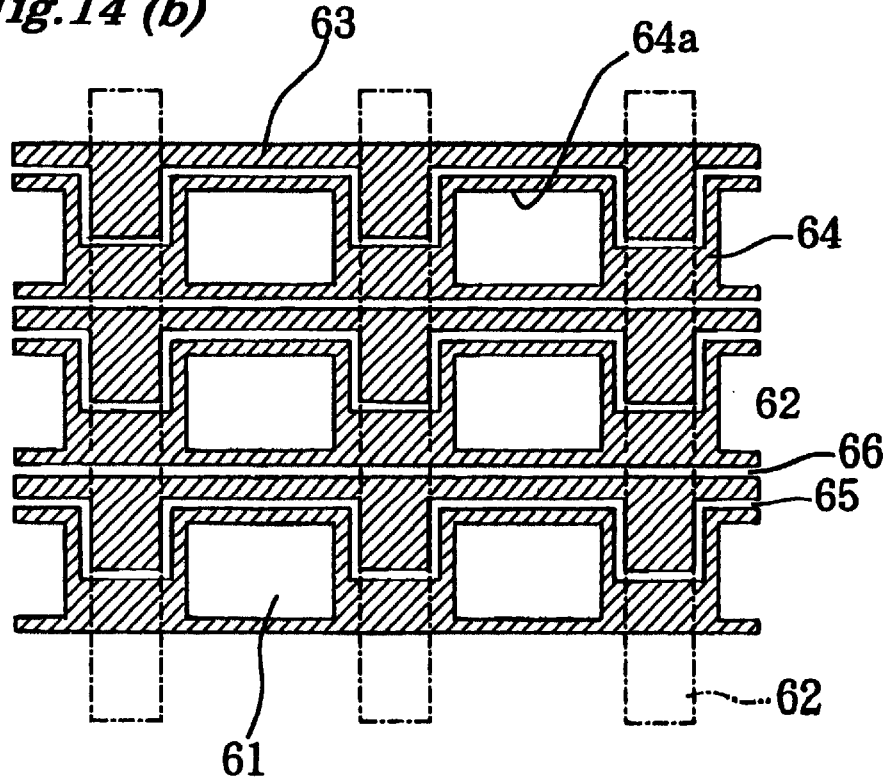
Figure 15:
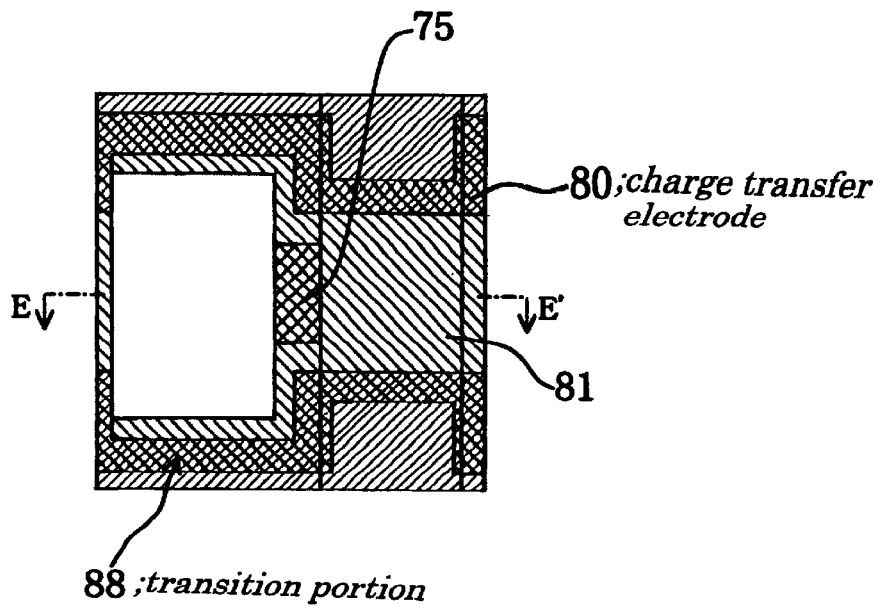
Figure 15:
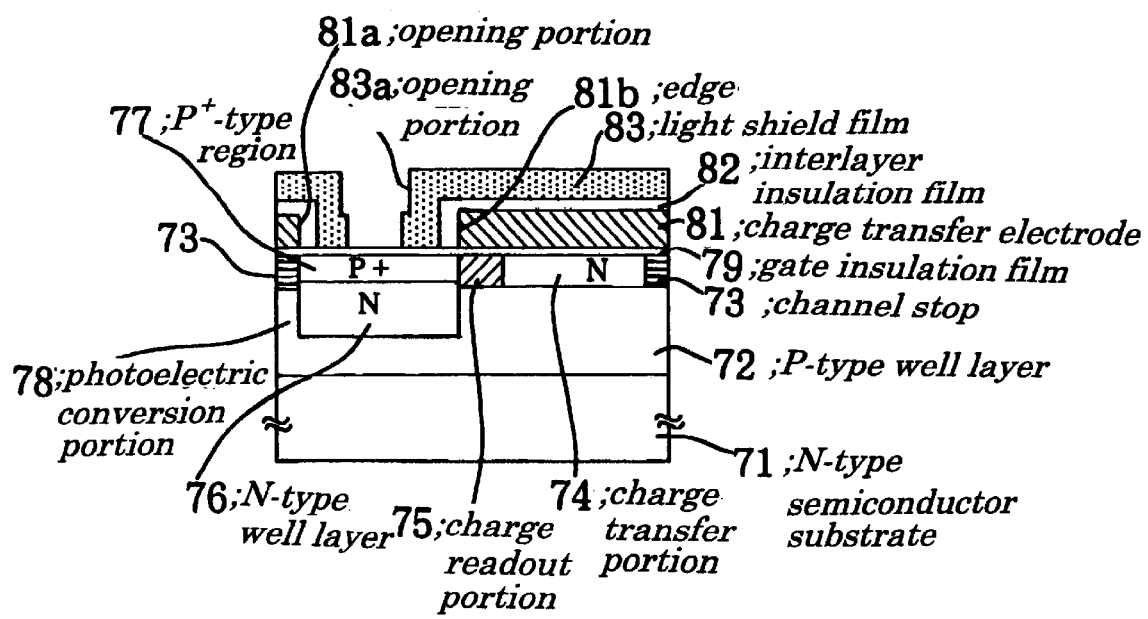
Figure 16:
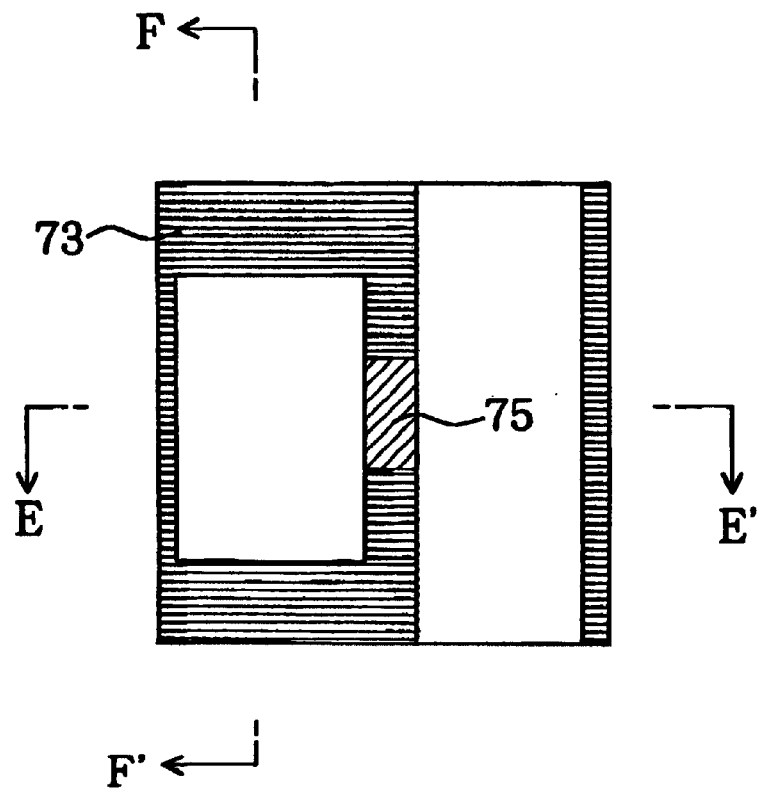
Figure 16:
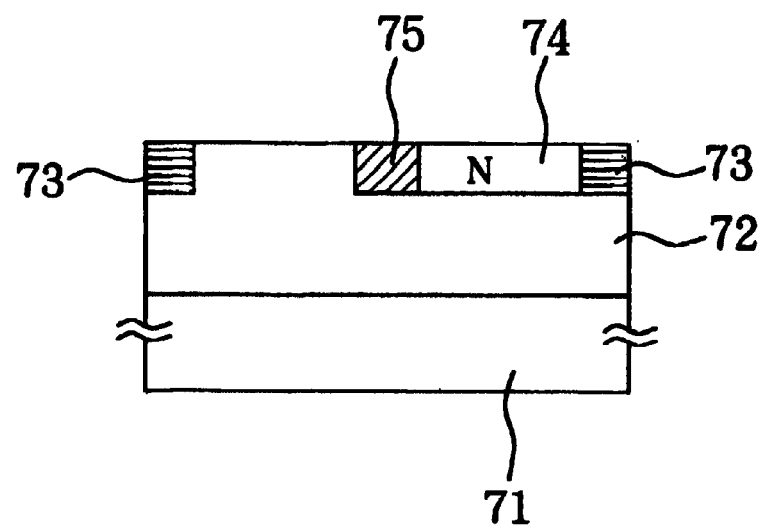
Figure 17:
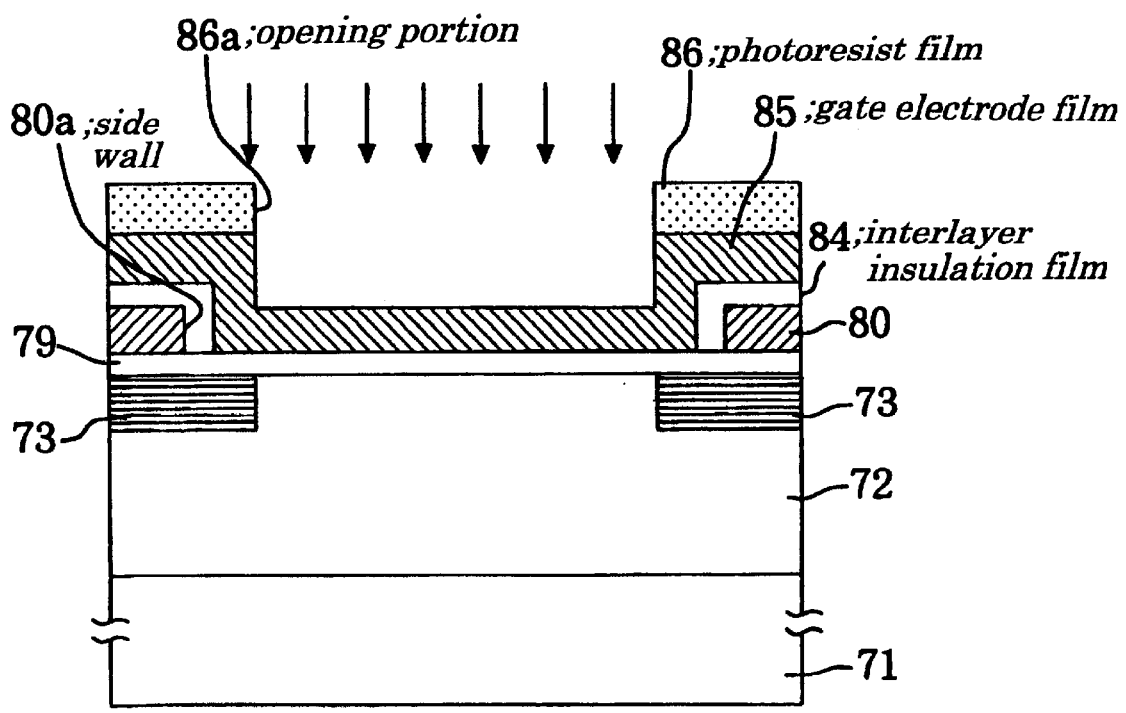
Figure 17:
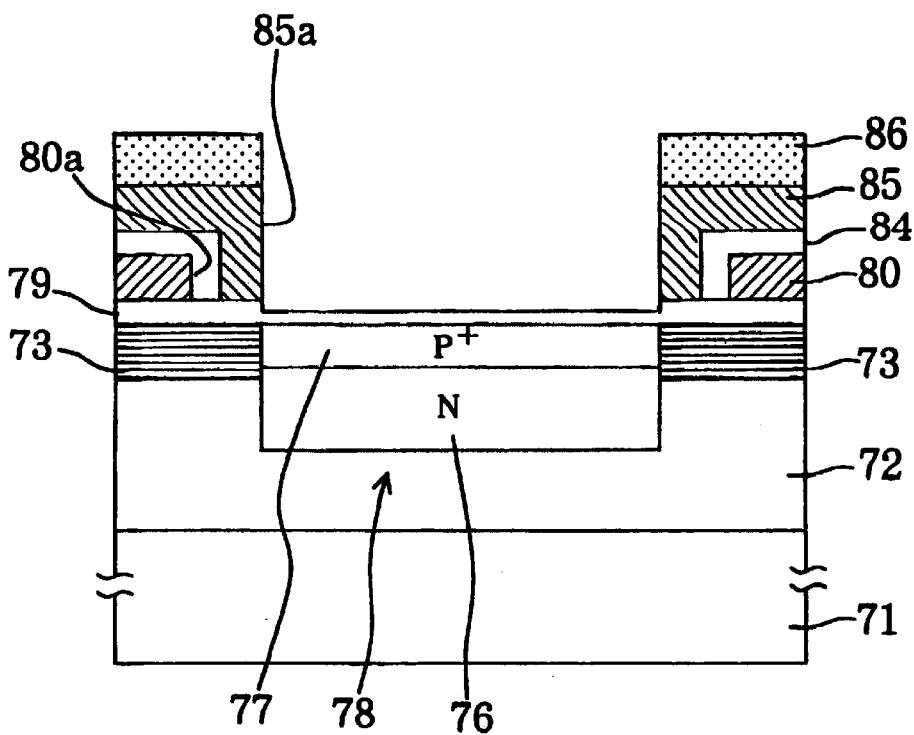
Figure 18:
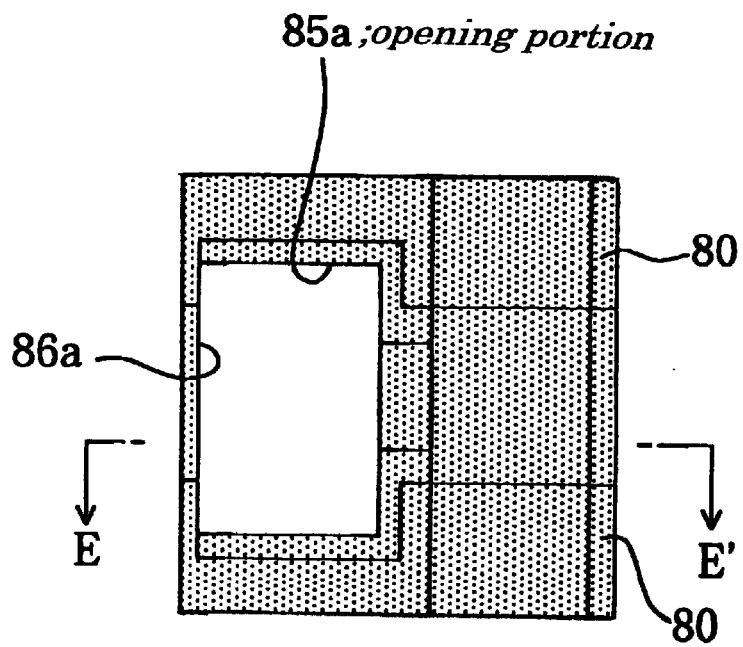
Figure 18:
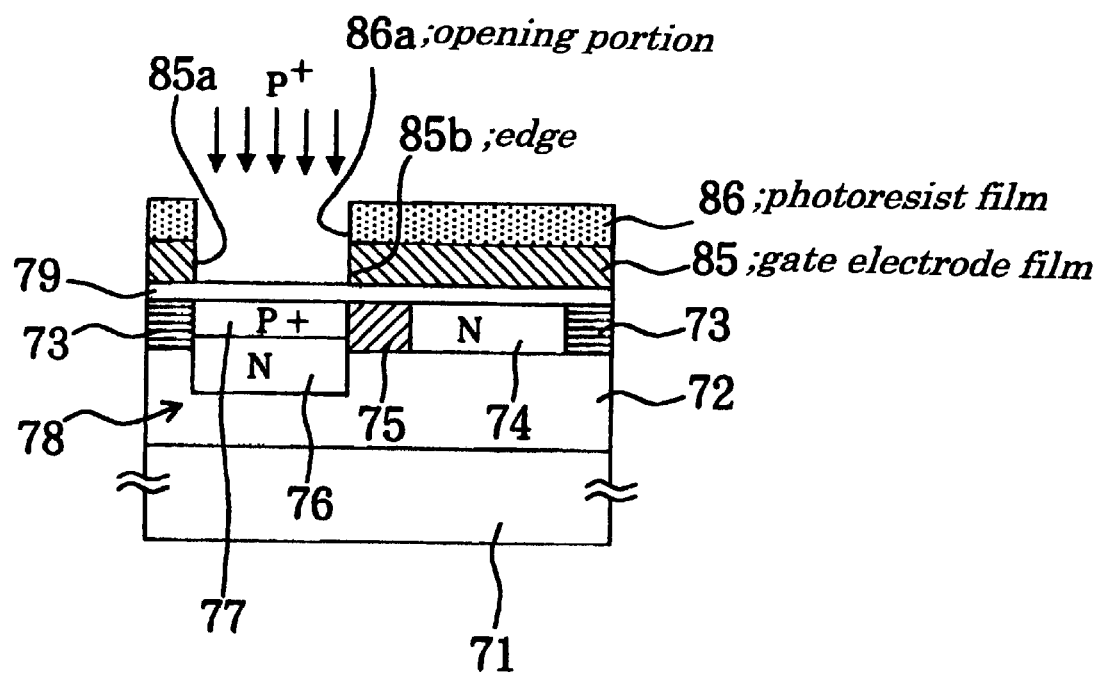
Figure 19:
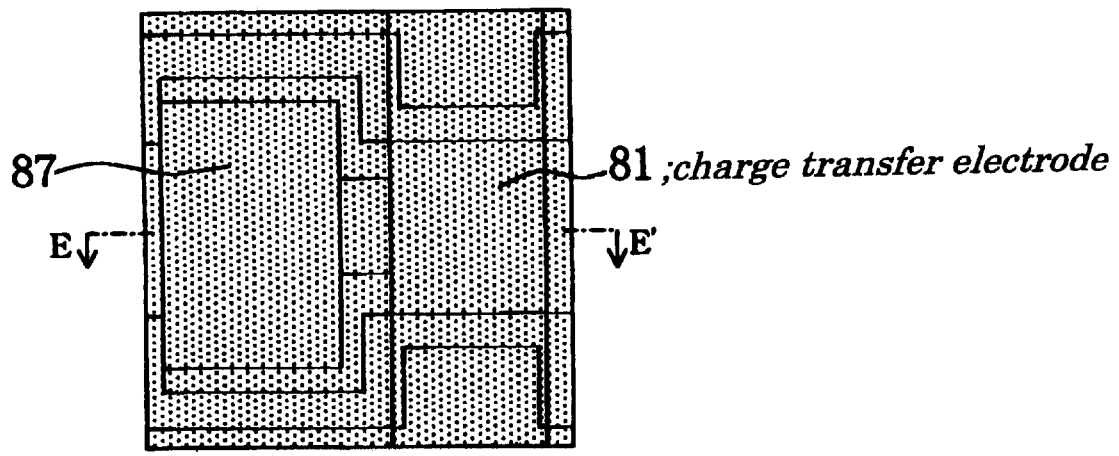
Figure 19:
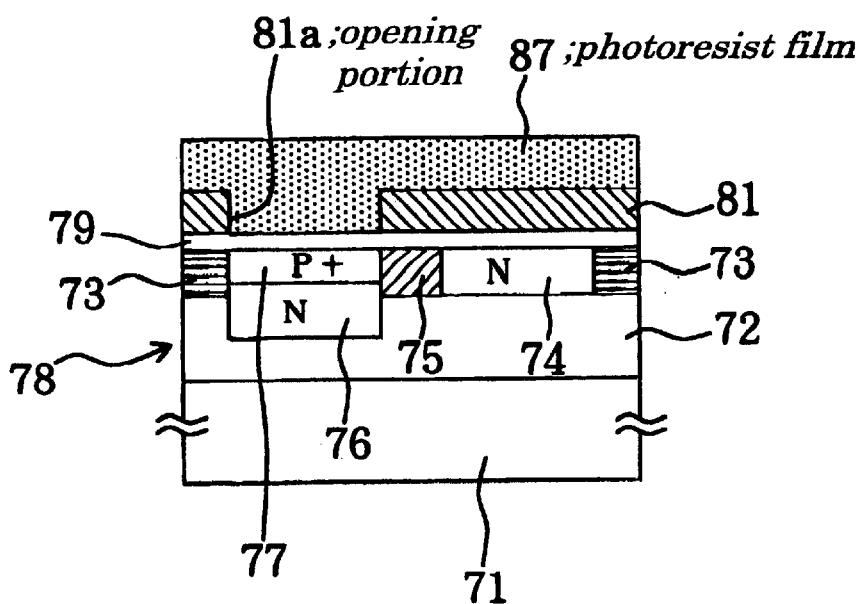
Figure 20:
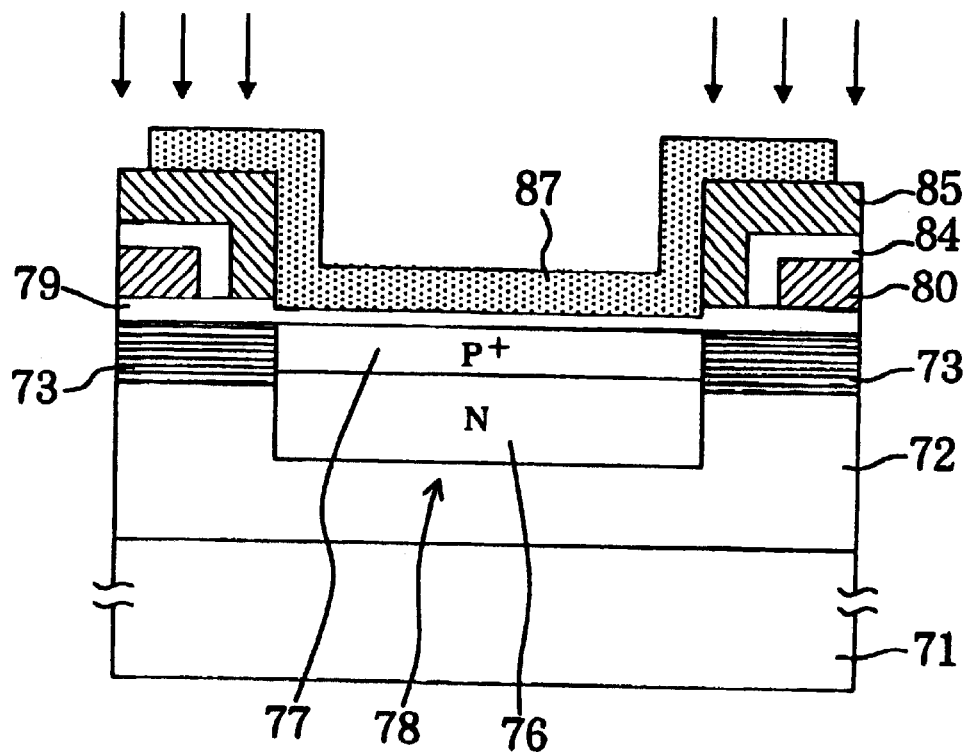
Figure 20:
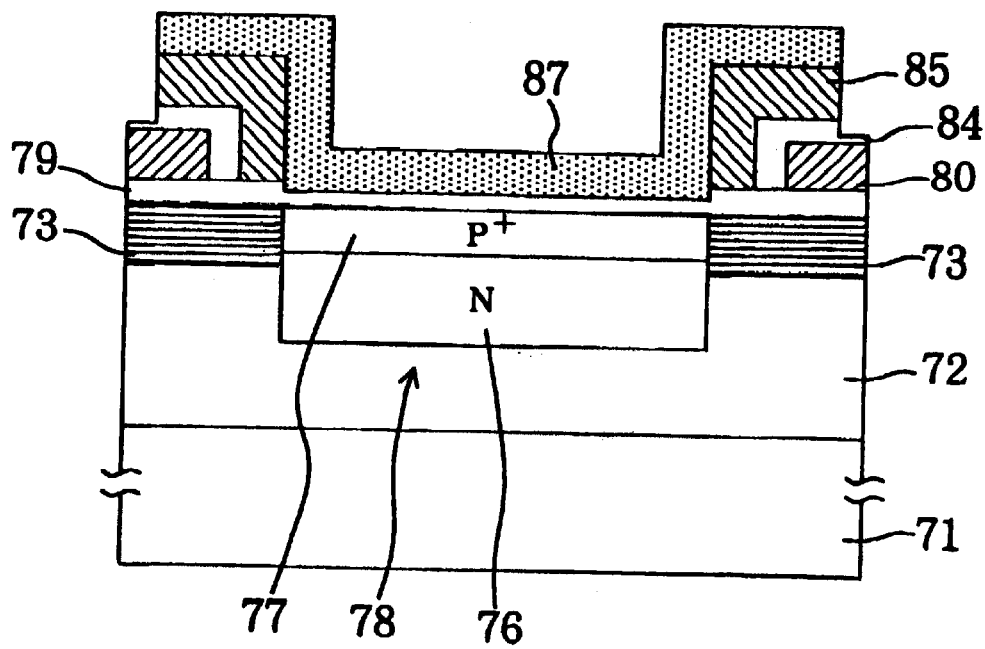
Figure 21:
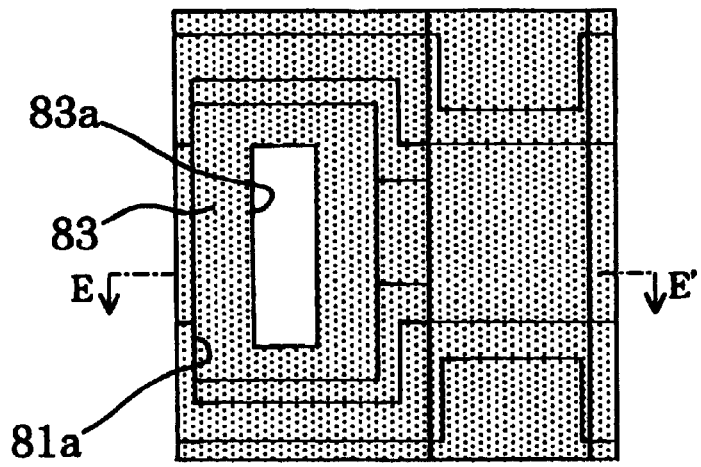
Figure 21:
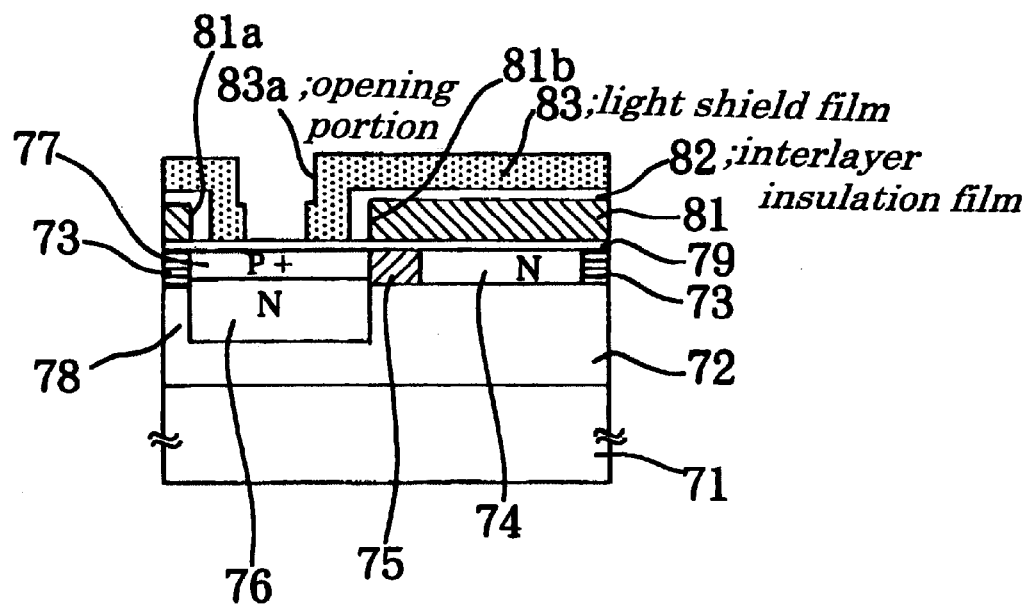
Figure 23:
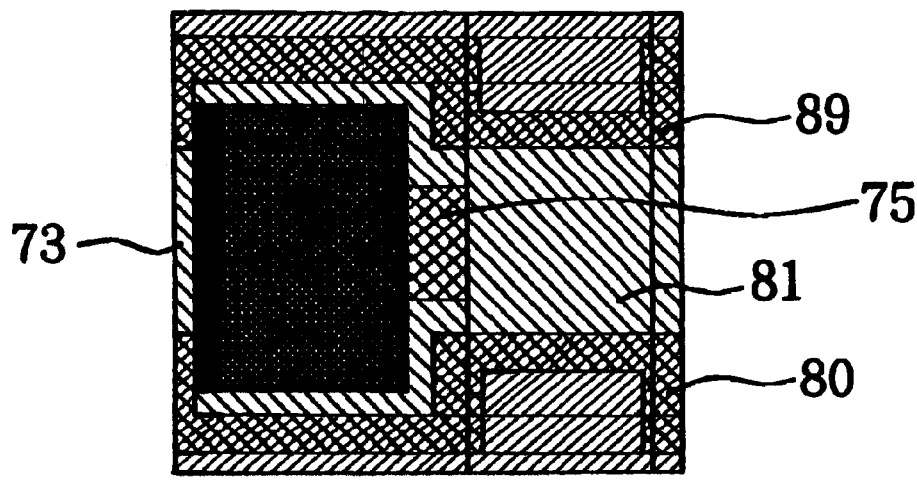
Figure 23:
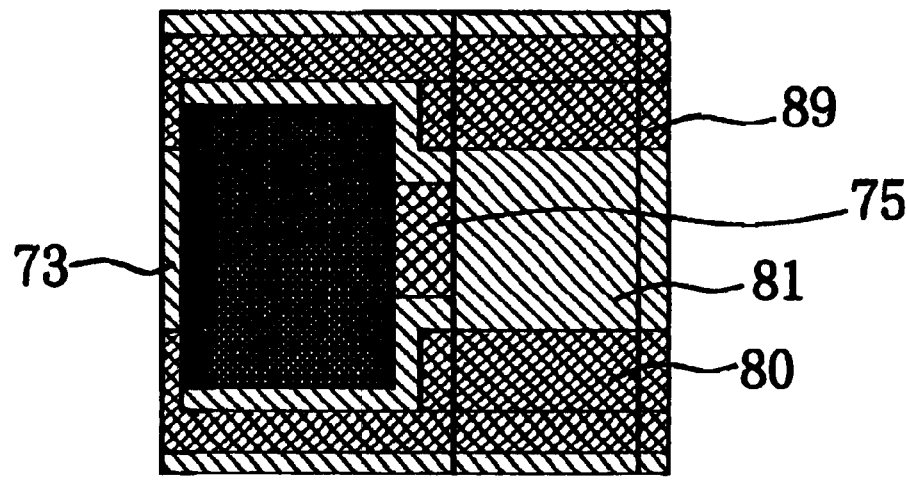
Figure 26:
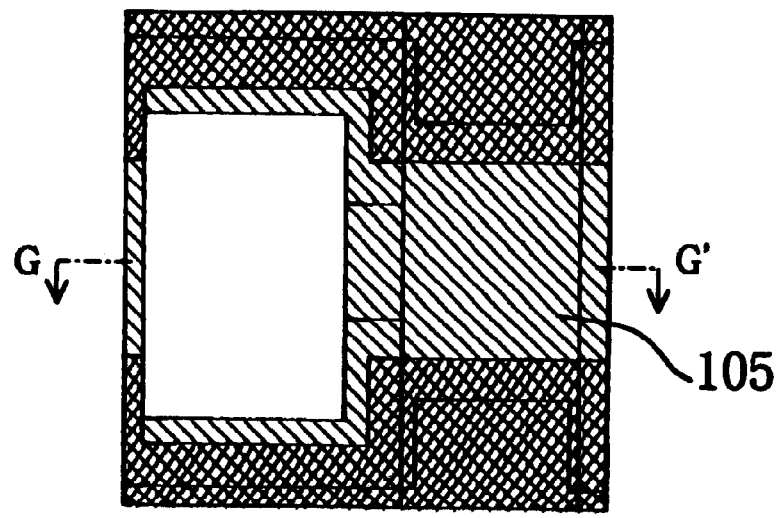
Figure 26:
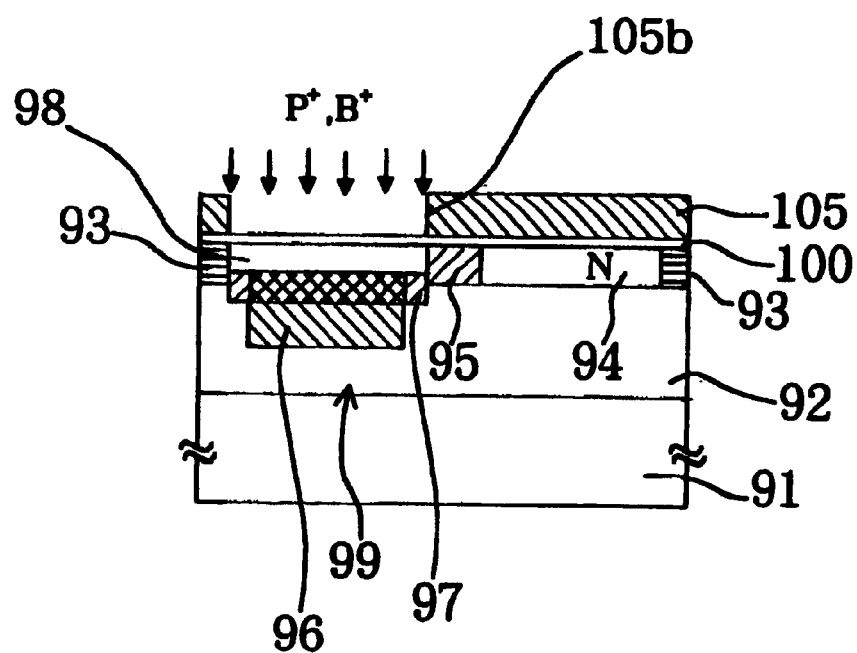
Figure 27:
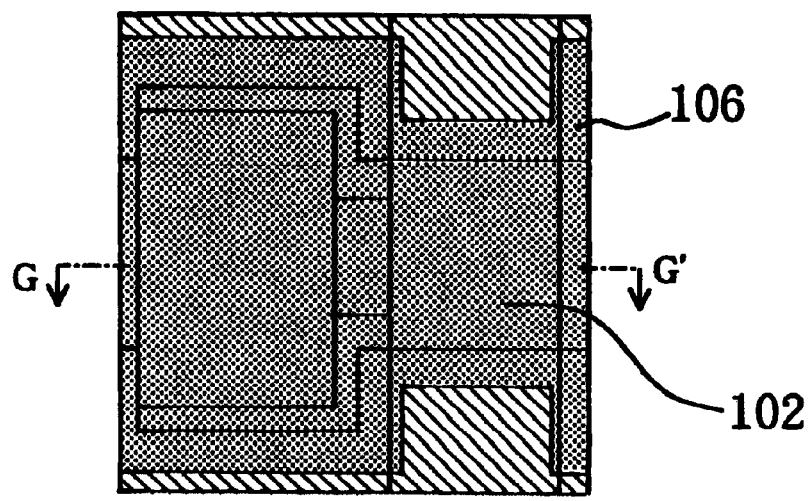
Figure 27:
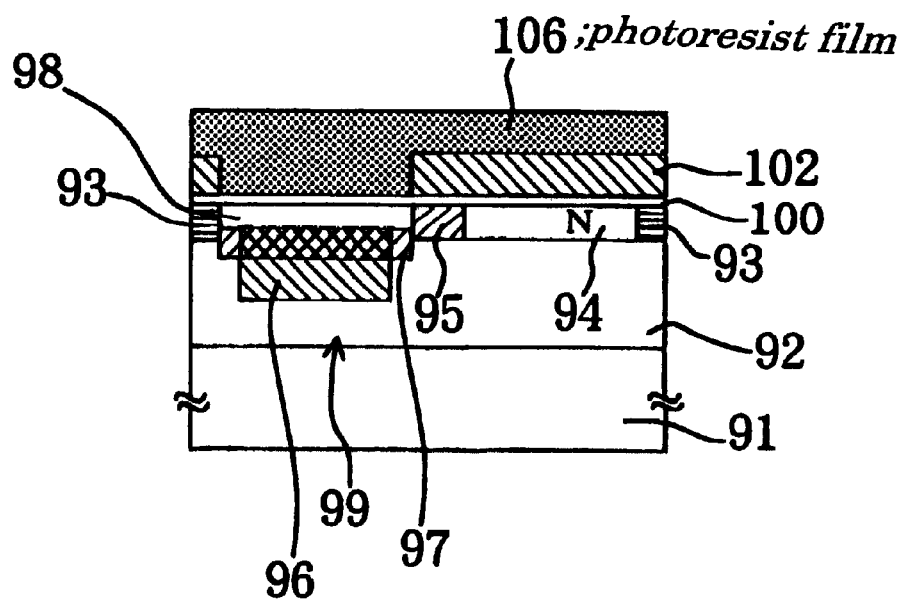
Figure 29:
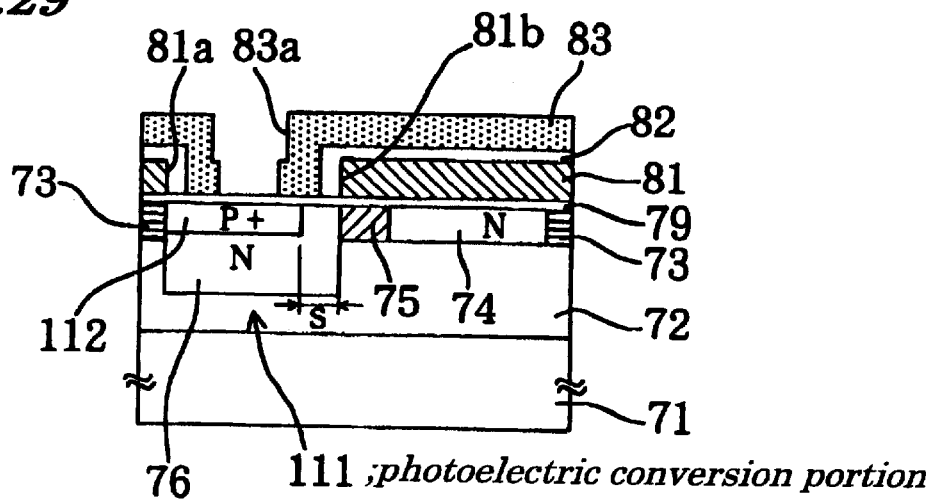
Figure 31:
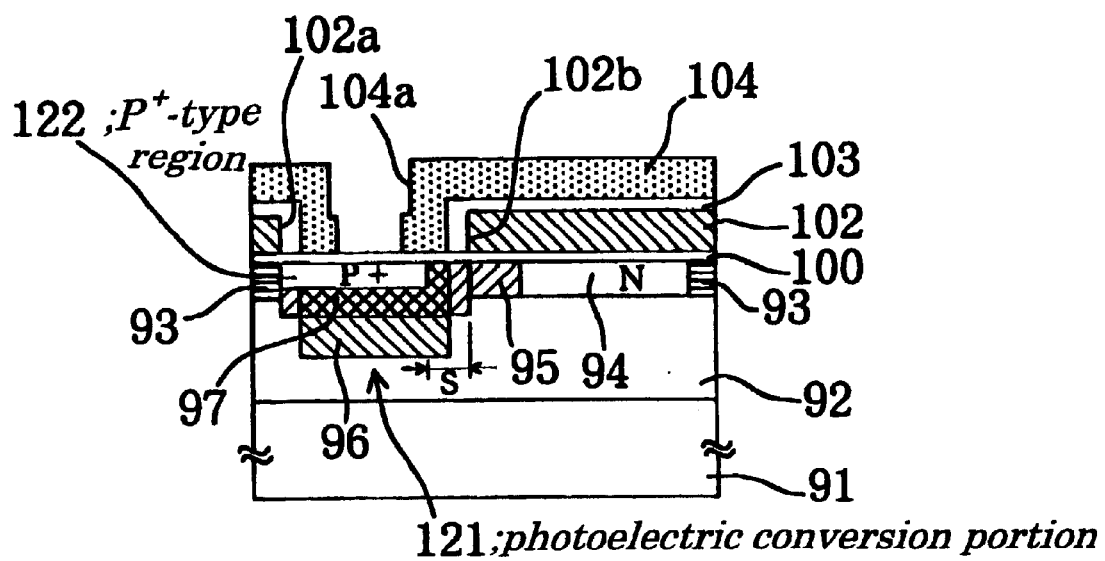
Figure 32:
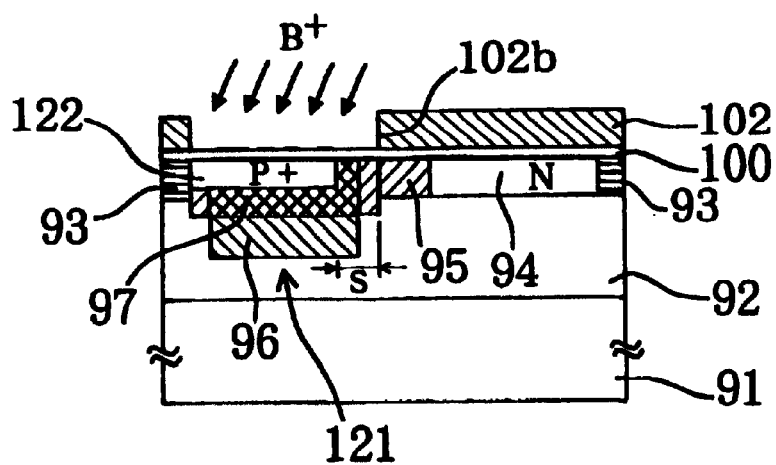

1, illustrating a process step subsequent to the process step shown in FIG. 10(a);

FIG. 11(a) is a cross-sectional view of the substrate of the solid-state imaging device, taken along the line C–C' of FIG. 1, illustrating a process step subsequent to the process step shown in FIG. 10(b);

FIG. 11(b) is a cross-sectional view of the substrate of the solid-state imaging device, taken along the line D–D' of FIG. 1, illustrating a process step subsequent to the process step shown in FIG. 11(a);

FIG. 12 is a cross-sectional view of the substrate of the solid-state imaging device, taken along the line D–D' of FIG. 1, illustrating a modification of the manufacturing method of the solid-state imaging device;

FIG. 13 is a plan view of a second embodiment of the solid-state imaging device, illustrating in dotted lines the device's portions hidden from the eye;

FIG. 14(a) is a plan view of the n-type semiconductor substrate of the solid-state imaging device shown in FIG. 13, illustrating a process step of the manufacturing method of the device;

FIG. 14(b) is a plan view of the substrate of the solid-state imaging device, illustrating a process step subsequent to the process step shown in FIG. 14(a);

FIG. 15(a) is a plan view of the substrate of the solid-state imaging device of a third embodiment, illustrating the device's portions hidden from the eye;

FIG. 15(b) is a cross-sectional view of the substrate of the device of the third embodiment, taken along the line E–E' of FIG. 15(a);

FIG. 16(a) is a plan view of the substrate of the solid-state imaging device of the third embodiment, illustrating the device's portions hidden from the eye in FIG. 15(b);

FIG. 16(b) is a cross-sectional view of the substrate of the device of the third embodiment, taken along the line E–E' of FIG. 16(a);

FIG. 17(a) is a cross-sectional view of the substrate of the solid-state imaging device, taken along the line F–F' of FIG. 16(a), illustrating the start of the etching process of the substrate;

FIG. 17(b) is a cross-sectional view of the substrate after completion of its etching process, taken along the line F–F' of FIG. 16(a);

FIG. 18(a) is a plan view of the substrate of the solid-state imaging device of the third embodiment, illustrating the device's portions hidden from the eye in FIG. 17(b);

FIG. 18(b) is a cross-sectional view of the substrate of the device of the third embodiment, taken along the line E–E' of FIG. 18(a);

FIG. 19(a) is a plan view of the substrate of the solid-state imaging device of the third embodiment, illustrating the device's portions hidden from the eye in FIG. 18(b);

FIG. 19(b) is a cross-sectional view of the substrate of the device of the third embodiment, taken along the line E–E' of FIG. 19(a);

FIG. 20(a) is a cross-sectional view of the substrate of the solid-state imaging device, taken along the line F–F' of FIG. 16(a), illustrating the start of a further etching process of the substrate;

FIG. 20(b) is a cross-sectional view of the substrate after completion of the further etching process, taken along the line F–F' of FIG. 16(a);

FIG. 21(a) is a plan view of the substrate of the solid-state imaging device of the third embodiment, illustrating the device's portions hidden from the eye in FIG. 21(b);

FIG. 21(b) is a cross-sectional view of the substrate of the device of the third embodiment, taken along the line E–E' of FIG. 21(a);

FIG. 22(a) is a plan view of a modification of the solid-state imaging device of the third embodiment shown in FIG. 15(a);

FIG. 22(b) is a plan view of another modification of the solid-state imaging device of the third embodiment shown in FIG. 15(a);

FIG. 23(a) is a plan view of further another modification of the solid-state imaging device of the third embodiment shown in FIG. 15(a);

FIG. 23(b) is a plan view of a further another modification of the solid-state imaging device of the third embodiment shown in FIG. 15(a);

FIG. 24(a) is a plan view of the substrate of the solid-state imaging device of a fourth embodiment, illustrating the device's portions hidden from the eye;

FIG. 24(b) is a cross-sectional view of the substrate of the device of the fourth embodiment, taken along the line G–G' of FIG. 24(a);

FIG. 25(a) is a plan view of the substrate of the solid-state imaging device of the fourth embodiment, illustrating the device's portions hidden from the eye in FIG. 24(b);

FIG. 25(b) is a cross-sectional view of the substrate of the device of the third embodiment, taken along the line G–G' of FIG. 25(a);

FIG. 26(a) is a plan view of the substrate of the solid-state imaging device of the fourth embodiment, illustrating the device's portions hidden from the eye in FIG. 25(b);

FIG. 26(b) is a cross-sectional view of the substrate of the device of the third embodiment, taken along the line G–G' of FIG. 26(a);

FIG. 27(a) is a plan view of the substrate of the solid-state imaging device of the fourth embodiment, illustrating the device's portions hidden from the eye in FIG. 26(b) after the photoresist film is formed;

FIG. 27(b) is a cross-sectional view of the substrate of the device of the third embodiment, taken along the line G–G' of FIG. 27(a);

FIG. 28(a) is a plan view of the substrate of the solid-state imaging device of the fourth embodiment, illustrating the device's portions hidden from the eye in FIG. 27(b) after the opening portion of the interlayer insulation film is formed;

FIG. 28(b) is a cross-sectional view of the substrate of the device of the third embodiment, taken along the line G–G' of FIG. 28(a);

FIG. 29 is a cross-sectional view of the substrate of the device of a fifth embodiment, illustrating a newly provided photoelectric conversion portion in place of the photoelectric conversion portion of the device shown in FIG. 15(b);

FIG. 30(a) is a view similar to FIG. 29 but showing the ion implantation process of the substrate, which is carried out with an ion implantation angle of approximately 7 degrees;

FIG. 30(b) is a view similar to FIG. 29 but showing the ion implantation process of the substrate, which is carried out with an ion implantation angle of approximately 45 degrees;

FIG. 31 is a cross-sectional view of the substrate of the device of a sixth embodiment, illustrating a photoelectric conversion portion which is newly provided in place of the photoelectric conversion portion of the device shown in FIG. 24(b);

FIG. 32 is a view similar to FIG. 31 but showing the ion implantation process of the substrate;

FIG. 33(a) is a plan view the semiconductor substrate of a first conventional solid-state imaging device, illustrating its p-type channel stops, p-type charge readout portion, n-type charge transfer portion and the p-type well thereof;

FIG. 33(b) is a cross-sectional view of the semiconductor substrate of the conventional solid-state imaging device, taken along the line A–A' of FIG. 33(a);

FIG. 34(a) is a plan view the semiconductor substrate of the first conventional solid-state imaging device after the formation of the photoresist film and the n-type well;

FIG. 34(b) is a cross-sectional view of the semiconductor substrate of the conventional solid-state imaging device, taken along the line A–A' of FIG. 34(a);

FIG. 35(a) is a plan view the semiconductor substrate of the first conventional solid-state imaging device after the formation of the charge transfer electrodes and the gate insulation film;

FIG. 35(b) is a cross-sectional view of the semiconductor substrate of the conventional solid-state imaging device, taken along the line A–A' of FIG. 35(a);

FIG. 36(a) is a plan view the semiconductor substrate of the first conventional solid-state imaging device after the formation of the photoelectric conversion portion and the $p^+$-type region;

FIG. 36(b) is a cross-sectional view of the semiconductor substrate of the conventional solid-state imaging device, taken along the line A–A' of FIG. 36(a);

FIG. 37(a) is a plan view the semiconductor substrate of the first conventional solid-state imaging device after the formation of the light shield film and its opening portion;

FIG. 37(b) is a cross-sectional view of the semiconductor substrate of the conventional solid-state imaging device, taken along the line A–A' of FIG. 37(a);

FIG. 38(a) is a plan view the semiconductor substrate of a second conventional solid-state imaging device after the formation of the p-type charge readout portion and the n-type charge transfer portion;

FIG. 38(b) is a cross-sectional view of the semiconductor substrate of the conventional solid-state imaging device, taken along the line B–B' of FIG. 38(a);

FIG. 39(a) is a plan view the semiconductor substrate of the second conventional solid-state imaging device after the formation of the charge transfer electrode and the photoresist film;

FIG. 39(b) is a cross-sectional view of the semiconductor substrate of the conventional solid-state imaging device, taken along the line B–B' of FIG. 39(a);

FIG. 40(a) is a plan view the semiconductor substrate of the second conventional solid-state imaging device after the formation of the n-type well layer and the photoresist film;

FIG. 40(b) is a cross-sectional view of the semiconductor substrate of the conventional solid-state imaging device, taken along the line B–B' of FIG. 40(a);

FIG. 41(a) is a plan view the semiconductor substrate of the second conventional solid-state imaging device after the formation of the photoelectric conversion portion and the charge transfer electrode;

FIG. 41(b) is a cross-sectional view of the semiconductor substrate of the conventional solid-state imaging device, taken along the line B–B' of FIG. 41(a);

FIG. 42(a) is a plan view the semiconductor substrate of the second conventional solid-state imaging device after the formation of the light shield film and its opening portion;

FIG. 42(b) is a cross-sectional view of the semiconductor substrate of the conventional solid-state imaging device, taken along the line B–B' of FIG. 42(a);

FIGS. 43(a) and 43(b) are views each similar to FIG. 39(b), illustrating the disadvantage inherent in the second conventional solid-state imaging device described above; and FIGS. 44(a) and 44(b) are views each similar to FIG. 43(b) after completion of the second etching process, illustrating the disadvantage inherent in the second conventional solid-state imaging device described above.

In the solid-state imaging device of the present invention having the above construction, it is possible to prevent the readout properties of the signal charge from varying, and also prevent the so-called "white damage" from occurring. In addition to the above, it is also possible to decrease the manufacturing time and cost of the device.

DETAILED DESCRIPTION OF THE PREFERRED EMBODIMENTS

Now, the present invention will be described in detail with reference to the accompanying drawings. The description will be made in more concrete manner using embodiments of the present invention.

A: First Embodiment:

FIG. 1 shows a solid-state imaging device of a first embodiment of the present invention.

Figure 2:
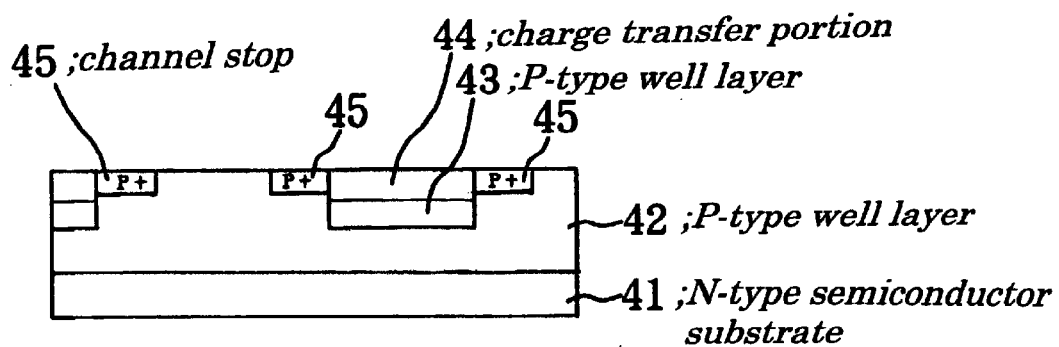
FIG. 2(a) is a cross-sectional view of the n-type semiconductor substrate of the solid-state imaging device, taken along the line C–C' of FIG. 1, illustrating a process step of the manufacturing method of the solid-state imaging device.
FIG. 2(b) is a cross-sectional view of the substrate of the solid-state imaging device, taken along the line D–D' of FIG. 1, illustrating a process step subsequent to the process step shown in FIG. 2(a)
Figure 2:
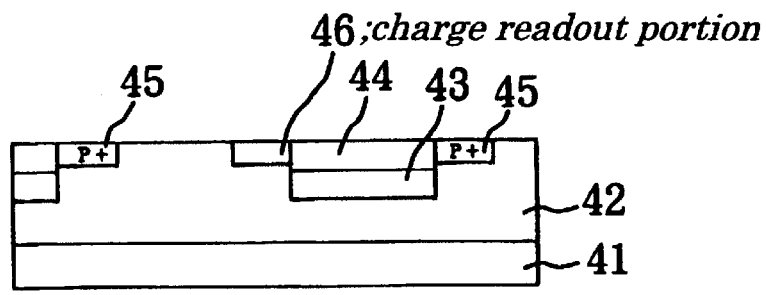
Figure 3:
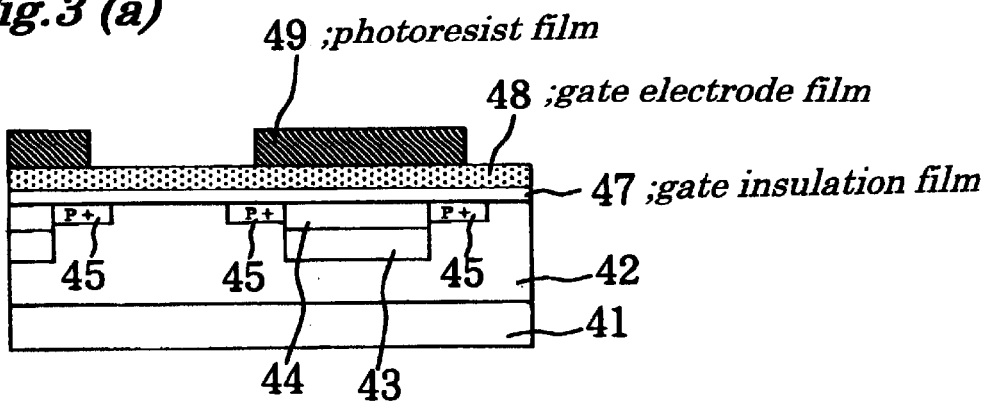
FIG. 3(a) is a cross-sectional view of the substrate of the solid-state imaging device, taken along the line C–C' of FIG. 1, illustrating a process step subsequent to the process step shown in FIG. 2(b)
FIG. 3(b) is a cross-sectional view of the substrate of the solid-state imaging device, taken along the line D–D' of FIG. 1, illustrating a process step subsequent to the process step shown in FIG. 3(a)
Figure 3:
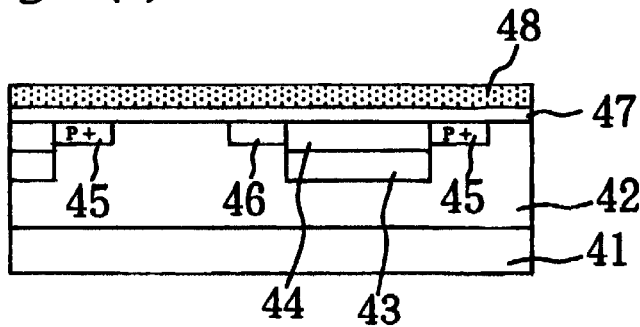
Figure 4:
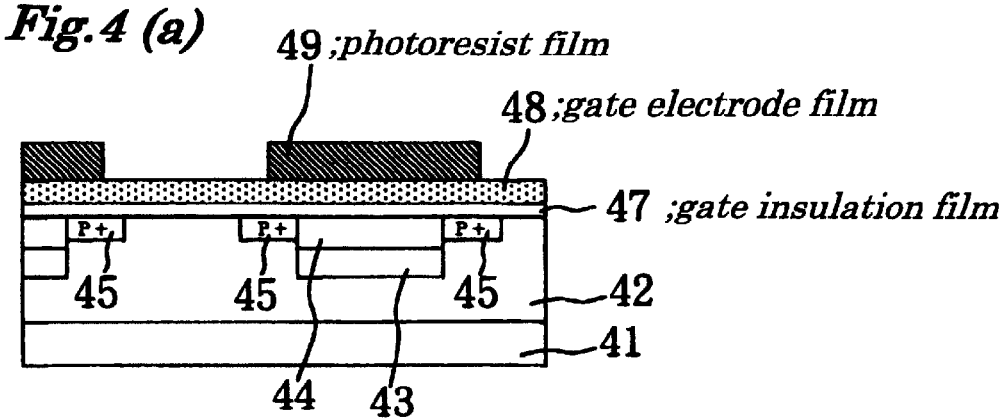
FIG. 4(a) is a cross-sectional view of the substrate of the solid-state imaging device, taken along the line C–C' of FIG. 1, illustrating a process step subsequent to the process step shown in FIG. 3(b)
FIG. 4(b) is a cross-sectional view of the substrate of the solid-state imaging device, taken along the line D–D' of FIG. 1, illustrating a process step subsequent to the process step shown in FIG. 4(a)
Figure 4:
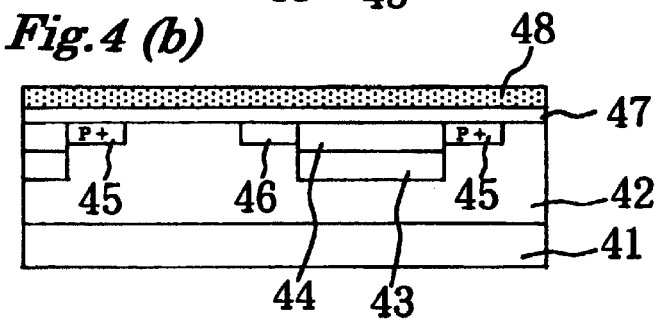
Figure 5:
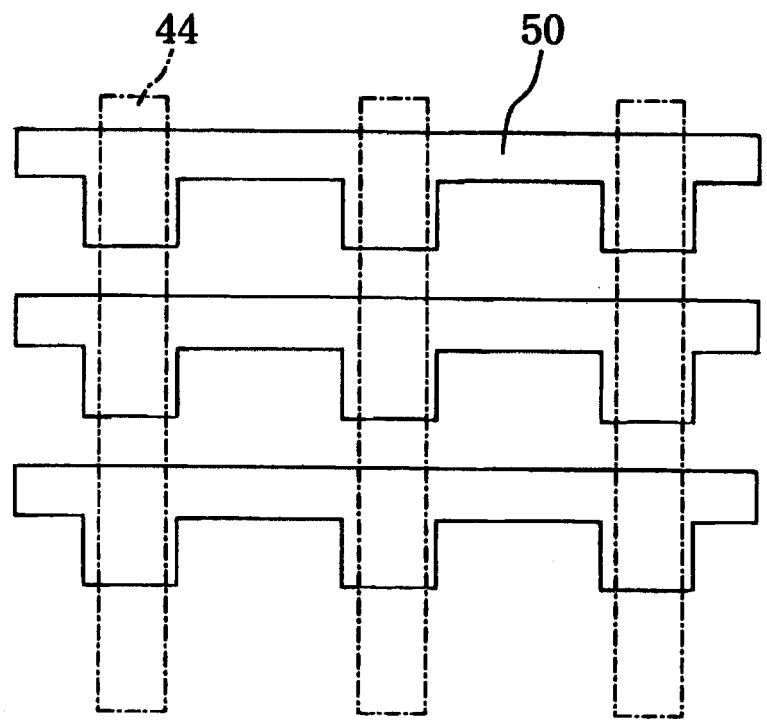
FIG. 5 is a plan view of the n-type semiconductor substrate of the solid-state imaging device having being subjected to the process steps shown in FIGS. 2(a) to 4(b), illustrating in dotted lines the device's portions hidden from the eye.
Figure 6:
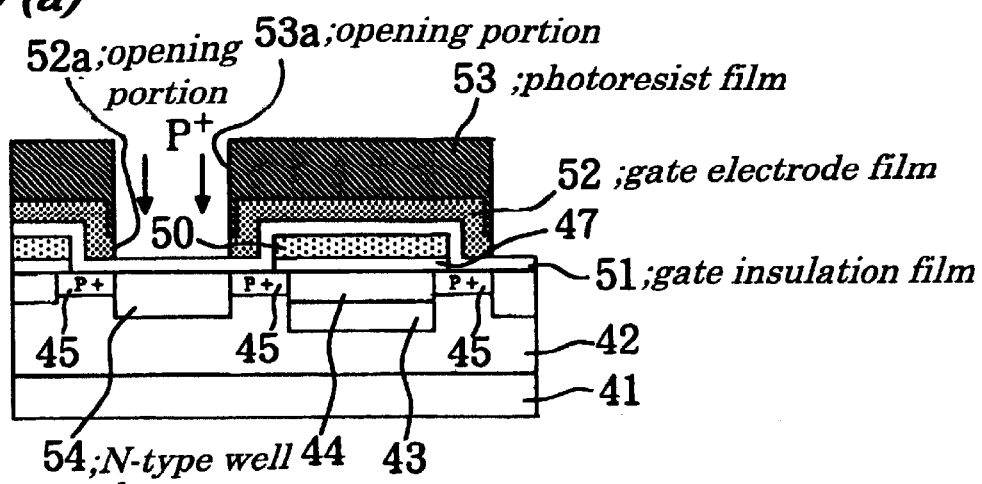
FIG. 6(a) is a cross-sectional view of the substrate of the solid-state imaging device, taken along the line C–C' of FIG. 1, illustrating a process step subsequent to the process step shown in FIG. 4(b)
FIG. 6(b) is a cross-sectional view of the substrate of the solid-state imaging device, taken along the line D–D' of FIG. 1, illustrating a process step subsequent to the process step shown in FIG. 6(a)
Figure 6:
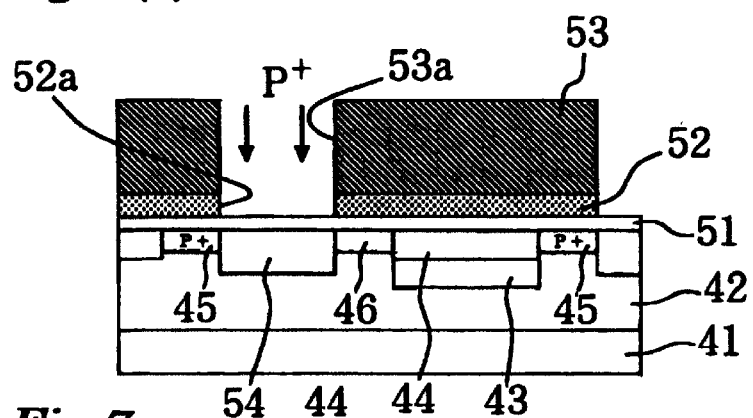
Figure 7:
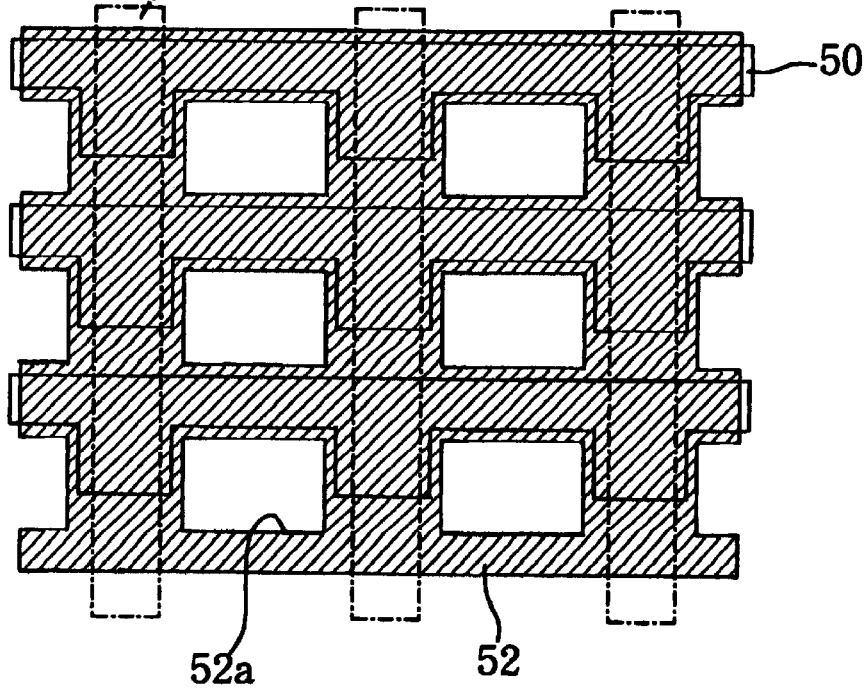
FIG. 7 is a plan view of the n-type semiconductor substrate of the solid-state imaging device having being subjected to the process steps shown in FIG. 6(b), illustrating in dotted lines the device's portions hidden from the eye.
Figure 8:
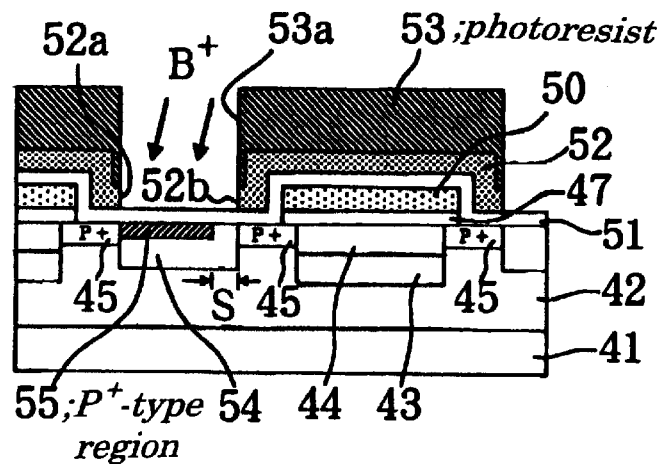
FIG. 8(a) is a cross-sectional view of the substrate of the solid-state imaging device, taken along the line C–C' of FIG. 1, illustrating a process step subsequent to the process step shown in FIG. 6(b)
FIG. 8(b) is a cross-sectional view of the substrate of the solid-state imaging device, taken along the line D–D' of FIG. 1, illustrating a process step subsequent to the process step shown in FIG. 8(a)
Figure 8:
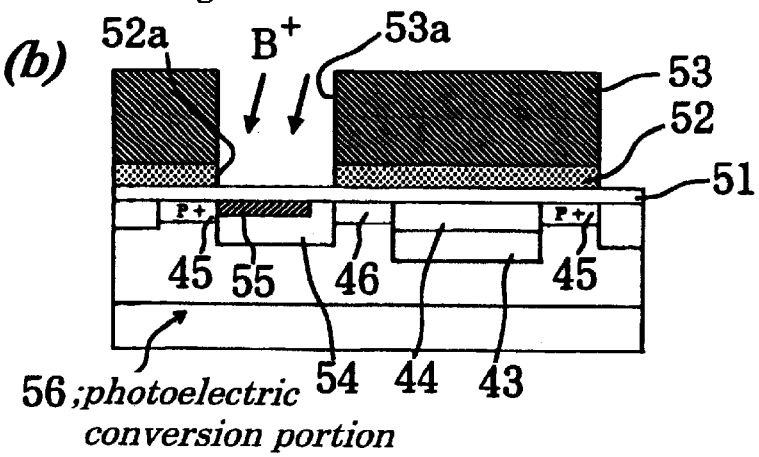

The first embodiment of the solid-state imaging device forms a CCD imaging sensor of an interlaced scanning transmission system. As shown in FIG. 1, the first embodiment of the solid-state imaging device is provided with a plurality of photoelectric conversion portions 56, wherein each of the photoelectric conversion portions 56 converts incident light into signal charge the amount of which charge corresponds to the amount of the incident light. The photoelectric conversion portions 56 described above are so arranged that they form a matrix, i.e., two-dimensional pattern or array constructed of their rows (i.e., horizontal lines) and their columns (i.e., vertical lines) disposed in a surface region of an n-type semiconductor substrate 41 (shown in FIG. 2(a)). A plurality of charge transfer portions 44 each for, transferring the signal charge (which has been retrieved from each of the photoelectric conversion portions 56) in a direction parallel to the length of the column (i.e., vertically, as viewed in FIG. 1) are provided adjacent to the plurality of the photoelectric conversion portions 56 and between adjacent ones of their columns.

The charge transfer electrode 50 is constructed of a polysilicon film, and extends in a direction perpendicular to the length of the charge transfer portion 44 (i.e., horizontally, as viewed in FIG. 1). The charge transfer electrode 50 assumes a comb-like shape which has its teeth or convex portions overlie the charge transfer portions 44. On the other hand, a charge transfer electrode 58 is also constructed of apolysilicon film, and doubles as a charge readout electrode for reading and writing the signal charge from the photoelectric conversion portion 56 to the corresponding one of the charge transfer portions 44. The charge transfer electrode 58 is formed in a layer higher in level than the charge transfer electrode 50. In other words, the charge transfer electrode 58 covers end edge portions of teethed-convex and -concave portions of the comb-shaped portion of the charge transfer electrode 50 oppositely disposed from the charge transfer electrode 58; and, the charge readout portion 46 for reading and writing the signal charge from the photoelectric conversion portion 56 to the corresponding one of the charge transfer portions 44. The charge readout portion 46 is formed between the photoelectric conversion portion 56 and the charge transfer portion 44. The charge transfer electrode 58 is provided with an opening portion 58a over the photoelectric conversion portion 56. Further, the charge transfer electrode 58 has its concave portion formed into a comb's toothed shape which overlies the charge transfer portion 44. Adjacent ones of the photoelectric conversion portions 58 are spaced apart from each other through a separation portion 57 which extends along the length of the above-mentioned column (which extends vertically).

Formed over the charge transfer electrodes 50 and 58 is a light shield film 60 which is made of tungsten, aluminum and like materials. Formed in this light shield film 60 over the photoelectric conversion portion 56 is an opening portion 60a which is smaller in area size than the opening portion 58a of the charge transfer electrode 58.

Next, with reference to FIGS. 2(a) to 11(b), a manufacturing method of the solid-state imaging device will be described in the order in which the process steps are performed.

First, a p-type well layer 42 is formed on the n-type semiconductor substrate 41 by the thermal diffusion process using a p-type impurity such as boron B and like impurities. After that, another p-type well layer 43 is formed in a surface region of the p-type well layer 42 by the thermal diffusion process using the same p-type impurity such as boron B and like impurities. Then, the n-type charge transfer portion 44 is formed by ion-implanting an n-type impurity such as phosphorus ion P and like impurities. Subsequent to the above, as shown in FIGS. 2(a) and 2(b), a $p^+$-type channel stop 45 is formed by ion-implanting the p-type impurity such as boron ion B and like impurities. Further, as shown in FIG. 2(b), the p-type charge readout portion 46 is formed by ion-implanting the p-type impurity such as boron ion B and like impurities in a region, in an upper surface of which region a part of the charge transfer electrode 58 serving as a charge readout electrode will be formed later. The p-type charge readout portion 46 thus formed is oppositely disposed from the channel stop 45 with respect to the charge transfer portion 44 thereof so as to be adjacent to the charge transfer portion 44.

Then, as shown in FIG. 3(a), the entire surface of the substrate is subjected to a thermal oxidation process so that a gate insulation film 47 composed of a thermal oxidation film is formed. After that, a gate electrode film 48 composed of a polysilicon film is formed on the gate insulation film 47 by the LPCVD (Low Pressure Chemical Vapor Deposition) process.

After that, a photoresist film 49 is applied to the entire surface of the substrate, exposed to light and developed so that a process step of patterning the photoresist film 49 is performed, as shown in FIGS. 3(a) and 3(b). At this time, as shown in FIG. 3(b), the photoresist film 49 has its portion not patterned on a surface of the gate electrode film 48 formed on a region, in an upper surface of which region the charge transfer electrode 58 will be formed later.

Subsequent to the above, an unnecessary region of the gate electrode film 48 is removed by a dry etching process such as a plasma etching process and the like using the photoresist film 49 as a mask, so that the charge transfer electrode 50 is formed, as shown FIGS. 4(a) and 4(b). Consequently, as shown FIG. 4(b), the gate electrode 48 formed on the region where the charge transfer electrode 58 will be formed later is entirely removed since the portion of the photoresist film, 49 is not patterned. Here, in FIG. 5, there is shown a plan view of the n-type semiconductor substrate having been subjected to all the above process steps, where portions hidden from the eye are shown in dotted lines. As is clear from FIG. 5, the charge transfer electrode 50 is disposed perpendicular to the charge transfer portion 44, i.e., extends along the. length of row (i.e., extend horizontally), and has its comb-toothlike convex portions overlie the charge transfer portions 44.

Then, the gate insulation film 47 on which the charge transfer electrode 50 is not formed is removed by etching. After that, the entire surface of the substrate is subjected to a thermal oxidation process so that a gate insulation film 51 composed of a thermal oxidation film is formed. At this time, a surface of the charge transfer electrode 50 is oxidized to form a polysilicon oxide film. This polysilicon oxide film thus formed becomes later an interlayer insulation film disposed between the charge transfer electrode 50 and the charge transfer electrode 58 formed on the former electrode 50 later. Then, a gate electrode film 52 composed of a polysilicon film is formed by the LPCVD process. After that, in order to form the charge transfer electrode 58, a photoresist film is applied to the entire surface of the substrate, exposed to light and developed to perform a process step of patterning a photoresist film 53 provided with an opening portion 53a in the region where the photoelectric conversion portion 56 will be formed later. Incidentally, the thus formed photoresist film 53 has a film thickness of approximately 3 $\mu$m in order to prevent phosphorus ion $P^+$ and the like from passing through the photoresist film 53 when the photoelectric conversion portion 56 is formed. Then, the gate electrode film 52 formed in a region corresponding to the above opening portion 53a is removed by a dry etching process such as a plasma etching process and like processes using the photoresist film 53 as a mask, so that an opening portion 52a is formed. After that, as shown in FIGS. 6(a) and 6(b), an n-type well layer 54 constituting the photoelectric conversion portion 56 is formed by ion-implanting an n-type impurity such as phosphorus ion $P^+$ and like impurities in the $P^+$-type well layer 42 by self alignment using both the photoresist film 53 and the gate electrode film 52 as masks. Both the n-type well layer 54 of the photoelectric conversion portion 56 and the $P^+$-type well layer 42 formed thereunder function as a buried-type photodiode. Here, in FIG. 7, there is shown a plan view of the n-type semiconductor substrate having been subjected to all the process steps described above, where portions hidden are shown in dotted lines. As is clear from FIG. 7, formed in a region corresponding to the photoelectric conversion portion 56 of the gate electrode film 52 is the opening portion 52a.

Next, as shown in FIGS. 8(a) and 8(b), by self alignment using both the photoresist film 53 and the gate electrode film 52 as masks, the photoelectric conversion portion 56 is formed by ion-implanting a p-type impurity such as boron ion $B^+$ and like impurities in a shallow surface region of the n-type well layer 54 at an implantation angle of approximately 7 degrees from the vertical, so that a $P^+$-type region 55 for suppressing the dark current is formed, which dark current is produced in a surface of the photoelectric conversion portion 56 to make the S/N ratio at low light intensity poor. Incidentally, this $P^+$-type region 55 may be formed after the charge transfer electrode 58 is formed. Further, an offset amount S of the, $P^+$-type region 55 from an edge portion 52b of the gate electrode film 52 is approximately 0.4 $\mu$m.

Figure 9:
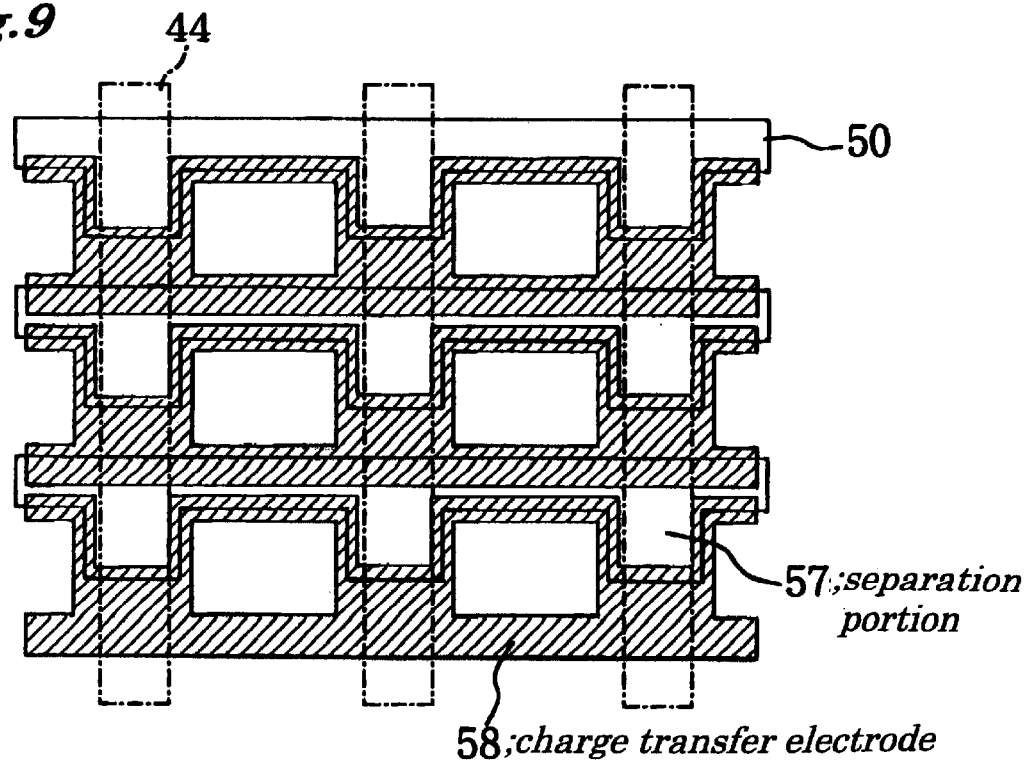
FIG. 9 is a plan view of the n-type semiconductor substrate of the solid-state imaging device having being subjected to the process steps shown in FIG. 8(b), illustrating in dotted lines the device's portions hidden from the eye.

Next, the photoresist film 53 is removed. After that, in order to form a separation portion 57 for dividing the gate electrode film 52 along the length of the column (i.e., vertically), a photoresist film is applied to the entire surface of the substrate, exposed to light and developed to perform a process step of patterning the photoresist film (not shown). Then, as shown in FIG. 9, the separation portion 57 for dividing the gate electrode film 52 along the length of the column (i.e., vertically) is formed by a dry etching process such as a plasma etching process and like processes using this photoresist film as a mask, so that the charge transfer electrode 58 is formed, as shown in FIGS. 10(a) and 10(b), whereby the opening portion 52a of the gate electrode film 52 becomes the opening portion 58a of the charge transfer electrode 58.

Next, an interlayer insulation film 59 is formed over the entire surface of the substrate. After that, as shown in FIGS. 11(a) and 11(b), the light shield film 60 for cutting off the light is made of tungsten, aluminum and like materials, and formed on the interlayer insulation film 59. The light shield film 60 thus formed has its portion formed on the photoelectric conversion portion 56 and removed the same portion to form the opening portion 60a. Using the process steps described above, the solid-state imaging. device shown in FIG. 1 is completed.

As described above, in the solid-state imaging device of the present invention having the above construction, after the opening portion 58a of the charge transfer electrode 58 (more specifically, the opening portion 52a of the gate electrode film 52) is formed, the n-type well layer 54 and the p⁺-type region 55 both forming the photoelectric conversion portion 56 are formed by self alignment using both the photoresist film 53 and the gate electrode film 52 as masks. Consequently, it is possible for the device of the present invention to suppress variations in readout voltage caused by misalignment occurring between the photoelectric conversion portion 56 and the charge transfer electrode 58 which doubles as a charge readout electrode. Further, in the device of the present invention, since the photoresist film 53 has its film thickness be equal to approximately 3 μm to prevent the phosphorus ion P⁺ from passing therethrough when the photoelectric conversion portion 56 is formed, there is no fear that: a region, in which the ion implantation process should not be performed as is in, for example, the charge transfer portion 44 and the charge readout portion 46, is subjected to an ion implantation process. Consequently, it is possible for the charge transfer portion 44 to have its charge transfer characteristics be excellent. Further, by controlling an ion implantation angle when the P⁺-type region 55 forming the photoelectric conversion portion 56 is formed, it is possible to precisely define the relationship in location between the photoelectric conversion portion 56 and the charge transfer electrode 58 which doubles as a charge readout electrode, which has the charge readout. characteristics of the device stabilized.

Incidentally, in the first embodiment described in the above, as shown in FIGS. 8(a) and 8(b) by self alignment using both the photoresist film 53 and the gate electrode film 52 as masks, the photoelectric conversion portion 56 is formed by ion-implanting a p-type impurity such as boron ion B⁺ and like impurities in a shallow surface region of the n-type well layer 54 at an ion implantation angle of approximately 7 degrees from the vertical, so that a P⁺-type region 55 is formed. In this case, since the photoresist film 53 attains a thickness of approximately 3 μm, it is impossible to precisely control the offset amount S of the P⁺-type region 55 relative to the edge portion 52b of the gate electrode film 52. Due to variations in this offset amount S, a depletion layer near the edge portion 52b varies in extension. This often causes the charge readout characteristics of the device to vary.

In view of the above, as shown in FIG. 12, after the photoresist film 53 is removed, the P⁺-type region 55 is formed. In the device having the above construction, since the mask for forming the P⁺-type region 55 is composed of the gate electrode film 52 only, it is possible to precisely control the offset amount S from the edge portion 52b of the gate electrode film 52 when the p-type impurity such as boron ion B⁺ and like impurities is implanted at an oblique implantation angle (see FIG. 12). Consequently, it is possible for the device of the present invention to have its charge readout characteristics stabilized.

B: Second Embodiment:

Now, the second embodiment of the solid-state imaging device will be described. FIG. 13 shows a plan view of the second embodiment of the solid-state imaging device, wherein portions hidden from the eye are shown in dotted lines. FIGS. 14(a) and 14(b) show plan views of the second embodiment of the solid-state imaging device, illustrating the process steps of a manufacturing method of the solid-state imaging device, wherein portions hidden from the eye are shown in dotted lines.

The solid-state imaging device of this second embodiment is of a CCD imaging sensor of an interlaced scanning transfer system. As shown in FIG. 13, the device is provided with a plurality of photoelectric conversion portions 61 arrange in a matrix composed of a plurality of horizontal rows and a plurality of vertical columns within a surface region of the n-type semiconductor substrate. Each of a plurality of charge transfer portions 62 for reading and transferring the signal charge from each of the photoelectric conversion portions 61 to each region in a direction along the length of each of the columns is formed adjacent to each of the plurality of the photoelectric conversion portions 61 so as to be interposed between adjacent ones of these columns.

A charge transfer electrode 63 is formed of a polysilicon film, and has its longitudinal axis be perpendicular to the charge transfer portion 62, i.e., has its longitudinal axis extend along the length of the row (i.e., extend horizontally) The thus formed charge transfer electrode 63 has its convex portions formed into comb-toothlike shapes overlying the charge transfer portions 62. On the other hand, a charge transfer electrode 64 is formed of a polysilicon film in the same layer as that of the charge transfer electrode 63, and has its longitudinal axis be parallel to each of the rows (i.e., extend horizontally). The thus formed charge transfer electrode 64 has its concave portions formed into comb-toothlike shapes overlying the charge transfer portions 62. This charge transfer electrode 64 doubles as a charge readout electrode for reading and writing the signal charge from the photoelectric conversion portion 61 (in which the signal charge is generated) to the charge transfer portion 62, and is provided with an opening portion 64a over the photoelectric conversion portion 61. Further, the charge transfer electrode 64 covers a charge readout portion (not shown) which is formed between the photoelectric conversion portion 61 and the charge transfer portion 62 to read and write the signal charge from the. photoelectric conversion portion 61 to the charge transfer portion 62. In addition, the charge transfer electrode 64 is oppositely disposed from end portions of comb-toothlike convex and concave portions of the corresponding one of the charge transfer electrodes 63 through a separation portion 65, and is also spaced apart from another one of the charge transfer electrodes 63 through a separation portion 66, wherein the another one of the charge transfer electrodes 63 is disposed in back-to-back relationship with this charge transfer electrode 64.

Further, formed on upper surfaces of the charge transfer electrodes 63 and 64 is a light shield film 67 made of tungsten, aluminum and like materials for cutting off the light. Formed in this light shield film 67 over the photoelectric conversion portion 61 is an opening portion 67a smaller in area size than the opening portion 64a of the charge transfer electrode 64.

Now, with reference to FIGS. 14(a) and 14(b), a manufacturing method of the solid-state imaging device of the second embodiment of the present invention will be described in the order of its process steps.

First, as is in the first embodiment, the p-type well layer is formed on the n-type semiconductor substrate by a thermal diffusion process. Formed on a part of a surface region of the thus formed p-type well layer is a p-type well layer. After that, subsequently formed in the following order of mention by using an ion implantation process are: the n-type charge transfer portion 62; the p-type channel stop; and, the p-type charge readout portion.

Next, the entire surface of the substrate is subjected to a thermal oxidation process to produce a gate insulation film formed of a thermal oxidation film. After that, the gate electrode film 68 formed of a polysilicon film is formed on this gate insulation film by the LPCVD process. Then, a photoresist film is applied to the entire surface of the substrate, exposed to light and developed to perform the patterning process of the photoresist film provided with an opening portion over a region in which the photoelectric conversion portion 61 will be formed later.

Subsequent to the above, by a dry etching process such as a plasma etching process and the like using the above photoresist film as a mask, the gate electrode film 68 disposed on the region corresponding to the above opening portion is removed so that an opening portion 68a is formed. Then, using both the photoresist film and the gate electrode film 68 as masks, i.e., by self alignment using the gate electrode film 68 as a mask, an n-type well layer (not shown) is formed by an ion implantation process. By ion-implanting an n-type impurity such as phosphorus ion P$^+$ and the like in the thus formed n-type well layer (not shown), the photoelectric conversion portion 61 is formed. In this connection, as shown in FIG. 14(a), by ion-implanting a p-type impurity such as a boron ion B$^+$ and the like in the n-type semiconductor substrate, more particularly, in a shallow surface region of the n-type well region at an implantation angle of approximately 7 degrees from the vertical, a P$^+$-type region (not shown) for suppressing the dark current, which occurs in the surface of the photoelectric conversion portion 61 at a low intensity of light to impair the S/N ratio of the device, is formed. The n-type well layer of the photoelectric conversion portion 61 and the p-type well layer formed thereunder function as a buried-type photodiode.

Then, after the photoresist film is removed, in order to form the separation portions 65 and 66, the photoresist film is applied to the entire surface of the substrate, exposed to light and developed to perform the patterning process of the photoresist film (not shown). Then, as shown in FIG. 14(b), the separation portions 65 and 66 through which the gate electrode film 68 are vertically divided along the length of the column are formed by a dry etching process such as a plasma etching process and the like using the above photoresist film as a mask, so that the charge transfer electrodes 63 and 64a are formed, whereby the opening portion 68a of the gate electrode film 68 becomes the opening portion 64a of the charge transfer electrode 64.

Next, an interlayer insulation film is formed over the entire surface of the substrate. After that, the light shield film 67 is formed on the interlayer insulation film. Then, a part of the light shield film 67, which part overlies the photoelectric conversion portion 61, is removed to form the opening portion 67a.

By the manufacturing method described above, the solid-state imaging device shown in FIG. 13 is produced.

As described above, in the construction of the above embodiment, since the charge transfer electrodes 63 and 64 are formed by etching the gate electrode film 68 formed of a single layer, the charge transfer electrode 63 does not overlie the charge transfer electrode 64. Consequently, this second embodiment is smaller in interlayer capacity than the first embodiment, and, therefore advantageous in that it is free from the insulation problem between the electrodes.

C: Third Embodiment:

Next, A third embodiment of the present invention will be described. FIGS. 15(a) and 15(b) show in construction the essential parts of a solid-state imaging device of the third embodiment of the present invention.

The solid-state imaging device of this third embodiment is of a CCD imaging sensor of an interlaced scanning transfer system. Though not shown in the drawings, as is in the first and the second embodiment, the solid-state imaging device of the third embodiment is provided with a plurality of photoelectric conversion portions 78 arrange in a matrix composed of a plurality of horizontal rows and a plurality of vertical columns within a surface region of the n-type semiconductor substrate 71. Each of a plurality of charge transfer portions 74 for reading and transferring the signal charge from each of the photoelectric conversion portions 78 to each region in a direction along the length of each of the columns is formed adjacent to each of the plurality of the photoelectric conversion portions 78 so as to be interposed between adjacent ones of the columns. Consequently, as shown in FIGS. 15(a) and 15(b), a unit pixel is constructed of one piece of the photoelectric conversion portion 78 and one piece of the charge transfer portion 74, and has an area size of 5×5 μm.

In the solid-state imaging device of the third embodiment, a p-type well layer 72 is formed on the n-type semiconductor substrate 71. Formed in a surface region of the p-type well layer 72 are: a P$^+$-type channel stop 73; the n-type charge transfer portion 74; a p-type charge readout portion 75; and, an n-type well layer 76. Formed in a surface region of the n-type well layer 76 is a P$^+$-type region 77. The n-type well layer 76 and the P$^+$-type region 77 form a photoelectric conversion portion 78. The n-type well layer 76 of the photoelectric conversion portion 78 and the p-type well layer 72 formed thereunder function as a buried-type photodiode.

Charge transfer electrodes 80 and 81 are formed through the gate insulation film 79 on surfaces of: the channel stop 73; the charge transfer portion 74; the charge readout portion 75; and, the P$^+$-type region 77. Also formed on these surfaces through an interlayer insulation film 82 is a light shield film 83, which is provided with an opening portion 83a and formed on the photoelectric conversion portion 78. Of regions corresponding to the periphery of the photoelectric conversion portion 78 and located above the charge transfer portion 74 adjacent to the photoelectric conversion portion 78, one parallel to the photoelectric conversion portion 78 and substantially equal in longitudinal dimension to the photoelectric conversion portion 78 is used to form the charge transfer electrode 81 which doubles as a charge readout electrode for reading and writing the signal charge from the photoelectric conversion portion 78 to the charge transfer portion 74. Incidentally, both the light shield film 83 and its opening portion 83a are not shown in FIG. 15(a).

Now, with reference to FIGS. 16(a) and 19(b), a manufacturing method of the solid-state imaging device of the third embodiment of the present invention will be described in the order of its process steps.

First, the p-type well layer 72 which has a p-type impurity concentration of from $10^{14}$ to $10^{16}$ atoms/cm$^3$ (for example, a boron concentration of $10^{15}$ atoms/cm$^3$) and has a depth of, for example, 3 μm is formed by ion-implanting a p-type impurity such as boron ion B$^+$ and like impurities in the n-type semiconductor substrate having a phosphorus concentration of from $10^{13}$ to $10^{15}$ atoms/cm$^3$ (for example, $10^{15}$ atoms/cm$^3$). After that, as shown in FIGS. 16(a) and 16(b), formed by ion-implanting a p-type impurity such as boron ion B$^+$ and like impurities and an n-type impurity such as phosphorus ion P$^+$ and like impurities in a surface region of the p-type well layer 72 are: the P$^+$-type channel stop 73 having a p-type impurity concentration of from $10^{17}$ to $10^{19}$ atoms/cm$^3$ (for example, a boron concentration of $10^{18}$ atoms/cm$^3$) and having a depth of, for example, 0.3 μm; the n-type charge transfer portion 74 having an n-type impurity concentration of from $10^{16}$ to $10^{18}$ atoms/cm$^3$ (for example, a phosphorus concentration of $10^{17}$ atoms/cm$^3$) and having a depth of, for example, 0.5 μm; and, the p-type charge readout portion 75 having a p-type impurity concentration of from $10^{15}$ to $10^{17}$ atoms/cm$^3$ (for example, a boron concentration of $10^{16}$ atoms/cm$^3$) and having a depth of, for example, 0.5 μm.

Next, a gate insulation film 79 having a film thickness of from 100 to 1000 angstroms and formed of a thermal oxidation film, oxide film, nitride film, oxide (ONO) film, or the like is formed over the entire surface of the substrate. In this third embodiment, an oxide (ONO) film having a film thickness of 800 angstroms is formed to serve as the gate insulation film 79. Formed on this gate insulation film 79 is a gate electrode film (not shown) formed of a polysilicon film, which has a film thickness of from 500 to 5000 angstroms (for example, 4000 angstroms) and is lowered in sheet resistance up to 30 Ω/□ by introducing phosphorus P therein. Subsequent to the above, unnecessary regions of the gate electrode film are removed by a plasma etching process using an anisotropic etching gas containing hydrogen bromide HBr, as its etching gas, so that a charge transfer electrode 80 is formed.

Further, an interlayer insulation film 84, which is formed of a thermal oxidation film, CVD oxidation film, or the like and has a film thickness of from 500 to 5000 angstroms, is formed on the charge transfer electrode 80. In this third embodiment, the charge transfer electrode 80 has its surface subjected to a thermal oxidation treatment to produce an interlayer insulation film 84 formed of a thermal oxidation film having a film thickness of 2000 angstroms. After that, a gate electrode film 85, which is formed of a polysilicon film and the like and has a film thickness of from 500 to 5000 angstroms (for example, 3000 angstroms), is formed on both the interlayer insulation film 84 and the gate insulation film 79. Then, a photoresist film 86, which is provided with an opening portion 86a in a region corresponding to a region in which the photoelectric conversion portion 78 will be formed later, is formed.

Subsequent to the above, as shown in FIGS. 17(a) and 18(a), the gate electrode film 85 formed on the region in which the photoelectric conversion portion 78 will be formed later is removed by a plasma etching process using: the photoresist film 86 as a mask; and, an anisotropic etching gas containing hydrogen bromide HBr, as its etching gas, so that an opening portion 86a having a width of 2 μm and a length of 3 μm is formed. In this first etching operation, in order to assure that no etching residue remains in a portion which will be formed into a side wall of the charge transfer electrode 81 later, it is necessary to completely remove the gate electrode film 85 formed over the region in which the photoelectric conversion portion 78 will be formed later. Consequently, the etching process is performed in a manner such that a polysilicon film having a film thickness of 4500 angstroms which is 1.5 times as much as the actual film thickness (i.e., 3000 angstroms) of the polysilicon film forming the gate electrode film 85 is removed by etching. In this case, an over-etched amount of the gate electrode film 85 reaches in depth 1500 (i.e., 4500−3000=1500) angstroms. Consequently, when a selective ratio of a polysilicon film to an oxide film is equal to a ratio of 10 to 1 in plasma-etching the polysilicon film, the gate insulation film 79 formed under the opening portion 85a is etched away up to a depth of 150 angstroms. Consequently, as is clear from FIG. 17(b), the remaining film thickness of the gate insulation film 79 after completion of the etching process is equal to 650 (i.e., 800−150=650) angstroms, which prevents a surface of the substrate from being damaged.

Next, the photoelectric conversion portion 78 is formed by ion-implanting an n-type impurity such as phosphorus ion P$^+$ and like impurities at an acceleration energy of equal to or more than 200 KeV (for example, equal to or more than 300 KeV), using both the photoresist film 86 and the gate electrode film 85 as masks, wherein the n-type well layer 76 having an n-type impurity concentration of from $10^{16}$ to $10^{18}$ atoms/cm$^3$ (for example, a phosphorus concentration of $10^{17}$ atoms/cm$^3$) and having a depth of, for example, 1.5 μm is formed by self alignment using an edge portion 85b of the gate electrode film 85 as a mask. Further, as shown in FIGS. 18(a) and 18(b), the photoelectric conversion portion 78 is formed by ion-implanting a p-type impurity such as boron ion B$^+$ and like impurities at an acceleration energy of from approximately 10 to approximately 100 KeV, using both the photoresist film 86 and the gate electrode film 85 as masks, wherein the P$^+$-type region 77 having a p-type impurity concentration of from $10^{17}$ to $10^{19}$ atoms/cm$^3$ is formed by self alignment using the edge portion 85b of the gate electrode film 85 as a mask. In forming this P$^+$-type region 77, as described above, the p-type impurity may be ion-implanted in a condition in which the photoresist film 86 still remains. Alternatively, it is also possible to perform the ion implantation process using only the gate electrode film 85 as a mask after the photoresist film 86 is removed. In this embodiment, after the photoresist film 86 is removed, by the boron B$^+$ ion implantation process using only the gate electrode film 85 as a mask, the P$^+$-type region 77 having a boron B concentration of $10^{18}$ atoms/cm$^3$ and having a depth of, for example, 0.3 μm is formed by self alignment using the edge portion 85b of the gate electrode film 85 as a mask.

Next, when the photoresist film 86 is not removed in forming the P$^+$-type region 77, such photoresist film 86 is first removed. After that, a photoresist film 87 is formed to cover: a region located above the photoelectric conversion portion 78; the periphery of this portion 78; and, a part of a region located above the gate electrode film 85 formed above the charge transfer portion 74 adjacent to the photoelectric conversion portion 78, wherein the above part is parallel to the photoelectric conversion portion 78 and has substantially the same longitudinal dimension as that of the photoelectric conversion portion 78.

Then, as shown in FIGS. 19(a) and 19(b), a charge transfer electrode 81 having an electrode length of 2.5 μm is formed by removing unnecessary regions of the gate electrode film 85 by a plasma etching process using: an isotropic etching gas containing sulfur hexafluoride $SF_6$ as an etching gas; and, the photoresist film 87 as a mask. As a result, the opening portion 85a of the gate electrode film 85 becomes an opening portion 81a of the charge transfer electrode 81. In this second etching process, in order to prevent the etching residue from being produced in stepped portions of the substrate, it is necessary to completely remove the gate electrode film 85 which is located in the unit pixel and further in the periphery of the chip. Consequently, the etching process is performed in a manner such that a polysilicon film having a film thickness of 9000 angstroms which is three times as much as the actual film thickness (i.e., 3000 angstroms) of the polysilicon film forming the gate electrode film 85 is removed by etching. In this case, an over-etched amount of the gate electrode film 85 is equal to 6000 (i.e., 9000−3000=6000) angstroms. Consequently, when the selective ratio of a polysilicon film and an oxide film is equal to a ratio of 10 to 1 (i.e., 10:1), the interlayer insulation film 84 formed under the gate electrode film 85 being etched is etched away by the amount in film thickness of 600 angstroms. Due to this, as is clear from FIGS. 20(a) and 20(b), the remaining film thickness of the interlayer insulation film 84 is equal to 1400 (i.e., 2000−400=1400) angstroms, which prevents the charge transfer electrode 80 from being damaged. Further, at this time, since the photoelectric conversion portion 78 is completely covered with the photoresist film 87, there is no fear that a boundary area between the photoelectric conversion portion 78 and the gate insulation film 79 is damaged, in contrast with the conventional device.

Then, after the photoresist film 87 is removed, as shown in FIG. 21(b), the interlayer insulation film 82, which is composed of a thermal oxidation film, CVD oxidation film, or the like and has a film thickness of from 500 to 5000 angstroms, is formed. In this embodiment, as the interlayer insulation film 82, a CVD film having a film thickness of 2000 angstroms is formed. Subsequent to this, a light shield film 83 made of tungsten, aluminum and the like and having a film thickness of from 500 to 5000 angstroms is formed on the interlayer insulation film 82. After that, as shown in FIGS. 21(a) and 21(b), a part of the light shield film 83 formed on the photoelectric conversion portion 78 is removed to form the opening portion 83a which has a width of 0.7 μm and a length of 2.2 μm. In this embodiment, as the light shield film 83, a tungsten film having a film thickness of 3000 angstroms is formed.

The solid-state imaging device shown in FIGS. 15(a) and 15(b) is completed by the manufacturing method described above.

As described above, in the present invention having the above construction, even when both the first and the second etching processes are performed, provided that: the first etching process is performed to form the opening portion 85a by removing the gate electrode film 85 formed over the region where the photoelectric conversion portion 78 will be formed later; and, the second etching process is subsequently performed to form the charge transfer electrode 81 by removing the unnecessary regions of the gate electrode film 85, the gate insulation film 79 formed over the region where the photoelectric conversion portion 78 will be formed later is still not etched. Due to this, in the device of the present invention, there is no fear that the surface of the photoelectric conversion portion 78 is damaged by etching. Consequently, it is possible for the present invention to prevent the dark current from increasing in the photoelectric conversion portion 78, and also possible to prevent the so-called "white damage" caused by crystal defects from occurring. Due to this, in the present invention, it is possible to not only improve the solid-state imaging device in its characteristics, but also increase the device in its yield in production, which reduces the manufacturing cost of the device.

Further, in the present invention having the above construction, since it is possible to form by the same photoresist process the n-type well layer 76 and the $P^+$-type region 77 both of which form the photoelectric conversion portion 78, it is possible to form the n-type well layer 76, $P^+$-type region 77 and the charge transfer electrode 81 by only performing the photoresist process twice. Consequently, in comparison with the prior art, it is possible for the present invention to reduce the number of the photoresist processes by one, which makes it possible to reduce the manufacturing time and the manufacturing cost of the device.

Further, in the present invention having the above construction, as shown in FIG. 17(a), the gate electrode film 85 is so formed as to cover the side wall 80a of the charge transfer electrode 80. Consequently, as shown in FIG. 17(b), it is possible to precisely remove, by the first one of the etching processes, the gate electrode film 85 formed over the region where the photoelectric conversion portion 78 will be formed later. Due to this, it is possible to precisely form the pattern as defined by the mask, which realizes a high-accuracy size control.

Further, in the present invention having the above construction, as for the configuration of the charge transfer electrode 81, by reducing a clearance in width between the opening portion 81a and the region which is removed by the second etching process, it is possible to reduce the charge transfer electrode 81 in its electrode wiring width regardless of a minimum design size of the photoresist film 87, wherein the charge transfer electrode 81 is formed over the region 88 (i.e., transition portion shown in FIG. 15(a)), which 88 is formed between adjacent ones of the photoelectric conversion portions 78 along the length of the column (i.e., the ones being adjacent to each other in the vertical direction). Due to this, the present invention is capable of expanding the freedom of design in pattern. Further, as for the configuration of the charge transfer electrode 81, even when some misalignment occurs between the opening portion 81a of the electrode 81 and the region which is removed by the second etching process, it is possible to stabilize in level the sheet resistance of the charge transfer electrode 81 since the total wiring width of the charge transfer electrode 81 in the transition portion 88 is constant.

Further, in the present invention having the above construction, in forming the n-type well layer 76 forming the photoelectric conversion portion 78, it is possible to perform an ion implantation process at an acceleration energy of equal to or more than 200 KeV since the n-type impurity such as phosphorus ion $P^+$ and like impurities is ion-implanted using the photoresist film 86 as a mask to form the opening portion 81a (which corresponds to the opening portion 85a shown in FIGS. 18(a) and 18(b)). Consequently, in the present invention, it is possible to form the n-type well layer 76 forming the photoelectric conversion portion 78, wherein the n-type well layer 76 is formed in the p-type well layer 72 so as to reach a deeper region of the layer 72. As a result, it is possible for the present invention to improve the photoelectric conversion portion 78 in sensitivity, and also possible to suppress variations in the readout characteristics of the signal charge.

Further, in the present invention having the above construction, since it is possible to form the n-type well layer 76 and the P⁺-type region 77 both forming the photoelectric conversion portion 78 by self alignment using the edge portion 81b of the charge transfer electrode 81 (which corresponds to the edge portion 85b of the gate electrode film 85) as a mask, it is possible to suppress the variations in readout voltage of the signal charge caused by the misalignment. In addition to this, as is in the first conventional example, in the present invention, there is no need of extending the edge portion 81b of the charge transfer electrode 81 so as to overlie the photoelectric conversion portion 78. Consequently, it is possible for the present invention to increase in area size the opening portion 87a of the light shield film 83, which prevents the incident light from being reflected by the light shield film 83 to improve the photoelectric conversion portion 78 in sensitivity.

Incidentally, in the third embodiment of the present invention, in order to enhance the readout efficiency of the signal charge from the photoelectric conversion portion 78 to the charge transfer portion 74, the charge readout portion 75 is formed in the substantially central portion located between the photoelectric conversion portion 78 and the charge transfer portion 74, as shown in FIG. 16(a). However, the present invention is not limited to this construction. In other words, as shown in FIG. 22(a), it is also possible to form the charge readout portion 75 between the photoelectric conversion portion 78 and the charge transfer portion 74 so as to have the charge readout portion 75 be adjacent to a lower end of the photoelectric conversion portion 78. Alternatively, it is also possible to have such charge readout portion 75 be adjacent to an upper end of the photoelectric conversion portion 78. In this case, since the charge readout portion 75 is changed in location, it is necessary to change in configuration both the charge transfer electrodes 80 and 81.

Further, in the third embodiment of the present invention, the charge transfer electrode 81 doubles as a charge readout electrode 81. However, the present invention is not limited to this embodiment. In other words, as shown in FIG. 22(b), it is also possible for the charge transfer electrode 80 to doubles as a charge readout electrode. Further, in this third embodiment, the charge transfer electrode is constructed of a pair of layers, i.e., of the charge transfer electrodes 80 and 81. However, the present invention is not limited to this construction. In other words, it is possible to form the charge transfer electrode with a single layer. Alternatively, in the present invention, as shown in FIG. 23(a), the charge transfer electrode may be constructed of three or more layers such as the charge transfer electrodes 80, 81 and 89. Still further, in the third embodiment of the present invention, the solid-stage imaging device is described as a CCD imaging sensor of an interlaced scanning transmission system. However, the present invention is not limited to this construction. In other words, in the present invention, as shown in FIG. 23(b), it is also possible to form the solid-state imaging device as a CCD sensor of a progressive scanning transmission system. In this case, particularly, in case that the solid-state imaging device is of a progressive scanning transmission system of a four-phase drive type, as shown in FIGS. 18(a) and 18(b), it suffices to form the opening portion 85a of the gate electrode film 85 when the charge transfer electrode 81 is formed.

D: Fourth Embodiment:

Now, a fourth embodiment of the present invention will be described. FIGS. 24(a) and 24(b) show essential parts of the solid-state imaging device according to the fourth embodiment of the present invention.

The solid-state imaging device of this fourth embodiment is a CCD imaging sensor of an interlaced scanning transmission system. Although not shown, as is in the first to the third embodiment, the device is provided with a plurality of photoelectric conversion portions 99 arrange in a matrix composed of a plurality of horizontal rows and a plurality of vertical columns within a surface region of the n-type semiconductor substrate 91. Each of a plurality of charge transfer portions 94 for reading and transferring the signal charge from each of the photoelectric conversion portions 99 to each region in a direction along the length of each of the columns is formed adjacent to each of the plurality of the photoelectric conversion portions 99 so as to be interposed between adjacent ones of the columns. Consequently, as shown in FIGS. 24(a) and 24(b), in the present invention, a unit pixel is constructed of one piece of the photoelectric conversion portion 99 and one piece of the charge transfer portion 94, and has an area size of 5×5 $\mu$m.

In the solid-state imaging device of the fourth embodiment, a p-type well layer 92 is formed on the n-type semiconductor substrate 91. Formed in a surface region of the p-type well layer 92 are: a P⁺-type channel stop 93; the n-type charge transfer portion 94; a p-type charge readout portion 95; and, a deep n-type well layer 96. Formed in a surface region of the n-type well layer 96 are: a shallow n-type region 97; and, a P⁺-type region 98. The n-type regions 96, 97 and the P⁺-type region 98 are formed into a photoelectric conversion portion 99. Then-type region 96 of the photoelectric conversion portion 99 and the p-type well layer 92 formed thereunder function as a buried-type photodiode.

Charge transfer electrodes 101 and 102 are formed through a gate insulation film 100 on surfaces of: the channel stop 93; the charge transfer portion 94; the charge readout portion 95; and, the P⁺-type region 98. Also formed on these surfaces through an interlayer insulation film 103 is a light shield film 104, which is provided with an opening portion 104a and formed over the photoelectric conversion portion 99. Of regions corresponding to the periphery of the photoelectric conversion portion 99 and located above the charge transfer portion 94 adjacent to the photoelectric conversion portion 99, one parallel to the photoelectric conversion portion 99 and substantially equal in longitudinal dimension to the photoelectric conversion portion 99 is used to form the charge transfer electrode 102 which doubles as a charge readout electrode for reading and writing the signal charge from the photoelectric conversion portion 99 to the charge transfer portion 94. Incidentally, both the light shield film 104 and its opening portion 104a are not shown in FIG. 24(a).

Now, with reference to FIGS. 25(a) and 28(b), a manufacturing method of the solid-state imaging device of the fourth embodiment of the present invention will be described in the order of its process steps.

First, the p-type well layer 92 which has a p-type impurity concentration of from $10^{13}$ to $10^{15}$ atoms/cm³ (for example, a boron concentration of $10^{15}$ atoms/cm³) and has a depth of, for example, 3 $\mu$m is formed by ion-implanting a p-type impurity such as boron ion B⁺ and like impurities in the n-type semiconductor substrate 91 having a phosphorus concentration of from $10^{13}$ to $10^{15}$ atoms/cm³ (for example, $10^{14}$ atoms/cm³). After that, as shown in FIGS. 25(a) and 25(b), formed by ion-implanting a p-type impurity such as boron ion B⁺ and like impurities and an n-type impurity such as phosphorus ion P⁺ and like impurities in a surface region of the p-type well layer 92 are: the P⁺-type channel stop 93 having a p-type impurity concentration of from $10^{17}$ to $10^{19}$ atoms/cm$^3$ (for example, a boron concentration of $10^{18}$ atoms/cm$^3$) and having a depth of, for example, 0.3 μm; the n-type charge transfer portion 94 having an n-type impurity concentration of from $10^{16}$ to $10^{18}$ atoms/cm$^3$ (for example, a phosphorus concentration of $10^{17}$ atoms/cm$^3$) and having a depth of, for example, 0.5 μm; and, the p-type charge readout portion 95 having a p-type impurity concentration of from $10^{15}$ to $10^{17}$ atoms/cm$^3$ (for example, a boron concentration of $10^{16}$ atoms/cm$^3$) and having a depth of, for example, 0.5 μm.

Next, a gate insulation film 100 having a film thickness of from 100 to 1000 angstroms and formed of a thermal oxidation film, oxide film, nitride film, oxide (ONO) film, or the like is formed over the entire surface of the substrate. In this fourth embodiment, an oxide (ONO) film having a film thickness of 800 angstroms is formed to serve as the gate insulation film 100. Formed on this gate insulation film 100 is a gate electrode film (not shown) formed of a polysilicon film, which has a film thickness of from 500 to 5000 angstroms (for example, 4000 angstroms) and is lowered in sheet resistance up to 30 Ω/☐ by introducing phosphorus P therein. Subsequent to the above, unnecessary regions of the gate electrode film are removed by a plasma etching process using an anisotropic etching gas containing hydrogen bromide HBr, as its etching gas, so that a charge transfer electrode 101 is formed.

Further, an interlayer insulation film (not shown in the drawings), which is formed of a thermal oxidation film, CVD oxidation film, or the like and has a film thickness of from 500 to 5000 angstroms, is formed on the charge transfer electrode 101. In this fourth embodiment, the charge transfer electrode 101 has its surface subjected to a thermal oxidation treatment to produce an interlayer insulation film formed of a thermal oxidation film having a film thickness of 2000 angstroms. After that, a gate electrode film 105, which is formed of a polysilicon film and the like and has a film thickness of from 500 to 5000 angstroms (for example, 3000 angstroms), is formed on both the interlayer insulation film and the gate insulation film 100. Then, a photoresist film 106, which is provided with an opening portion 106a in a region corresponding to a region in which the photoelectric conversion portion 99 will be formed later, is formed, wherein the opening portion 106a has a width of 1.6 μm and a length of 2.6 μm.

Subsequent to the above, as shown in FIGS. 25(a) and 25(b), the gate electrode film 105 formed on the region in which the photoelectric conversion portion 99 will be formed later is removed by a plasma etching process using: the photoresist film 106 as a mask; and, an isotropic etching gas containing carbon tetrafluoride CF$_4$, sulfur hexafluoride SF$_6$ and the like, as its etching gas, so that an opening portion 105a having a width of 2 μm and a length of 3 μm is formed. In this first etching operation, in order to assure that no etching residue remains in a portion which will be formed into a side wall of the charge transfer electrode 102 later, it is necessary to completely remove the gate electrode film 105 formed over the region in which the photoelectric conversion portion 99 will be formed later, and also necessary to set back the edge portion 105b of the gate electrode film 105 by the amount of from 0.1 to 0.5 μm (for example, by the amount of 0.2 μm) relative to the edge portion 106b of the photoresist film 106. Consequently, the etching process is performed in a manner such that a polysilicon film having a film thickness of 6000 angstroms which is two times as much as the actual film thickness (i.e., 3000 angstroms) of the polysilicon film forming the gate electrode film 105 is removed by etching. In this case, an over-etched amount of the gate electrode film 105 is equal to 3000 (i.e., 6000−3000=3000) angstroms. Consequently, when a selective ratio of a polysilicon film to an oxide film is equal to a ratio of 10 to 1 in plasma-etching the polysilicon film, the gate insulation film 100 formed under the opening portion 105a is etched away up to a depth of 300 angstroms. Consequently, the remaining film thickness of the gate insulation film 100 after completion of the etching process is equal to 500 (i.e., 800−300=500) angstroms, which prevents a surface of the substrate from being-damaged.

Next, as shown in FIGS. 25(a) and 25(b), the photoelectric conversion portion 99 is formed by ion-implanting an n-type impurity such as phosphorus ion P$^+$ and like impurities at an acceleration energy of equal to or more than 200 KeV (for example, equal to or more than 300 KeV), using both the photoresist film 106 and-the gate electrode film 105 as masks, wherein the n-type region 96 having an n-type impurity concentration of from $10^{16}$ to $10^{18}$ atoms/cm$^3$ (for example, a phosphorus concentration of $10^{17}$ atoms/cm$^3$) and having a depth of, for example, 1.5 μm is formed by self alignment using an edge portion 106b of the photoresist film 106 as a mask. Then, the photoelectric conversion portion 99 is formed by ion-implanting an n-type impurity such as phosphorus ion P$^+$ and like impurities at a low acceleration energy of up to 200 KeV, using the gate electrode film 105 as a mask after the photoresist film 106 is removed, wherein a shallow n-type region 97 having an n-type impurity concentration of from $10^{16}$ to $10^{18}$ atoms/cm$^3$ (for example, a phosphorus concentration of $10^{17}$ atoms/cm$^3$) and having a depth of, for example, 0.5 μm is formed by self alignment using the edge portion 105b of the gate electrode film 105 as a mask. Subsequent to the above, as shown in FIGS. 26(a) and 26(b), the photoelectric conversion portion 99 is formed by ion-implanting a p-type impurity such as boron ion B$^+$ and like impurities at a low acceleration energy of up to 200 KeV, wherein the P$^+$-type region 98 having an n-type impurity concentration of from $10^{17}$ to $10^{19}$ atoms/cm$^3$ (for example, a boron concentration of $10^{18}$ atoms/cm$^3$) and having a depth of, for example, 3 μm is formed by self alignment using the edge portion 105b of the gate electrode film 105 as a mask.

After that, a photoresist film 106 is formed to cover: a region located above the photoelectric conversion portion 99; the periphery of this portion 99; and, a part of a region located above the gate electrode film 105 formed above the charge transfer portion 94 adjacent to the photoelectric conversion portion 99, wherein the above part is parallel to the photoelectric conversion portion 99 and has substantially the same longitudinal dimension as that of the photoelectric conversion portion 99.

Then, as shown in FIGS. 27(a) and 27(b), a charge transfer electrode 102 having an electrode length of 2.5 μm is formed by removing unnecessary regions of the gate electrode film 105 by a plasma etching process using: an isotropic etching gas containing sulfur hexafluoride SF$^6$ as an etching gas; and, the photoresist film 106 as a mask. As a result, the opening portion 105a of the gate electrode film 105 becomes an opening portion 102a of the charge transfer electrode 102. In this second etching process, in order to prevent the etching residue from being produced in stepped portions of the substrate, it is necessary to completely remove the gate electrode film 105 which is located in the periphery of the chip. Consequently, the etching process is performed in a manner such that a polysilicon film having a film thickness of 9000 angstroms which is three times as much as the actual film thickness (i.e., 3000 angstroms) of the polysilicon film forming the gate electrode film 105 is removed by etching. In this case, an over-etched amount of the gate electrode film 105 is equal to 6000 (i.e., 9000–3000=6000) angstroms. Consequently, when the selective ratio of a polysilicon film and an oxide film is equal to a ratio of 10 to 1 (i.e., 10:1) as described above, the interlayer insulation film formed under the gate electrode film 105 being etched is etched away by the amount in film thickness of 600 angstroms. Consequently, the remaining film thickness of such interlayer insulation film is equal to 1400 (i.e., 2000–600=1400) angstroms, which prevents the charge transfer electrode 101 from being damaged. Further, at this time, since the photoelectric conversion portion 99 is completely covered with the photoresist film 106, there is no fear that a boundary area between the photoelectric conversion portion 99 and the gate insulation film 100 is damaged, in contrast with the conventional device.

Figure 28:
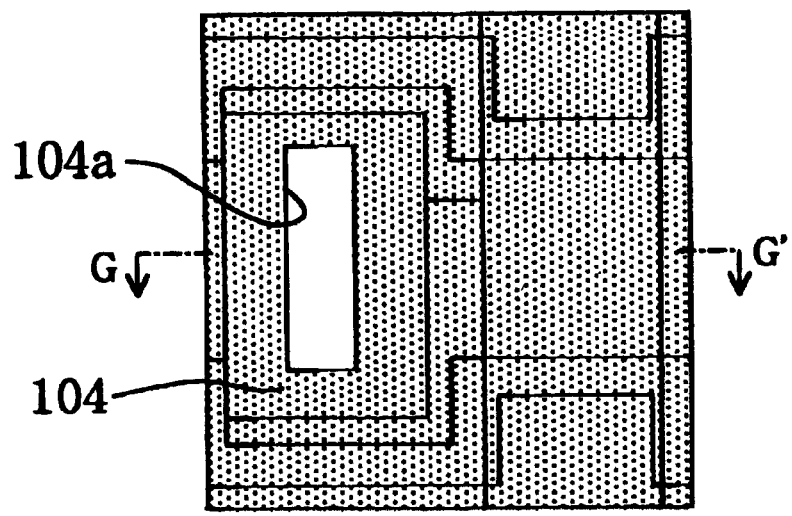
Figure 28:
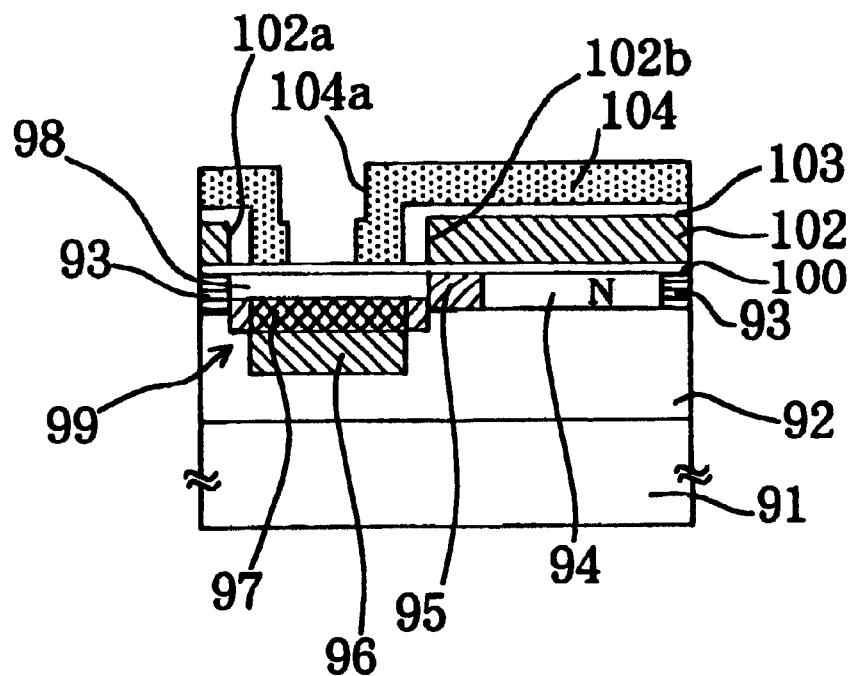

Then, after the photoresist film 106 is removed, the interlayer insulation film 103, which is composed of a thermal oxidation film, CVD oxidation film, or the like and has a film thickness of from 500. to 5000 angstroms, is formed over the entire surface of the substrate. In this embodiment, a CVD film having a film thickness of 2000 angstroms is formed to serve as the interlayer insulation film 103. Subsequent to this, a light shield film 104 made of tungsten, aluminum and the like and having a film thickness of from 500 to 5000 angstroms is formed on the interlayer insulation film 103. After that, as shown in FIGS. 28(*a*) and 28(*b*), a part of the light shield film 104 formed over the photoelectric conversion portion 99 is removed to form the opening portion 104*a* which has a width of 0.7 μm and a length of 2.2 μm. In this embodiment, a tungsten film having a film thickness of 3000 angstroms is formed to serve as the light shield film 104.

Figure 24:
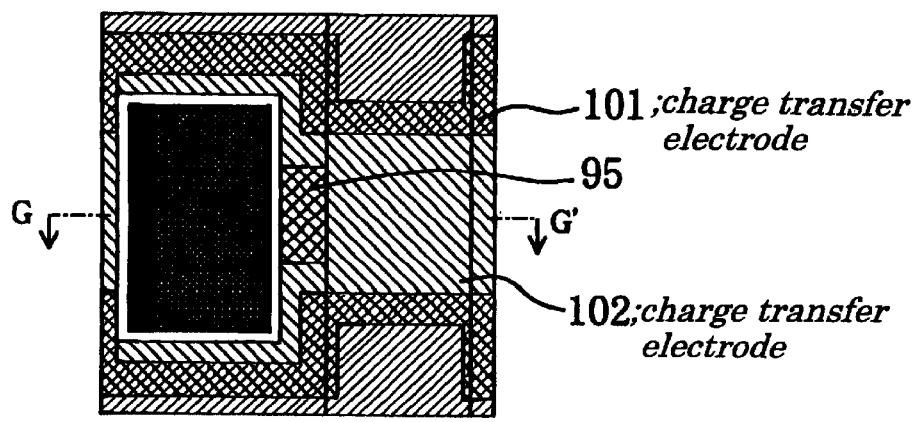
Figure 24:
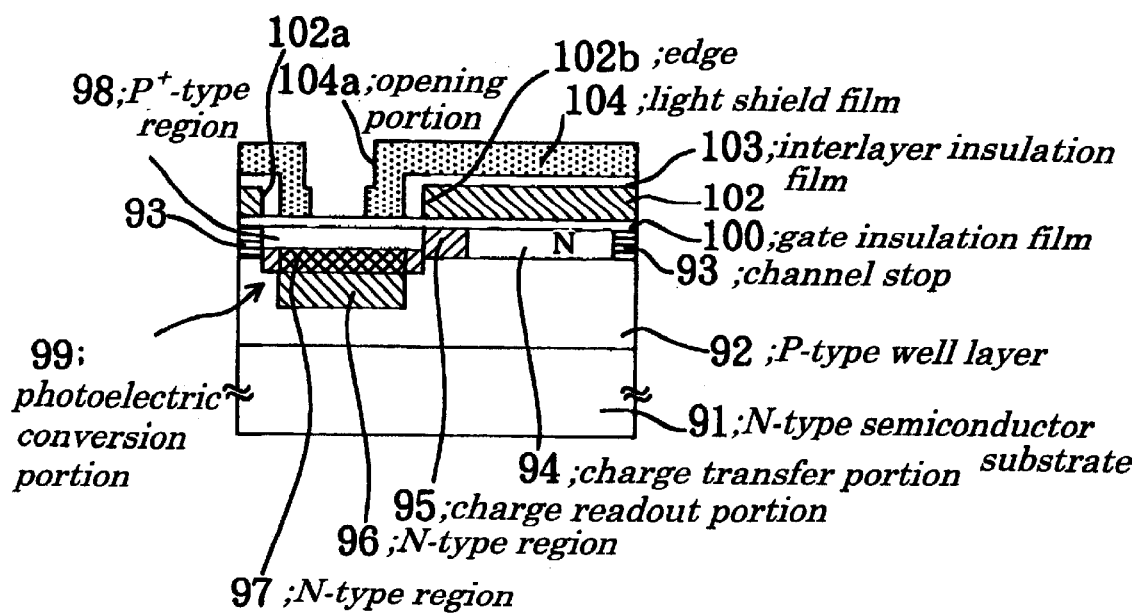

The solid-state imaging device shown in FIGS. 24(*a*) and 24(*b*) is completed by the manufacturing method described above.

Figure 25:
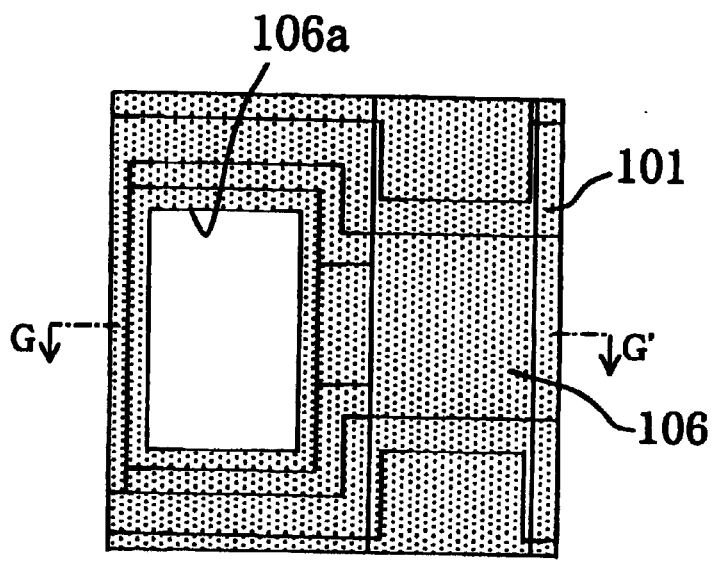
Figure 25:
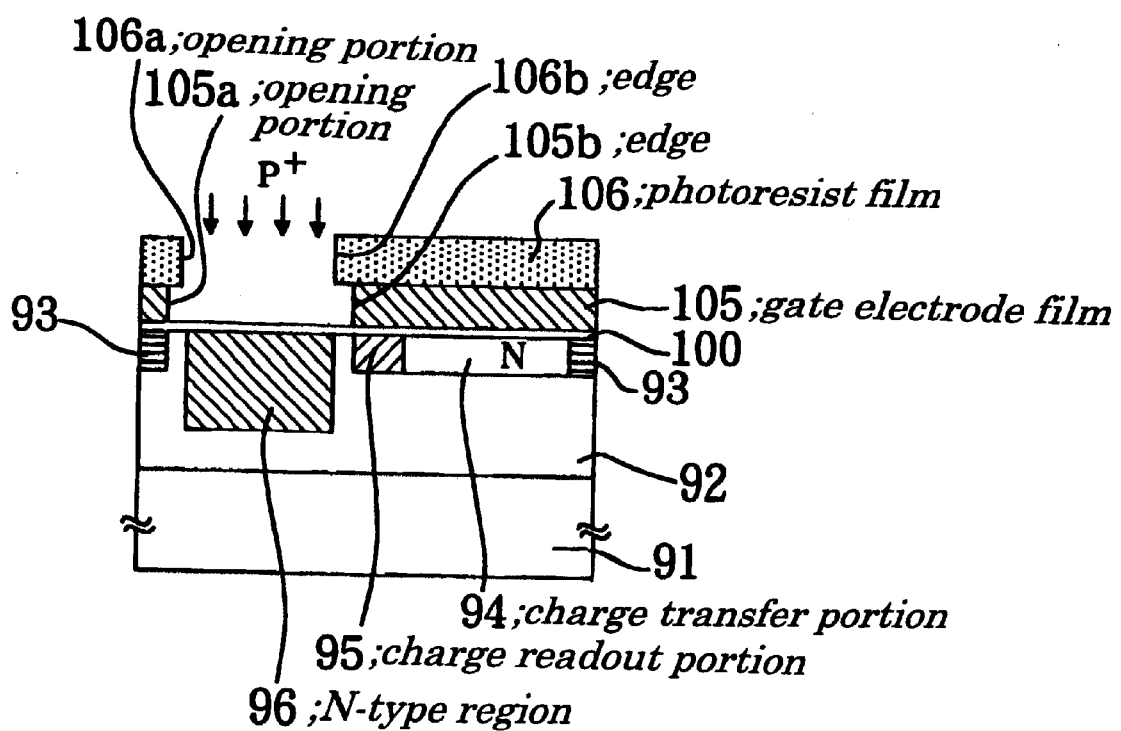

As described above, in the fourth embodiment of the present invention having the above construction, in addition to the effects derived from the construction of the third embodiment of the present invention, the following effects are obtained. Namely, since the n-type region 97 is formed by ion-implanting an n-type impurity such as phosphorus ion $P^+$ and like impurities at a low acceleration energy of up to 200 KeV, any photoresist film is not required in the ion implantation process. In other words, in this implantation process, only the gate electrode film 105 is used as a mask. Consequently, as shown in FIG. 25(*b*), in forming the opening portion 105*a* in the gate electrode film 105 by using the photoresist film 106 as a mask, even when the edge portion 105*a* of the gate electrode film 105 is set back relative to the edge portion 106*a* of the photoresist film 106 due to over etching, it is possible to form the n-type region 97, without fail, by ion-implanting an n-type impurity using only the gate electrode film 105 as a mask, i.e., by self alignment using the edge portion 105*b* of the gate electrode film 105 as a mask after the photoresist film 106.

Further, in this embodiment having the above construction, as described above, the n-type region 97 is formed by self alignment using the edge portion 105*b* of the gate electrode film 105 as a mask. On the other hand, the n-type region 96 is so formed as to be spaced apart from the edge portion 105*b* of the gate electrode film 105. Consequently, it is possible to control, by the n-type region 97, the readout characteristics of the signal charge which is read and written from the photoelectric conversion portion 99 to the charge transfer portion 94. Due to this, the present invention is capable of expanding the freedom of design of the photoelectric conversion portion 99. Further, in this embodiment having the above construction, a location where the photoelectric conversion portion 99 is deepest in potential nears the surface of the substrate due to the formation of the n-type region 97. This facilitates the readout operation of the signal charge performed by the charge readout portion 95 constructed of n-type surface channel transistors, which may lower the readout voltage. On the other hand, since the end portion of a depletion layer of the photoelectric conversion portion 99 is located in a deep region remote from the surface of the substrate, it is possible to collect the signal charge produced in a deeper region through photoelectric conversion, which improves the device in sensitivity.

Figure 22:
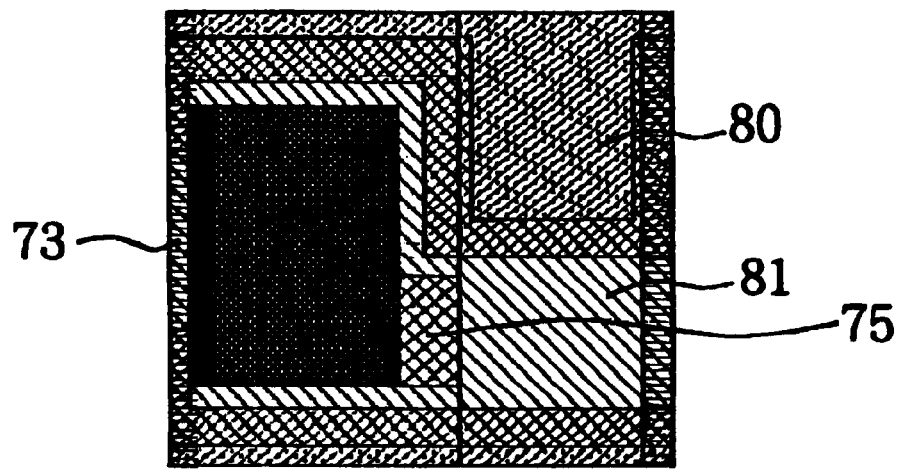
Figure 22:
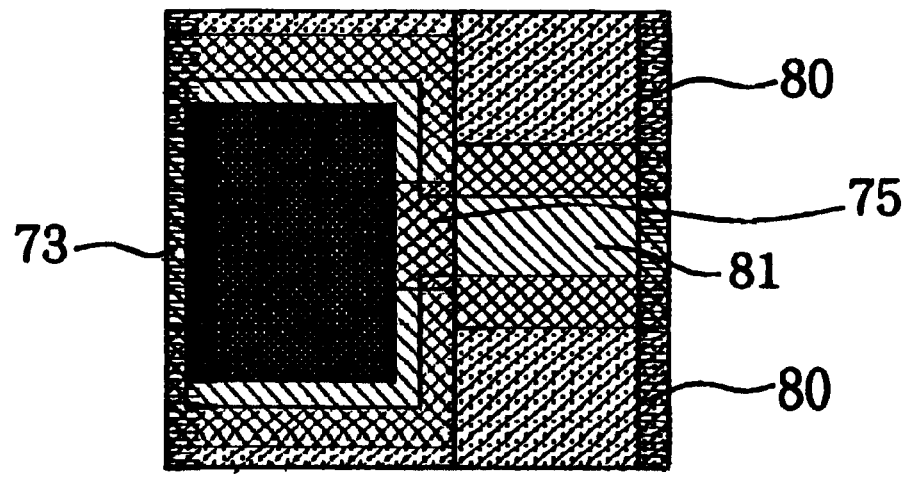

Incidentally, as described in the third embodiment of the present invention with reference to FIGS. 22(*a*) to 23(*b*), this fourth embodiment of the present invention also maybe modified into various configurations.

E: Fifth Embodiment:

Next, a fifth embodiment of the present invention will be described. FIG. 29 shows a cross-sectional view of the. solid-state imaging device of the fifth embodiment of the present invention.

The solid-state imaging device of the fifth embodiment differs from that shown in FIGS. 15(*a*) and 15(*b*) in having a photoelectric conversion portion 111 in place of the photoelectric conversion portion 78 shown in FIG. 15(*b*). The photoelectric conversion portion 111 is constructed of: the n-type well layer 76 identical in construction and function with that shown in FIG. 15(*b*); and, a $P^+$-type region 112 having an offset amount S of from 1 to 1.0 μm relative to the edge portion 81*b* of the charge transfer electrode 81.

Next, with reference to FIGS. 30(*a*) and 30(*b*), a manufacturing method of the solid-state imaging device of this fifth embodiment will be described in the order in which the process steps are performed. Incidentally, the manufacturing method of the solid-state imaging device of this fifth embodiment is substantially identical with that of the solid-state imaging device of the third embodiment except a process. for forming the $P^+$-type region 112 described above. Consequently, hereinbelow, only such process for forming the $P^+$-type region 112 will be described.

In the third embodiment of the present invention, in forming the $P^+$-type region 77, as shown in FIGS. 18(*a*) and 18(*b*), both the photoresist film 86 and the gate electrode film 85 or only the gate electrode film 85 are or is used as masks or a mask in the ion implantation process, wherein an n-type impurity such as boron ion $B^+$ and the like is implanted perpendicularly in the n-type semiconductor substrate at an acceleration energy of from 10 to 100 KeV by self alignment using the edge portion 85*b* of the gate electrode film 85 as a mask, as shown in FIGS. 18(*a*) and 18(*b*).

In this case, since a p-type impurity concentration of the $P^+$-type region 77 ranges from $10^{17}$ to $10^{19}$ atoms/cm$^3$ and is therefore very high, there is a fear that a p-type impurity is diffused into a region located under the charge readout portion 75 up to a depth of 0.3 μm due to thermal treatment performed in the manufacturing method of the solid-state imaging device, wherein the charge readout portion 75 is constructed of the n-type surface channel transistors. Such diffusion of the p-type impurity causes the threshold value of the signal charge to increase and also causes the transconductance to decrease, which often causes the disadvantage of increasing the threshold value of the signal charge.

Figure 30:
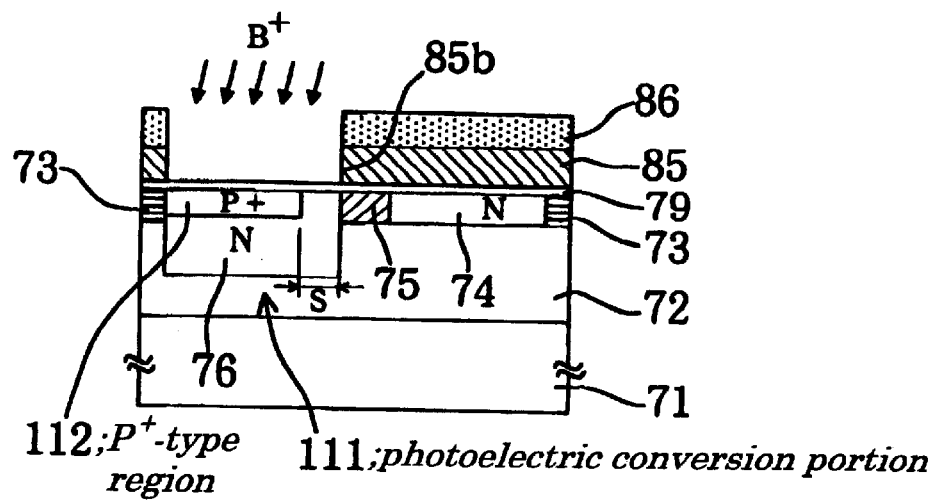
Figure 30:
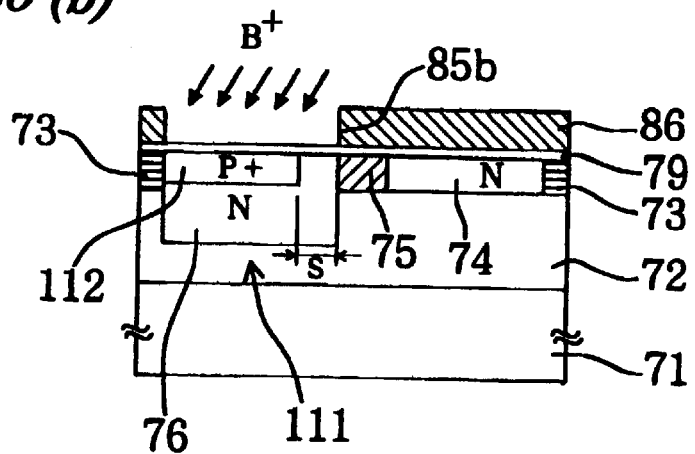

Consequently, in the manufacturing method of the solid-state imaging device of this fifth embodiment, previously allowing for such diffusion of the p-type impurity, both the photoresist film 86, which has a film thickness of, for example, 2 μm and the gate electrode film 85 having a film thickness of, for example, 0.3 μm or only this gate electrode film 85 are or is used as masks or a mask in the ion implantation process, wherein an n-type impurity such as boron ion $B^+$ and the like is implanted in the n-type semiconductor substrate 71 at an acceleration energy of from approximately 10 to approximately 100 KeV toward the photoelectric conversion portion 111 at an implantation angle of approximately 7 degrees (shown in FIG. 30(*a*)) from the vertical or of approximately 45 degrees (shown in FIG. 30(*b*)) from the vertical by self alignment using the edge portion 85*b* of the gate electrode film 85 as a mask, so that the $P^+$-type region 112 having a p-type impurity concentration of from $10^{17}$ to $10^{19}$ atoms /cm$^3$ (for example, a boron B concentration of $10^{18}$ atoms/cm$^3$) and having a depth of, for example, 0.3 μm is formed. Consequently, the $P^+$-type region 112 thus formed has an offset amount S of from 0.1 to 1.0 μm (for example, 0.3 μm) relative to the edge portion 81*b* of the charge transfer electrode 81. Incidentally, the reasons why an implantation angle (which is approximately 45 degrees) used when only the gate electrode film 85 is used as a mask as shown in FIG. 30(*b*) is larger than the implantation angle of approximately 7 degrees used when both the photoresist film 86 and the gate electrode film 85 are used as masks as shown in FIG. 30(*a*) is that: since a space available over the mask is small in height, it is necessary to increase the ion implantation angle in order to obtain substantially the same offset amount S as that shown in FIG. 30(*a*).

The manufacturing method of the solid-state imaging device having the above construction may solve the above problems and lower the readout voltage.

F: Sixth Embodiment:

Now, a sixth embodiment of the present invention will be described. FIG. 31 shows a cross-sectional view of the solid-state imaging device of this sixth embodiment. FIG. 32 is a view illustrating the manufacturing method of the solid-state imaging device of the sixth embodiment shown in FIG. 31.

The solid-state imaging device of the sixth embodiment shown in FIG. 31 differs from that shown in FIGS. 24(*a*) and 24(*b*) in having a photoelectric conversion portion 121 in place of the photoelectric conversion portion 99 shown in FIG. 24(*b*) The photoelectric conversion portion 121 is constructed of: the n-type regions 96 and 97 identical in construction and function with those 96 and 97 shown in FIG. 24(*b*); and, a $P^+$-type region 122 having an offset amount S of from 0.1 to 1.0 μm relative to the edge portion 102*b* of the charge transfer electrode 102.

Next, with reference to FIG. 32, a manufacturing method of the solid-state imaging device of this sixth embodiment will be described in the order in which the process steps are performed. Incidentally, the manufacturing method of the solid-state imaging device of this sixth embodiment is substantially identical with that of the solid-state imaging device of the fourth embodiment except a process for forming the $P^+$-type region 122 described above. Consequently, hereinbelow, only such process for forming the $P^+$-type region 122 will be described.

In the fourth embodiment of the present invention, in forming the $P^+$-type region 98, as shown in FIGS. 26(*a*) and 26(*b*), the gate electrode film 105 is used as a mask in the ion implantation process, wherein a p-type impurity such as boron ion $B^+$ and the like is implanted perpendicularly in the n-type semiconductor substrate at an acceleration energy of from approximately 10 to approximately 100 KeV by self alignment using the edge portion 105*b* of the gate electrode film 105 as a mask.

In this case, since a p-type impurity concentration of the $P^+$-type region 98 ranges from $10^{17}$ to $10^{19}$ atoms/cm$^3$ and is therefore very high, there is a fear that a p-type impurity is diffused into a region located under the charge readout portion 95 to a depth of approximately 0.3 μm due to thermal treatment performed in the manufacturing method of the solid-state imaging device, wherein the charge readout portion 95 is constructed of the n-type surface channel transistors. Such diffusion of the p-type impurity causes the threshold value of the n-type surface channel transistors to increase and also causes the transconductance to decrease, which often causes the disadvantage of increasing the readout voltage of the signal charge.

Consequently, in the manufacturing method of the solid-state imaging device of this sixth embodiment, previously allowing for such diffusion of the p-type impurity, the gate electrode film 105 having a film thickness of, for example, 0.3 μm is used as a mask in the ion implantation process, wherein a p-type impurity such as boron ion $B^+$ and the like is implanted in the n-type semiconductor substrate 71 at an acceleration energy of from approximately 10 to approximately 100 KeV toward the photoelectric conversion portion 121 at an implantation angle of approximately 45 degrees from the vertical by self alignment using the edge portion 105*b* of the gate electrode film 105 as a mask, so that the $P^+$-type region 122 having a p-type impurity concentration of from $10^{17}$ to $10^{19}$ atoms/cm$^3$ (for example, a boron B concentration of $10^{18}$ atoms/cm$^3$) and having a depth of, for example, 0.3 μm is formed. Consequently, the $P^+$-type region 122 thus formed has an offset amount S of from 0.1 to 1.0 μm (for example, 0.3 μm) relative to the edge portion 102*b* of the charge transfer electrode 102.

The manufacturing method of the solid-state imaging device having the above construction may solve the above problems and lower the readout voltage.

Although the embodiments of the present invention have been described with reference to the drawings in the above, the present invention is not limited in concrete construction to these embodiments only. Any modification and changes not departing from the spirit of the present invention are included in the scope of the present invention.

For example, in each of the above embodiments of the present invention, though the charge transfer electrode in the second layer is described so as to double as a charge readout electrode, the present invention is not limited to such construction. In other words, it is also possible to apply the present invention to a solid-state imaging device having a construction in which: the charge transfer electrode in the first layer doubles as a charge readout electrode; or, the charge transfer electrode and the charge readout electrode are separately formed from each other. Further, also as for the configuration of the charge transfer electrode, such configuration is not limited to that employed in each of the embodiments of the present invention, and may be modified in an appropriate manner. Furthermore, the charge transfer electrode may be composed of polysilicon films, metal films, silicide films and the like.

Further, in each of the above embodiments of the present invention, phosphorus P and boron B are used as an n-type impurity and a p-type impurity, respectively. However, the present invention is not limited to these impurities. In other words, arsenic (As) and boron fluoride ($BF_2$) may be used as the n-type impurity and the p-type impurity, respectively.

Further, the light shield film may be composed of a refractory metal film and the like containing aluminum, tungsten and the like, and also may be composed of a silicide film of these refractory metals.

Further, the ion implantation angle used in forming the P$^+$-type region which forms the photoelectric conversion portion is not limited to 7 or 45 degrees only, but may assume any other desired value.

Further, as for the third embodiment of the present invention, its modification has been described with reference to FIGS. 22(a) to 23(b). As is in this modification of the third embodiment, each of the other embodiments may be modified substantially in the same manner as that of the third embodiment.

Furthermore, in each of the above embodiments, the n-type semiconductor substrate is used. However, the present invention is not limited to this construction. In other words, it is also possible to obtain the same effects as those obtained in the above embodiments even when: a p-type semiconductor substrate is used in place of the n-type semiconductor substrate; and, each of the well layers, each of the regions and the conductivity type of each of the portions are reversed in arrangement and in polarity relative to those of the above embodiments.

It is thus apparent that the present invention is not limited to the above embodiments but may be changed and modified without departing from the scope and spirit of the invention.

Finally, the present application claims the priority of Japanese Patent Application No. Hei10-138719 filed on May 20, 1998, which is herein incorporated by reference.

What is claimed is:

1. A solid-state imaging device comprising:

a plurality of photoelectric conversion portions each for converting incident light into signal charge the amount in charge of which corresponds to the amount of said incident light;

a plurality of charge readout portions provided adjacent to said photoelectric conversion portions, each of said charge readout portions being designed to read out said signal charge having been generated in the corresponding one of said photoelectric conversion portions;

a plurality of charge transfer portions provided adjacent to said photoelectric conversion portions, each of said charge transfer portions being designed to transfer said signal charge having been retrieved from the corresponding one of said photoelectric conversion portions through the corresponding one of said charge readout portions; and a charge transfer electrode, which is formed, through an insulation film, over the corresponding one of said photoelectric conversion portions, the corresponding one of said charge readout portions, the corresponding one of said charge transfer portions and also over peripheral portions of these corresponding ones, is provided with an opening portion over the corresponding one of said photoelectric conversion portions, and also is a charge readout electrode for controlling the reading and writing of said signal charge from the corresponding one of said photoelectric conversion portions to the corresponding one of said charge transfer portions, said charge transfer electrode being designed to control in transfer said signal charge of the corresponding one of said charge transfer portions.

2. The solid-state imaging device according to claim 1, wherein:

each of said photoelectric conversion portions is formed within a surface region of a first conductivity type semiconductor layer, and formed of a second conductivity type semiconductor layer.

3. A solid-state imaging device comprising:

a plurality of photoelectric conversion portions each for converting incident light into signal charge the amount in charge of which corresponds to the amount of said incident light, said photoelectric conversion portions being formed within a surface region of a first conductivity type semiconductor layer and formed of a second conductivity type semiconductor layer;

a plurality of charge readout portions provided adjacent to said photoelectric conversion portions, each of said charge readout portions being designed to read out said signal charge having been generated in the corresponding one of said photoelectric conversion portions, said charge readout portions being formed of said first conductivity type semiconductor layer;

a plurality of charge transfer portions adjacent to said photoelectric conversion portions, each of said charge transfer portions being designed to transfer said signal charge having been retrieved from the corresponding one of said photoelectric conversion portions through the corresponding one of said charge readout portions, said charge transfer portions being formed of said second conductivity type semiconductor layer;

a plurality of first charge transfer electrodes forming at least one layer through an insulation film over the corresponding one of said charge transfer portions, each of said first charge transfer electrodes being designed to control in transfer said signal charge of the corresponding one of said charge transfer portions; and a plurality of second charge transfer electrodes, each of which is formed, through an insulation film, over the corresponding one of said photoelectric conversion portions, the corresponding one of said charge readout portions, the corresponding one of said charge transfer portions and also over peripheral portions of these corresponding portions, is provided with an opening portion over the corresponding one of said photoelectric conversion portions, wherein adjacent ones of said second charge transfer electrodes are formed so as to be separated form each other through a separation portion separated from said opening portion, and each of said second charge transfer electrodes also is a part of a charge readout electrode for controlling the reading and writing of said signal charge from the corresponding one of said photoelectric conversion portions to the corresponding one of said charge transfer portions, said second charge transfer electrode being designed to control in transfer said signal charge of the corresponding one of said charge transfer portions.

4. The solid-state imaging device according to claim 3, wherein:

each of said second charge transfer electrodes is formed in a manner such that it is spaced a predetermined distance away from any one of the corresponding ones of said first charge transfer electrodes in one and the same layer, or has its edge portion overlie a corresponding edge portion of said any one of the corresponding ones of said first charge transfer electrodes in different layers spaced apart from each other through an insulation film.

5. The solid-state imaging device according to claim 1, wherein:

each of said photoelectric conversion portions is formed by self alignment using an edge portion of an opening portion of the corresponding one of said charge transfer electrodes as a mask.

6. The solid-state imaging device according to claim 2, wherein:

each of said photoelectric conversion portions is formed by self alignment using an edge portion of an opening portion of the corresponding one of said charge transfer electrodes as a mask.

7. The solid-state imaging device according to claim 3, wherein:

each of said photoelectric conversion portions is formed by self alignment using an edge portion of an opening portion of the corresponding one of said charge transfer electrodes as a mask.

8. The solid-state imaging device according to claim 4, wherein:

each of said photoelectric conversion portions is formed by self alignment using an edge portion of an opening portion of the corresponding one of said charge transfer electrodes as a mask.

9. The solid-state imaging device according to claim 2, wherein:

each of said photoelectric conversion portions is constructed of said second conductivity type semiconductor layer and said first conductivity type semiconductor layer, said first conductivity type semiconductor layer being formed in the surface region of said second conductivity type semiconductor layer.

10. The solid-state imaging device according to claim 3, wherein:

each of said photoelectric conversion portions is constructed of said second conductivity type semiconductor layer and said first conductivity type semiconductor layer, said first conductivity type semiconductor layer being formed in the surface region of said second conductivity type semiconductor layer.

11. The solid-state imaging device according to claim 4, wherein:

each of said photoelectric conversion portions is constructed of said second conductivity type semiconductor layer and said first conductivity type semiconductor layer, said first conductivity type semiconductor layer being formed in the surface region of said second conductivity type semiconductor layer.

12. The solid-state imaging device according to claim 5, wherein:

each of said photoelectric conversion portions is constructed of said second conductivity type semiconductor layer and said first conductivity type semiconductor layer, said first conductivity type semiconductor layer being formed in the surface region of said second conductivity type semiconductor layer.

13. The solid-state imaging device according to claim 6, wherein:

each of said photoelectric conversion portions is constructed of said second conductivity type semiconductor layer and said first conductivity type semiconductor layer, said first conductivity type semiconductor layer being formed in the surface region of said second conductivity type semiconductor layer.

14. The solid-state imaging device according to claim 7, wherein:

each of said photoelectric conversion portions is constructed of said second conductivity type semiconductor layer and said first conductivity type semiconductor layer, said first conductivity type semiconductor layer being formed in the surface region of said second conductivity type semiconductor layer.

15. The solid-state imaging device according to claim 8, wherein:

each of said photoelectric conversion portions is constructed of said second conductivity type semiconductor layer and said first conductivity type semiconductor layer, said first conductivity type semiconductor layer being formed in the surface region of said second conductivity type semiconductor layer.

16. The solid-state imaging device according to claim 2, wherein each of said photoelectric conversion portions is constructed of:

a first one of said second conductivity type semiconductor layer, said first one being large in depth and narrow in its region;

a second one of said second conductivity type semiconductor layer, said second one being small in depth and wide in its region; and said first conductivity type semiconductor layer, said first conductivity type semiconductor layer being formed in surface regions of these first and second ones of said second conductivity type semiconductor layer.

17. The solid-state imaging device according to claim 3, wherein each of said photoelectric conversion portions is constructed of:

a first one of said second conductivity type semiconductor layer, said first one being large in depth and narrow in its region;

a second one of said second conductivity type semiconductor layer, said second one being small in depth and wide in its region; and said first conductivity type semiconductor layer, said first conductivity type semiconductor layer being formed in surface regions of these first and second ones of said second conductivity type semiconductor layer.

18. The solid-state imaging device according to claim 4, wherein each of said photoelectric conversion portions is constructed of:

a first one of said second conductivity type semiconductor layer, said first one being large in depth and narrow in its region;

a second one of said second conductivity type semiconductor layer, said second one being small in depth and wide in its region; and said first conductivity type semiconductor layer, said first conductivity type semiconductor layer being formed in surface regions of these first and second ones of said second conductivity type semiconductor layer.

19. The solid-state imaging device according to claim 5, wherein each of said photoelectric conversion portions is constructed of:

a first one of said second conductivity type semiconductor layer, said first one being large in depth and narrow in its region;

a second one of said second conductivity type semiconductor layer, said second one being small in depth and wide in its region; and said first conductivity type semiconductor layer, said first conductivity type semiconductor layer being formed in surface regions of these first and second ones of said second conductivity type semiconductor layer.

20. The solid-state imaging device according to claim 6, wherein each of said photoelectric conversion portions is constructed of:
- a first one of said second conductivity type semiconductor layer, said first one being large in depth and narrow in its region;
- a second one of said second conductivity type semiconductor layer, said second one being small in depth and wide in its region; and
- said first conductivity type semiconductor layer, said first conductivity type semiconductor layer being formed in surface regions of these first and second ones of said second conductivity type semiconductor layer.

21. The solid-state imaging device according to claim 7, wherein each of said photoelectric conversion portions is constructed of:
- a first one of said second conductivity type semiconductor layer, said first one being large in depth and narrow in its region;
- a second one of said second conductivity type semiconductor layer, said second one being small in depth and wide in its region; and
- said first conductivity type semiconductor layer, said first conductivity type semiconductor layer being formed in surface regions of these first and second ones of said second conductivity type semiconductor layer.

22. The solid-state imaging device according to claim 8, wherein each of said photoelectric conversion portions is constructed of:
- a first one of said second conductivity type semiconductor layer, said first one being large in depth and narrow in its region;
- a second one of said second conductivity type semiconductor layer, said second one being small in depth and wide in its region; and
- said first conductivity type semiconductor layer, said first conductivity type semiconductor layer being formed in surface regions of these first and second ones of said second conductivity type semiconductor layer.

23. The solid-state imaging device according to claim 9, wherein:
said first conductivity type semiconductor region forming said each of said photoelectric conversion portions is formed in a manner such that said first conductivity type semiconductor region is spaced a predetermined distance away from an edge portion of said charge readout portion side of said opening portion of the corresponding one of said charge transfer electrodes.

24. The solid-state imaging device according to claim 10, wherein:
said first conductivity type semiconductor region forming said each of said photoelectric conversion portions is formed in a manner such that said first conductivity type semiconductor region is spaced a predetermined distance away from an edge portion of said charge readout portion side of said opening portion of the corresponding one of said charge transfer electrodes.

25. The solid-state imaging device according to claim 11, wherein:
said first conductivity type semiconductor region forming said each of said photoelectric conversion portions is formed in a manner such that said first conductivity type semiconductor region is spaced a predetermined distance away from an edge portion of said charge readout portion side of said opening portion of the corresponding one of said charge transfer electrodes.

26. The solid-state imaging device according to claim 12, wherein:
said first conductivity type semiconductor region forming said each of said photoelectric conversion portions is formed in a manner such that said first conductivity type semiconductor region is spaced a predetermined distance away from an edge portion of said charge readout portion side of said opening portion of the corresponding one of said charge transfer electrodes.

27. The solid-state imaging device according to claim 13, wherein:
said first conductivity type semiconductor region forming said each of said photoelectric conversion portions is formed in a manner such that said first conductivity type semiconductor region is spaced a predetermined distance away from an edge portion of said charge readout portion side of said opening portion of the corresponding one of said charge transfer electrodes.

28. The solid-state imaging device according to claim 14, wherein:
said first conductivity type semiconductor region forming said each of said photoelectric conversion portions is formed in a manner such that said first conductivity type semiconductor region is spaced a predetermined distance away from an edge portion of said charge readout portion side of said opening portion of the corresponding one of said charge transfer electrodes.

29. The solid-state imaging device according to claim 15, wherein:
said first conductivity type semiconductor region forming said each of said photoelectric conversion portions is formed in a manner such that said first conductivity type semiconductor region is spaced a predetermined distance away from an edge portion of said charge readout portion side of said opening portion of the corresponding one of said charge transfer electrodes.

30. The solid-state imaging device according to claim 16, wherein:
said first conductivity type semiconductor region forming said each of said photoelectric conversion portions is formed in a manner such that said first conductivity type semiconductor region is spaced a predetermined distance away from an edge portion of said charge readout portion side of said opening portion of the corresponding one of said charge transfer electrodes.

31. The solid-state imaging device according to claim 17, wherein:
said first conductivity type semiconductor region forming said each of said photoelectric conversion portions is formed in a manner such that said first conductivity type semiconductor region is spaced a predetermined distance away from an edge portion of said charge readout portion side of said opening portion of the corresponding one of said charge transfer electrodes.

32. The solid-state imaging device according to claim 18, wherein:
said first conductivity type semiconductor region forming said each of said photoelectric conversion portions is formed in a manner such that said first conductivity type semiconductor region is spaced a predetermined distance away from an edge portion of said charge readout portion side of said opening portion of the corresponding one of said charge transfer electrodes.

33. The solid-state imaging device according to claim 19, wherein:
  said first conductivity type semiconductor region forming said each of said photoelectric conversion portions is formed in a manner such that said first conductivity type semiconductor region is spaced a predetermined distance away from an edge portion of said charge readout portion side of said opening portion of the corresponding one of said charge transfer electrodes.

34. The solid-state imaging device according to claim 20, wherein:
  said first conductivity type semiconductor region forming said each of said photoelectric conversion portions is formed in a manner such that said first conductivity type semiconductor region is spaced a predetermined distance away from an edge portion of said charge readout portion side of said opening portion of the corresponding one of said charge transfer electrodes.

35. The solid-state imaging device according to claim 21, wherein:
  said first conductivity type semiconductor region forming said each of said photoelectric conversion portions is formed in a manner such that said first conductivity type semiconductor region is spaced a predetermined distance away from an edge portion of said charge readout portion side of said opening portion of the corresponding one of said charge transfer electrodes.

36. The solid-state imaging device according to claim 22, wherein:
  said first conductivity type semiconductor region forming said each of said photoelectric conversion portions is formed in a manner such that said first conductivity type semiconductor region is spaced a predetermined distance away from an edge portion of said charge readout portion side of said opening portion of said corresponding one of said charge transfer electrodes.

37. A manufacturing method of a solid-state imaging device, said solid-state imaging device comprising: a plurality of photoelectric conversion portions each for converting incident light into signal charge the amount in charge of which corresponds to the amount of said incident light; a plurality of charge readout portions provided adjacent to said photoelectric conversion portions, each of said charge readout portions being designed to read out signal charge having been generated in the corresponding one of said photoelectric conversion portions; a plurality of charge transfer portions provided adjacent to said photoelectric conversion portions, each of said charge transfer portions being designed to transfer said signal charge having been retrieved from the corresponding one of said photoelectric conversion portions through the corresponding one of said charge readout portions; and, a charge transfer electrode, which is formed, through an insulation film, over the corresponding one of said photoelectric conversion portions, the corresponding one of said charge readout portions, the corresponding one of said charge transfer portions and also over peripheral portions of these corresponding ones, said charge transfer electrode being designed to control in transfer said signal charge of the corresponding one of said charge transfer portions; the method comprising:
  a first step of forming a plurality of first charge transfer electrodes each constructed of at least one layer, said first charge transfer electrodes being formed over a first conductivity type semiconductor layer, in a surface region of which are formed: the plurality of charge readout portions constructed of said first conductivity type semiconductor layer; and, said plurality of charge transfer portions constructed of said second conductivity type semiconductor layer;
  a second step of forming a photoresist film having an opening portion in a region corresponding to a region in which said plurality of photoelectric conversion portions are formed after a conductive film is formed through an insulation film;
  a third step of removing said conductive film of said region corresponding to said opening portion by using said photoresist film as a mask;
  a fourth step of forming said plurality of photoelectric conversion portions by using both said photoresist film and said conductive film as masks, or by using said conductive film only as a mask; and
  a fifth step of forming, by etching said conductive film, a plurality of second charge transfer electrodes, each of which is also a charge readout electrode, for controlling said reading and writing a signal charge from the corresponding one of said photoelectric conversion portions to the corresponding one of said charge transfer portions.

38. The manufacturing method of said solid-state imaging device, according to claim 37, wherein:
  in said fifth step, adjacent ones of said second charge transfer electrodes are formed so as to be separated from each other through a separation portion separated from said opening portion.

39. The manufacturing method of said solid-state imaging device, according to claim 37, wherein:
  in said fifth step, each of said second charge transfer electrodes is formed in a manner such that it is spaced a predetermined distance away from any one of the corresponding ones of said first charge transfer electrodes in one and said same layer, or has its edge portion overlie a corresponding edge portion of said any one of the corresponding ones of said first charge transfer electrodes in different layers spaced apart from each other through an insulation film.

40. The manufacturing method of said solid-state imaging device, according to claim 38, wherein:
  in said fifth step, each of said second charge transfer electrodes is formed in a manner such that it is spaced a predetermined distance away from any one of the corresponding ones of said first charge transfer electrodes in one and the same layer, or has its edge portion overlie a corresponding edge portion of any one of the corresponding ones of said first charge transfer electrodes in different layers spaced apart from each other through an insulation film.

41. The manufacturing method of said solid-state imaging device, according to claim 37, wherein:
  in said fourth step, after said plurality of second conductivity type semiconduct or layers are formed by using both said photoresist film and said conductive film as masks, said first conductivity semiconductor region is formed in said surface region of each of said second conductivity type semiconductor layers by using both said photoresist film and said conductive film as masks, or, by using said conductive film only as a mask.

42. The manufacturing method of said solid-state imaging device, according to claim 38, wherein:
  in said fourth step, after said plurality of second conductivity type semiconductor layers are formed by using both said photoresist film and said conductive film as masks, said first conductivity semiconductor region is formed in the surface region of each of said second conductivity type semiconductor layers by using both said photoresist film and said conductive film as masks, or, by using said conductive film only as a mask.

43. The manufacturing method of said solid-state imaging device, according to claim 39, wherein:

in said fourth step, after said plurality of second conductivity type semiconductor layers are formed by using both said photoresist film and said conductive film as masks, said first conductivity semiconductor region is formed in the surface region of each of said second conductivity type semiconductor layers by using both said photoresist film and said conductive film as masks, or, by using said conductive film only as a mask.

44. The manufacturing method of said solid-state imaging device, according to claim 40, wherein:

in the fourth step, after said plurality of second conductivity type semiconductor layers are formed by using both said photoresist film and said conductive film as masks, said first conductivity semiconductor region is formed in the surface region of each of said second conductivity type semiconductor layers by using both said photoresist film and said conductive film as masks, or, by using said conductive film only as a mask.

45. The manufacturing method of said solid-state imaging device, according to claim 37, wherein:

in said fourth step, after said first ones of said second conductivity type semiconductor regions each of which is large in depth and narrow in region are formed by using as a mask a photoresist film provided with a second opening portion smaller in area size than said first opening portion, said second ones of said second conductivity type semiconductor regions each of which is small in depth and wide in region are formed by using as a mask said conductive film only, and, said first conductivity type semiconductor regions are formed in the surface regions of both said first and said second ones of said second conductivity type semiconductor regions.

46. The manufacturing method of said solid-state imaging device, according to claim 38, wherein:

in said fourth step, after said first ones of said second conductivity type semiconductor regions each of which is large in depth and narrow in region are formed by using as a mask a photoresist film provided with a second opening portion smaller in area size than said first opening portion, said second ones of said second conductivity type semiconductor regions each of which is small in depth and wide in region are formed by using as a mask said conductive film only, and, said first conductivity type semiconductor regions are formed in the surface regions of both said first and said second ones of said second conductivity type semiconductor regions.

47. The manufacturing method of said solid-state imaging device, according to claim 39, wherein:

in said fourth step, after said first ones of said second conductivity type semiconductor regions each of which is large in depth and narrow in region are formed by using as a mask a photoresist film provided with a second opening portion smaller in area size than said first opening portion, said second ones of said second conductivity type semiconductor regions each of which is small in depth and wide in region are formed by using as a mask said conductive film only, and, said first conductivity type semiconductor regions are formed in the surface regions of both said first and said second ones of said second conductivity type semiconductor regions.

48. The manufacturing method of said solid-state imaging device, according to claim 40, wherein:

in said fourth step, after said first ones of said second conductivity type semiconductor regions each of which is large in depth and narrow in region are formed by using as a mask a photoresist film provided with a second opening portion smaller in area size than said first opening portion, said second ones of said second conductivity type semiconductor regions each of which is small in depth and wide in region are formed by using as a mask said conductive film only, and, said first conductivity type semiconductor regions are formed in the surface regions of both said first and said second ones of said second conductivity type semiconductor regions.

49. The manufacturing method of said solid-state imaging device, according to claim 37, wherein:

in said fourth step, said first conductivity type semiconductor regions are formed by ion-implanting a fist conductivity type impurity at a predetermined inclination implantation angle relative to a vertical direction in a manner such that each of said first conductivity type semiconductor regions is spaced a predetermined distance away from an edge portion of said charge readout portion side of said opening portion of the corresponding one of said charge transfer electrodes.

50. The manufacturing method of said solid-state imaging device, according to claim 38, wherein:

in said fourth step, said first conductivity type semiconductor regions are formed by ion-implanting a fist conductivity type impurity at a predetermined inclination implantation angle relative to a vertical direction in a manner such that each of said first conductivity type semiconductor regions is spaced a predetermined distance away from an edge portion of said charge readout portion side of said opening portion of the corresponding one of said charge transfer electrodes.

51. The manufacturing method of said solid-state imaging device, according to claim 39, wherein:

in said fourth step, said first conductivity type semiconductor regions are formed by ion-implanting a fist conductivity type impurity at a predetermined-inclination implantation angle relative to a vertical direction in a manner such that each of said first conductivity type semiconductor regions is spaced a predetermined distance away from an edge portion of said charge readout portion side of said opening portion of the corresponding one of said charge transfer electrodes.

52. The manufacturing method of said solid-state imaging device, according to claim 40, wherein:

in said fourth step, said first conductivity type semiconductor regions are formed by ion-implanting a fist conductivity type impurity at a predetermined inclination implantation angle relative to a vertical direction in a manner such that each of said first conductivity type semiconductor regions is spaced a predetermined distance away from an edge portion of said charge readout portion side of said opening portion of the corresponding one of said charge transfer electrodes.

53. The manufacturing method of said solid-state imaging device, according to claim 41, wherein:

in said fourth step, said first conductivity type semiconductor regions are formed by ion-implanting a fist conductivity type impurity at a predetermined inclination implantation angle relative to a vertical direction in a manner such that each of said first conductivity type semiconductor regions is spaced a predetermined distance away from an edge portion of said charge readout portion side of said opening portion of the corresponding one of said charge transfer electrodes.

54. The manufacturing method of said solid-state imaging device, according to claim 42, wherein:

in said fourth step, said first conductivity type semiconductor regions are formed by ion-implanting a fist conductivity type impurity at a predetermined inclination implantation angle relative to a vertical direction in a manner such that each of said first conductivity type semiconductor regions is spaced a predetermined distance away from an edge portion of said charge readout portion side of said opening portion of the corresponding one of said charge transfer electrodes.

55. The manufacturing method of said solid-state imaging device, according to claim 43, wherein:

in said fourth step, said first conductivity type. semiconductor regions are formed by ion-implanting a fist conductivity type impurity at a predetermined inclination implantation angle relative to a vertical direction in a manner such that each of said first conductivity type semiconductor regions is spaced a predetermined distance away from an edge portion of said charge readout portion side of said opening portion of the corresponding one of said charge transfer electrodes.

56. The manufacturing method of said solid-state imaging device, according to claim 44, wherein:

in said fourth step, said first conductivity type semiconductor regions are formed by ion-implanting a fist conductivity type impurity at a predetermined inclination implantation angle relative to a vertical direction in a manner such that each of said first conductivity type semiconductor regions is spaced a predetermined distance away from an edge portion of said charge readout portion side of said opening portion of the corresponding one of said charge transfer electrodes.

57. The manufacturing method of said solid-state imaging device, according to claim 45, wherein:

in said fourth step, said first conductivity type semiconductor regions are formed by ion-implanting a fist conductivity type impurity at a predetermined inclination implantation angle relative to a vertical direction in a manner such that each of said first conductivity type semiconductor regions is spaced a predetermined distance away from an edge portion of said charge readout portion side of said opening portion of the corresponding one of said charge transfer electrodes.

58. The manufacturing method of said solid-state imaging device, according to claim 46, wherein:

in said fourth step, said first conductivity type semiconductor regions are formed by ion-implanting a fist conductivity type impurity at a predetermined inclination implantation angle relative to a vertical direction in a manner such that each of said first conductivity type semiconductor regions is spaced a predetermined distance away from an edge portion of said charge readout portion side of said opening portion of the corresponding one of said charge transfer electrodes.

59. The manufacturing method of said solid-state imaging device, according to claim 47, wherein:

in said fourth step, said first conductivity type semiconductor regions are formed by ion-implanting a fist conductivity type impurity at a predetermined inclination implantation angle relative to a vertical direction in a manner such that each of said first conductivity type semiconductor regions is spaced a predetermined distance away from an edge portion of said charge readout portion side of said opening portion of the corresponding one of said charge transfer electrodes.

60. The manufacturing method of said solid-state imaging device, according to claim 48, wherein:

in said fourth step, said first conductivity type semiconductor regions are formed by ion-implanting a fist conductivity type impurity at a predetermined inclination implantation angle relative to a vertical direction in a manner such that each of said first conductivity type semiconductor regions is spaced a predetermined distance away from an edge portion of said charge readout portion side of said opening portion of the corresponding one of said charge transfer electrodes.

\* \* \* \* \*